United States Patent
Ono et al.

(10) Patent No.: US 10,347,850 B2
(45) Date of Patent: Jul. 9, 2019

(54) ORGANIC ELECTROLUMINESCENT ELEMENT, LIGHTING DEVICE AND DISPLAY DEVICE

(71) Applicant: Konica Minolta, Inc., Chiyoda-ku, Tokyo (JP)

(72) Inventors: Kaori Ono, Ichihara (JP); Masato Nishizeki, Hachioji (JP); Norio Miura, Sagamihara (JP)

(73) Assignee: KONICA MINOLTA, INC., Chiyoda-Ku, Tokyo (JP)

( * ) Notice: Subject to any disclaimer, the term of this patent is extended or adjusted under 35 U.S.C. 154(b) by 446 days.

(21) Appl. No.: 14/420,989

(22) PCT Filed: Aug. 28, 2013

(86) PCT No.: PCT/JP2013/073066
§ 371 (c)(1),
(2) Date: Feb. 11, 2015

(87) PCT Pub. No.: WO2014/038456
PCT Pub. Date: Mar. 13, 2014

(65) Prior Publication Data
US 2015/0207085 A1   Jul. 23, 2015

(30) Foreign Application Priority Data
Sep. 4, 2012 (JP) .................. 2012-194037

(51) Int. Cl.
*H01L 51/00* (2006.01)
*C09K 11/06* (2006.01)
*H01L 51/50* (2006.01)

(52) U.S. Cl.
CPC .......... *H01L 51/0085* (2013.01); *C09K 11/06* (2013.01); *C09K 2211/1029* (2013.01);
(Continued)

(58) Field of Classification Search
CPC ............ C09K 11/06; C09K 2211/1029; C09K 2211/1044; C09K 2211/1088;
(Continued)

(56) References Cited

U.S. PATENT DOCUMENTS 6,097,147 A   8/2000 Baldo et al.
2007/0196691 A1*  8/2007 Ikemizu .............. C07F 15/0033
428/690

(Continued)

FOREIGN PATENT DOCUMENTS

EP   2677559 A1   12/2013
JP   2005112765 A   4/2005
(Continued)

OTHER PUBLICATIONS

Japanese Notice of Reasons for Rejection corresponding to Application No. 2014-534323; dated Aug. 16, 2016, with English translation.
(Continued)

*Primary Examiner* — Jennifer A Chriss
*Assistant Examiner* — Elizabeth M. Dahlburg
(74) *Attorney, Agent, or Firm* — Cantor Colburn LLP

(57) ABSTRACT

An organic electroluminescent element having at least one organic layer including a light emitting layer sandwiched between a positive electrode and a negative electrode, which is characterized in that at least one organic layer contains an
(Continued)

organometallic complex represented by General Formula (2).

General Formula (2)

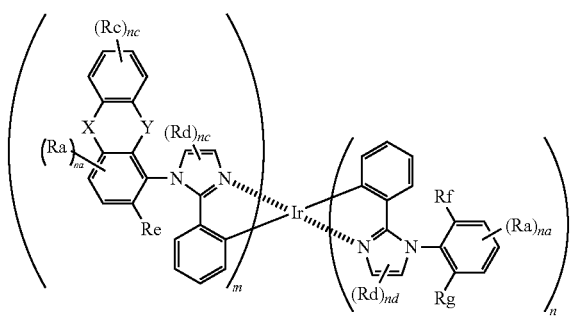

7 Claims, 5 Drawing Sheets

(52) U.S. Cl.
CPC ............... *C09K 2211/1044* (2013.01); *C09K 2211/1088* (2013.01); *C09K 2211/1092* (2013.01); *C09K 2211/1096* (2013.01); *C09K 2211/185* (2013.01); *H01L 51/008* (2013.01); *H01L 51/0067* (2013.01); *H01L 51/0071* (2013.01); *H01L 51/0072* (2013.01); *H01L 51/0081* (2013.01); *H01L 51/0094* (2013.01); *H01L 51/5016* (2013.01)

(58) Field of Classification Search
CPC .... C09K 2211/1092; C09K 2211/1096; C09K 2211/185; C09K 2211/1007; C09K 211/1044; C09K 211/185; H01L 51/0067; H01L 51/0071; H01L 51/0072; H01L 51/008; H01L 51/0081; H01L 51/0085; H01L 51/0094; H01L 51/5016; H01L 51/0074; H01L 51/308; H01L 51/0087; H01L 51/5096; C07F 15/0033; C07F 15/003; H05B 33/14; Y10S 428/917; Y02B 20/181; C08F 12/26; C08F 12/32; C08F 12/34; Y10T 428/265; Y10T 428/31504
USPC ............. 257/40, E51.05, E51.026, E51.032, 257/E51.052; 313/504, 505, 506; 428/690, 917; 528/27; 544/234; 548/304.1, 418, 440, 304.4, 103; 546/18, 546/79, 81, 101; 564/26, 426, 432, 433, 564/434
See application file for complete search history.

(56) References Cited

U.S. PATENT DOCUMENTS

2011/0057559 A1   3/2011   Xia et al.
2011/0204333 A1*  8/2011   Xia ..................... C07F 15/0033
                                                              257/40
2013/0342102 A1* 12/2013  Hakoi ................... H05B 33/14
                                                              313/504

FOREIGN PATENT DOCUMENTS

| WO | 2007097149 A1 | 8/2007 |
| WO | 2007097153 A1 | 8/2007 |
| WO | 2008090795 A1 | 7/2008 |
| WO | 2009107497 A1 | 9/2009 |
| WO | 2011106344 A1 | 9/2011 |

OTHER PUBLICATIONS

International Search Report corresponding to Application No. PCT/JP2013/073066, dated Oct. 15, 2013, with English translation.
M. A. Baldo et al., "High-Efficiency Fluorescent Organic Light-Emitting Devices using a Phosphorescent Sensitizer;" Nature; Feb. 2000, pp. 750-753, vol. 403.
M. A. Baldo et al., "Highly Efficient Phosphorescent Emission from Organic Electroluminescent Devices;" Nature; Sep. 1998, pp. 151-154, vol. 395.
Sergey Lamansky et al., "Highly Phosphorescent Bis-Cyclometalated Iridium Complexes: Synthesis, Photophysical Characterization, and Use in Organic Light Emitting Diodes," American Chemical Society, Apr. 2001, pp. 4304-4312, vol. 123, No. 18.
Extended European Search Report corresponding to Application No. 13835491.5-1555/2894686 PCT/JP2013/073066; dated Mar. 29, 2016.

* cited by examiner

LIGHT

LIGHT

ORGANIC ELECTROLUMINESCENT ELEMENT, LIGHTING DEVICE AND DISPLAY DEVICE

CROSS REFERENCE TO PRIOR APPLICATIONS

This is the U.S. national stage of application No. PCT/JP2013/073066, filed on Aug. 28, 2013. Priority under 35 U.S.C. § 119(a) and 35 U.S.C. § 365(b) is claimed from Japanese Application No. 2012-194037, filed Sep. 4, 2012, the disclosure of which is also incorporated herein by reference.

TECHNICAL FIELD

The present invention relates to an organic electroluminescent element and a lighting device and a display device equipped with the same.

BACKGROUND ART

An organic electroluminescent element (hereinafter, also referred to as an organic EL element) is a light emitting element which has a constitution in which a light emitting layer containing a light emitting compound is sandwiched between a negative electrode and a positive electrode, in which excitons are generated in the light emitting layer by recombination of holes injected from a positive electrode and the electrons injected from a negative electrode according to application of electric field and light (fluorescence or phosphorescence) is emitted when the excitons are inactivated. The organic EL element encompasses any individual element composed of an organic material film having a thickness of mere about submicrons at most between the electrodes and can emit light at a voltage of about several volts to several tens of volts, and thus its application as a next-generation flat display or a lighting device is anticipated.

Princeton University has developed an organic EL element for practical application and has reported an organic EL element using phosphorescent light emission from an excited triplet state (see, for example, Non Patent Literature 1). Materials emitting phosphorescence at room temperature have been extensively studied since then (see, for example, Patent Literature 1 and Non Patent Literature 2).

Furthermore, the viable emission efficiency in organic EL elements using phosphorescent light emission recently discovered is about four times larger in principle than those of conventional elements using fluorescent emission. Researches and developments of layer constitutions and electrodes of light emitting elements, as well as the developments of materials for the elements, have been conducted all over the world. For example, synthesis of many compounds, mainly, heavy metal complexes such as iridium complexes, has been investigated (see, for example, Non Patent Literature 3).

Although organic EL devices using phosphorescent light emission have significantly high potential as described above, they have quite different technical issues from organic EL devices using fluorescent emission, that is, the control of the position of emission center, in particular, how recombination can be performed within a light emitting layer and how stable emission of light by recombination in the light emitting layer can be achieved, which is a key technical challenge for determining the efficiency and lifetime of an element.

Under such a circumstance, a multilayered laminate element having a light emitting layer, a hole transport layer adjoining the light emitting layer (provided on the positive electrode side of the light emitting layer), and an electron transport layer adjoining the light emitting layer (provided on the negative electrode side of the light emitting layer) have been well-known (see, for example, Patent Literature 2). Many mixed layers containing a host compound and a phosphorescent light emitting compound as dopants are used for a light emitting layer.

Meanwhile, in terms of the materials, a material which has a high carrier transporting property or is thermally or electrically stable is required. In particular, for using blue phosphorescent luminescence, development of side materials that can be applied and fine control of light emitting center are strongly required because a blue phosphorescent light emitting compound itself has high triplet excitation energy (T1).

As a representative blue phosphorescent light emitting compound, FIrpic is known, and short wavelength has been achieved by fluorine substitution of phenylpyridine of a main ligand and use of picolic acid as a sub-ligand. Those dopants are combined with carbazole derivatives or triarylsilanes as a host compound to constitute an element with high efficiency. However, because the light emitting lifetime of the element is significantly deteriorated, there has been a demand for an improvement of such trade-off.

Recently, as a blue phosphorescent light emitting compound having high potential, a metal complex with specific ligand is disclosed in Patent Literatures 3 and 4. However, although the luminance efficiency and light emitting lifetime have been improved, the organic EL element described in those literatures has a problem in terms of thermal stability of a metal complex as a material of an organic EL element. As such, due to an occurrence of decomposed products during forming an organic layer by deposition using such metal complex, there is a case in which the lifetime of the element is compromised.

Further, from the viewpoint of using it for a display or a lighting device, the organic EL element is also required to have long term stability. With regard to a light emitting layer of an organic EL element, a state within the light emitting layer changes when light emitting is allowed to occur continuously over a long period of time or under an environment of high temperature.high humidity due to concentration quenching as caused by crystallization or aggregation of light emitting dopants, quenching as caused by interaction between excitons, or the like. As a result, a problem may arise in that the driving voltage increases or deterioration of element performance like decreased luminance brightness occurs. In this regard, there is no description at all in Patent Literatures 3 and 4 regarding the long term stability. Thus, it was found that a further improvement is in need.

CITATION LIST

Patent Literatures

Patent Literature 1: U.S. Pat. No. 6,097,147
Patent Literature 2: JP 2005-112765 A
Patent Literature 3: US 2011-0057559
Patent Literature 4: US 2011-0204333

Non Patent Literatures

Non Patent Literature 1: M. A. Baldo et al., Nature, Vol. 395, pages 151 to 154 (1998)
Non Patent Literature 2: M. A. Baldo et al., Nature, Vol. 403, No. 17, pages 750 to 753 (2000)
Non Patent Literature 3: S. Lamansky et al., J. Am. Chem. Soc., Vol. 123, page 4304 (2001)

SUMMARY OF INVENTION

Technical Problem

As described above, various compounds have been described in related art with regard to a material of an organic EL element, and an attempt has been made to develop an organic EL element having high luminance efficiency and long lifetime. However, development of an organic EL element which has improved thermal stability and further improved performances compared to those of a related art has been waited for. Furthermore, development of an organic EL element which also has excellent long term stability is in need.

The present invention is devised in view of the aforementioned problems and circumstances. The problem to be solved by the present invention is to provide, by enhancing thermal stability of an organometallic complex as a material of an organic electroluminescent element, an organic electroluminescent element which has high luminance efficiency, long lifetime, and excellent long term stability, and also a lighting device and a display device using the element.

Solution to Problem

The aforementioned problems are solved by the following means of the present invention.

1. An organic electroluminescent element in which at least one organic layer including a light emitting layer is sandwiched between a positive electrode and a negative electrode, characterized in that an organometallic complex represented by the following General Formula (1) is contained in at least one of the organic layer,

[Chemical Formula 1]

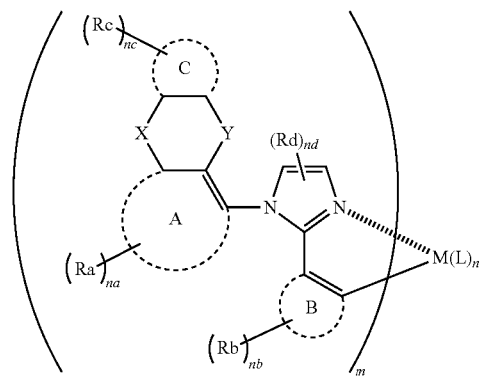

General Formula (1)

(Ring A, ring B and ring C represent a 5- or 6-membered aromatic hydrocarbon ring or an aromatic heterocycle, and Ra, Rb, Rc and Rd each independently represent a hydrogen atom, a halogen atom, a cyano group, an alkyl group, an alkenyl group, an alkynyl group, an alkoxy group, an amino group, a silyl group, an arylalkyl group, an aryl group, a heteroaryl group, a non-aromatic hydrocarbon ring group, or a non-aromatic heterocyclic group, and they may further have a substituent group. na represents an integer of from 1 to 3, nb and nc each represent an integer of from 1 to 4, nd represents an integer of from 1 to 2, and X and Y each represent a single bond, CR1R2, NR3, O, S, or SiR4R5. R1, R2, R3, R4, and R5 represent a hydrogen atom, an alkyl group, an alkenyl group, an alkynyl group, an aryl group, a heteroaryl group, a non-aromatic hydrocarbon ring group or a non-aromatic heterocyclic group.

L represents one or more of monoanionic bidentate ligands coordinated to M, and M represents a transition metal atom having an atomic number of 40 or more and belonging to any one of Groups 8 to 10 of the periodic table. m and n represent an integer of from 1 to 2, and m+n is 2 or 3. Meanwhile, in no case the structures of three ligands that are coordinated to M are identical to each other).

2. The organic electroluminescent element described in Item. 1, characterized in that all of ring A, ring B and ring C in the above General Formula (1) are a benzene ring.

3. The organic electroluminescent element described in Item. 1 or 2, characterized in that M in the above General Formula (1) is Ir.

4. The organic electroluminescent element described in any one of Items. 1 to 3, characterized in that the above General Formula (1) is an iridium complex represented by the following General Formula (2).

[Chemical Formula 2]

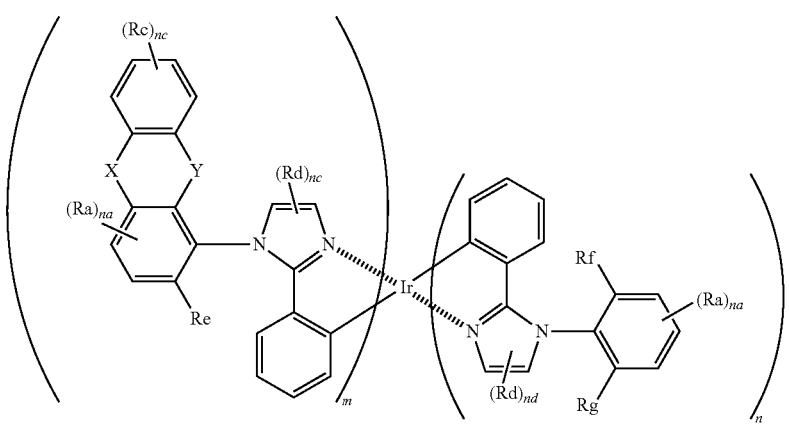

General Formula (2)

(Ra, Rc and Rd each independently represent a hydrogen atom, a halogen atom, a cyano group, an alkyl group, an alkenyl group, an alkynyl group, an alkoxy group, an amino group, a silyl group, an arylalkyl group, an aryl group, a heteroaryl group, a non-aromatic hydrocarbon ring group, or a non-aromatic heterocyclic group, and they may further have a substituent group. na represents an integer of from 1 to 3, nc represents an integer of from 1 to 4, nd represents an integer of from 1 to 2, and X and Y each represent a single bond, CR1R2, NR3, O, S, or SiR4R5, but in no case both X and Y are a single bond. R1, R2, R3, R4, and R5 represent a hydrogen atom, an alkyl group, an alkenyl group, an alkynyl group, an aryl group, a heteroaryl group, a non-aromatic hydrocarbon ring group, or a non-aromatic heterocyclic group. Re, Rf and Rg each independently represent an alkyl group, an aromatic hydrocarbon ring group, an aromatic heterocyclic group, a non-aromatic hydrocarbon ring group, or a non-aromatic heterocyclic group, m and n represent an integer of from 1 to 2, and m+n is 3. Meanwhile, in no case the structures of three ligands that are coordinated to Ir are identical to each other).

5. The organic electroluminescent element described in any one of Items. 1 to 4, characterized in that Y in the above General Formula (1) or (2) is a single bond.

6. The organic electroluminescent element described in any one of Items. 1 to 5, characterized in that X in the above General Formula (1) or (2) is O.

7. The organic electroluminescent element described in any one of Items. 1 to 6, characterized in that m=1 in the above General Formula (1) or (2).

8. The organic electroluminescent element described in any one of Items. 1 to 7, characterized in that it emits white light.

9. A lighting device equipped with the organic electroluminescent element according to any one of Items. 1 to 8.

10. A display device equipped with the organic electroluminescent element according to any one of Items. 1 to 8.

Advantageous Effects of Invention

According to the aforementioned means of the present invention, it is possible to provide an organic electroluminescent element, in particular, a white organic electroluminescent element which has excellent thermal stability, high luminance efficiency, long lifetime, and excellent long term stability. Furthermore, it is also possible to provide a lighting device and a display device having the element.

DESCRIPTION OF EMBODIMENTS

Figure 1:
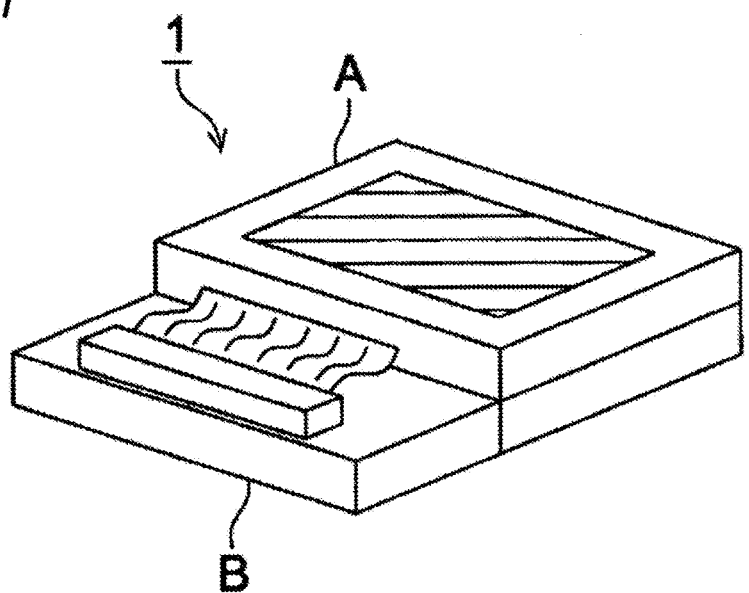
FIG. 1 is a schematic diagram illustrating an example of a display device composed of an organic EL element.

An embodiment for carrying out the present invention will now be described in detail hereinbelow. However, it is evident that the present invention is not limited thereto.

«Constitutional Layers of Organic EL Element»

Descriptions are given for the constitutional layers of the organic EL element of the present invention. With regard to the organic EL element of the present invention, specific examples of the preferred layer constitution of various organic layers that are sandwiched between a positive electrode and a negative electrode are described below. However, the present invention is not limited thereto.

(i) Positive electrode/light emitting layer unit/electron transport layer/negative electrode (ii) Positive electrode/hole transport layer/light emitting layer unit/electron transport layer/negative electrode (iii) Positive electrode/hole transport layer/light emitting layer unit/hole blocking layer/electron transport layer/negative electrode (iv) Positive electrode/hole transport layer/light emitting layer unit/electron transport layer/electron injection layer/negative electrode (v) Positive electrode/hole injection layer/hole transport layer/light emitting layer unit/electron transport layer/electron injection layer/negative electrode (vi) Positive electrode/hole transport layer/light emitting layer unit/hole blocking layer/electron transport layer/electron injection layer/negative electrode (vii) Positive electrode/hole injection layer/hole transport layer/light emitting layer unit/hole blocking layer/electron transport layer/electron injection layer/negative electrode Meanwhile, as a blocking layer, an electron blocking layer can be also used other than a hole blocking layer.

The light emitting layer unit (hereinbelow, it is suitably and simply referred to as a light emitting layer) may compose of a single light emitting layer or plural light emitting layers. Further, the light emitting layer unit may have an intermediate layer with a non-luminescent property between plural light emitting layers. It is also possible that the intermediate layer has a multi-photon unit constitution such as a charge generating layer. In such case, examples of the charge generating layer include a conductive inorganic compound layer such as ITO (indium.tin oxide), IZO (indium.zinc oxide), $ZnO_2$, TiN, ZrN, HfN, $TiO_x$, $VO_x$, CuI, InN, GaN, $CuAlO_2$, $CuGaO_2$, $SrCu_2O_2$, $LaB_6$, or $RuO_2$, a bilayer film such as $Au/Bi_2O_3$, a multi-layer film such as $SnO_2/Ag/SnO_2$, $ZnO/Ag/ZnO$, $Bi_2O_3/Au/Bi_2O_3$, $TiO_2/TiN/TiO_2$, or $TiO_2/ZrN/TiO_2$, fullerenes such as C60, a conductive organic layer such as oligothiophene, and a conductive organic compound layer such as metal phthalocyanines, metal-free phthalocyanines, metal porphyrins, metal-free porphyrins.

As for the light emitting layer of an organic EL element of the present invention, it is preferably a white light emitting layer and it is preferably a lighting device or a display device using it. Namely, the organic EL element emits white light.

Hereinbelow, descriptions are given for each layer constituting the organic EL element of the present invention.

«Light Emitting Layer»

The light emitting layer is a layer which emits light by recombination of electrons and holes injected from electrodes or an electron transport layer and a hole transport layer. The light emission site may be inside the light emitting layer or may be the interface between the light emitting layer and an adjoining layer thereof.

The light emitting layer may have any total film thickness, which is preferably controlled within a range of 2 nm to 5 μm, more preferably 2 nm to 200 nm, and most preferably 5 nm to 100 nm, from the viewpoint of obtaining homogeneity of the film, preventing unnecessary high voltage applied during light emission, and improving stability of emission color against driving current.

The light emitting layer can be produced by forming a film from a luminescent dopant or a host compound described below by, for example, vacuum deposition or a wet method (also referred to as wet process, and examples thereof include spin coating, casting, die coating, blade coating, roll coating, ink jetting, printing, spray coating, curtain coating, LB deposition method (Langmuir Blodgett method), or the like). Meanwhile, when the organometallic complex according to the present invention is used as a material for a light emitting layer, the film is preferably formed by a wet process.

The light emitting layer of the organic EL element of the present invention preferably contains a luminescent dopant (a phosphorescent light emitting dopant (also referred to as phosphorescent dopant or phosphorescent light emitting dopant group) or a fluorescent dopant) compound and a luminescent host compound.

(1) Luminescent Dopant Compound

The luminescent dopant compound (also referred to as luminescent dopant, dopant compound, or simply as dopant) is described below.

As for the luminescent dopant, a fluorescent dopant (also referred to as fluorescent compound) or a phosphorescent dopant (also referred to as phosphorescent light emitting material compound, phosphorescent compound, or phosphorescent light emitting compound) can be used.

(1.1) Phosphorescent Dopant (Also Referred to as Phosphorescent Light Emitting Dopant)

A phosphorescent dopant that can be used for the present invention is described below.

The phosphorescent dopant compound that can be used in the present invention is a compound in which light emission is observed from the excited triplet, specifically, a compound that emits phosphorescence at room temperature (25° C.) and is defined as a compound having a phosphorescence quantum yield of 0.01 or more at 25° C. The phosphorescence quantum yield is preferably 0.1 or more.

The phosphorescence quantum yield can be measured by the method described in page 398 of Spectroscopy II of Lectures of Experimental Chemistry 7, Fourth edition (1992 edition, published by Maruzen Company, Limited). The phosphorescence quantum yield in a solution can be measured using various solvents. The only requirement for the phosphorescent dopant that can be used in the present invention is to achieve the above-mentioned phosphorescence quantum yield (0.01 or more) in any one of solvents.

There are two principles for emission by a phosphorescent dopant. One is an energy transfer type, in which the recombination of carriers occurs on a host compound onto which the carriers are transferred to produce an excited state of the luminescent host compound, and then light emission occurs from the phosphorescent dopant via transfer of this energy to a phosphorescent dopant. The other is a carrier trap type, in which a phosphorescent dopant serves as a carrier trap to cause recombination of carriers on the phosphorescent dopant, and thereby light emission from the phosphorescent dopant occurs. In any case, it is essential that the energy in the excited state of the phosphorescent dopant be lower than that in the excited state of the host compound.

In this regard, the inventors of the present invention conducted intensive studies to achieve the aforementioned purpose of the present invention. As a result, they found that, by containing an organometallic complex represented by the following General Formula (1) in an organic layer of an organic EL element, thermal stability of the organic EL element is enhanced. They also found that the luminance efficiency, light emitting life time, and long term stability are enhanced.

Namely, according to the organic EL element of the present invention, an organometallic complex represented by the following General Formula (1) is contained as a material of an organic EL element in at least one of an organic layer. Preferably, an iridium complex compound represented by the following General Formula (1) is contained as a material of an organic EL element in a light emitting layer among organic layers.

(1.1.1) Organometallic Complex Represented by General Formula (1)

Descriptions are given for the organometallic complex which is contained, as a material of an organic EL element, in the organic EL element of the present invention. The organometallic complex according to the present invention is represented by the following General Formula (1).

[Chemical Formula 3]

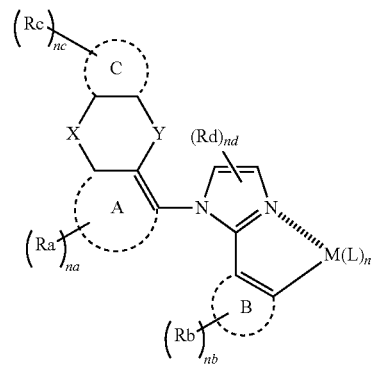

General Formula (1)

In General Formula (1), ring A, ring B and ring C represent a 5- or 6-membered aromatic hydrocarbon ring or an aromatic heterocycle.

Examples of the 5- or 6-membered aromatic hydrocarbon ring in General Formula (1), which is represented by ring A, ring B and ring C, include a benzene ring.

In General Formula (1), examples of the 5- or 6-membered heteroaromatic hydrocarbon ring, which is represented by ring A, ring B and ring C, include a furan ring, a thiophene ring, an oxazole ring, a pyrrole ring, a pyridine, pyridazine ring, a pyrimidine ring, a pyrazine ring, a triazine ring, an oxadiazole ring, triazole ring, an imidazole ring, a pyrazole ring, and a thiazole ring.

Preferably, all of ring A, ring B and ring C are a benzene ring.

In General Formula (1), Ra, Rb, Rc and Rd each independently represent a hydrogen atom, a halogen atom, a cyano group, an alkyl group, an alkenyl group, an alkynyl group, an alkoxy group, an amino group, a silyl group, an arylalkyl group, an aryl group, a heteroaryl group, a non-aromatic hydrocarbon ring group, or a non-aromatic heterocyclic group, and they may further have a substituent group. Preferably, they are an alkyl group.

Examples of the alkyl group which is represented by Ra, Rb, Rc and Rd in General Formula (1) include a methyl group, an ethyl group, a trifluoromethyl group, a n-propyl group, an isopropyl group, a n-butyl group, a t-butyl group, a 1-ethyl-propyl group, a 2-methylhexyl group, a pentyl group, an adamantly group, a n-decyl group, and a n-dodecyl group.

Examples of the aryl group and heteroaryl group which are represented by Ra, Rb, Rc and Rd in General Formula (1) include a monovalent group derived from an aromatic hydrocarbon ring and an aromatic heterocycle.

Examples of the aromatic hydrocarbon ring include a benzene ring, a biphenyl ring, a naphthalene ring, an azulene ring, an anthracene ring, a phenanthrene ring, a pyrene ring, a chrysene ring, a naphthacene ring, a triphenylene ring, an o-terphenyl ring, a m-terphenyl ring, a p-terphenyl ring, an acenaphthene ring, a coronene ring, a fluorene ring, a fluoranthrene ring, a pentacene ring, a perylene ring, a pentaphene ring, a picene ring, a pyranthrene ring, and an anthranthrene ring.

Examples of the aromatic heterocycle include a silole ring, a furan ring, a thiophene ring, an oxazole ring, a pyrrole ring, a pyridine ring, a pyridazine ring, a pyrimidine ring, a pyrazine ring, a triazine ring, an oxadiazole ring, a triazole ring, an imidazole ring, a pyrazole ring, a thiazole ring, an indole ring, a benzimidazole ring, a benzothiazole ring, a benzoxazole ring, a quinoxaline ring, a quinazoline ring, a phthalazine ring, a thienothiophene ring, a carbazole ring, an azacarbazole ring (which refers to a carbazole ring of which any one or more carbazole ring-constituting carbon atoms is substituted with a nitrogen atom), a dibenzosilole ring, a dibenzofuran ring, a dibenzothiophene ring, a dibenzofuran or a benzothiophene ring of which any one or more a dibenzofuran or benzothiophene ring-constituting carbon atoms is substituted with a nitrogen atom, a benzodifuran ring, a benzodithiophene ring, an acridine ring, a benzoquinoline ring, a phenazine ring, a phenanthridine ring, a phenanthroline ring, a cyclazine ring, a quindoline ring, a thebenidine ring, a quinindoline ring, a triphenodithiazine ring, a triphenodioxazine ring, a phenanthrazine ring, an anthrazine ring, a perimidine ring, a naphthofuran ring, a naphthothiophene ring, a naphthodifuran ring, a naphthodithiophene ring, an anthrafuran ring, an anthradifuran ring, an anthrathiophene ring, an anthradithiophene ring, a thianthrene ring, a phenoxathiin ring, a dibenzocarbazole ring, an indolocarbazole ring, and a dithienobenzene ring.

Examples of the non-aromatic hydrocarbon ring represented by Ra, Rb, Rc and Rd in General Formula (1) include a cycloalkane (for example, a cyclopentane ring and a cyclohexane ring), a cycloalkoxy group (for example, a cyclopentyloxy group and a cyclohexyloxy group), a cycloalkylthio group (for example, a cyclopentylthio group and a cyclohexylthio group), a cyclohexylaminosulfonyl group, a tetrahydronaphthalene ring, a 9,10-dihydroanthracene ring, and a biphenylene ring.

Examples of the non-aromatic heterocycle which is represented by Ra, Rb, Rc and Rd in General Formula (1) include an epoxy ring, an aziridine ring, a thiirane ring, an oxetane ring, an azetidine ring, a thietane ring, a tetrahydrofuran ring, a dioxolane ring, a pyrrolidine ring, a pyrazolidine ring, an imidazolidine ring, an oxazolidine ring, a tetrahydrothiophene ring, a sulfolane ring, a thiazolidine ring, a ε-caprolactone ring, a ε-caprolactam ring, a piperidine ring, a hexahydropyridazine ring, a hexahydropyrimidine ring, a piperazine ring, a morpholine ring, a tetrahydropyran ring, a 1,3-dioxane ring, a 1,4-dioxane ring, a trioxane ring, a tetrahydrothiopyran ring, a thiomorpholine ring, a thiomorpholine-1,1-dioxide ring, a pyranose ring, a diazabicyclo[2,2,2]-octane ring, a phenoxazine ring, a phenothiazine ring, an oxanthrene ring, a thioxanthene ring, and a phenoxathiine ring.

In General Formula (1), those rings represented by Ra, Rb, Rc and Rd may have a substituent group, or it is also possible that the substituent groups bind to each other to form a ring.

In General Formula (1), na represents an integer of from 1 to 3, nb and nc each represent an integer of from 1 to 4, and nd represents an integer of from 1 to 2.

In General Formula (1), X and Y each represent a single bond, $CR_1R_2$, $NR_3$, O, S, and $SiR_4R_5$. $R_1$, $R_2$, $R_3$, $R_4$, and $R_5$ represent a hydrogen atom, an alkyl group, an alkenyl group, an alkynyl group, an aryl group, a heteroaryl group, a non-aromatic hydrocarbon ring group or a non-aromatic heterocyclic group.

In General Formula (1), L represents one or more of monoanionic bidentate ligands coordinated to M, and M represents a transition metal atom having an atomic number of 40 or more and belonging to any one of Groups 8 to 10 of the periodic table.

In General Formula (1), m and n represent an integer of from 1 to 2, and m+n is 2 or 3.

Meanwhile, in General Formula (1), in no case the structures of three ligands that are coordinated to M are identical to each other.

In General Formula (1), M is preferably Ir.

(1.1.2) Organometallic Complex Represented by General Formula (2)

The organometallic complex represented by General Formula (1), which has been described above, is preferably an iridium complex represented by the following General Formula (2).

[Chemical Formula 4]

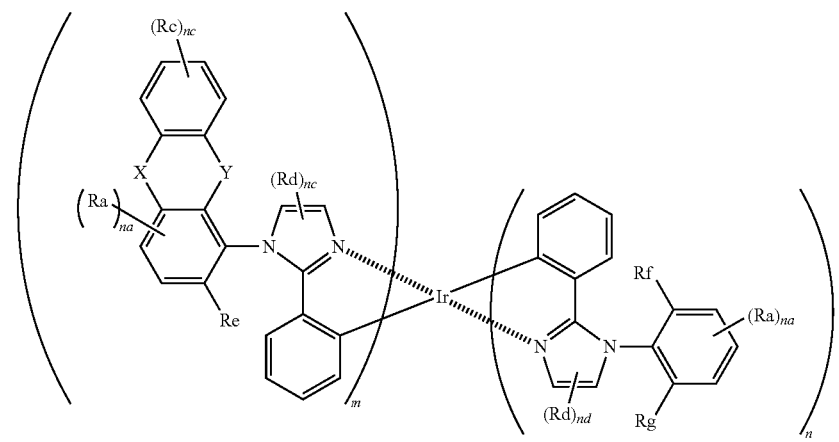

General Formula (2)

In General Formula (2), Ra, Rc, Rd, na, nc, nd, X, and Y have the same meanings as Ra, Rc, Rd, na, nc, nd, X, and Y of General Formula (1). However, in no case both X and Y are a single bond.

In General Formula (2), Re, Rf, and Rg each independently represent an alkyl group, an aromatic hydrocarbon ring group, an aromatic heterocyclic group, a non-aromatic hydrocarbon ring group, or a non-aromatic heterocyclic group.

As for the alkyl group, an aromatic hydrocarbon ring group, aromatic heterocyclic group, a non-aromatic hydrocarbon ring group, or a non-aromatic heterocyclic group in General Formula (2), a monovalent group which is derived from an alkyl group, an aromatic hydrocarbon ring group, an aromatic heterocyclic group, a non-aromatic hydrocarbon ring group, or a non-aromatic heterocyclic group that are represented by Ra, Rb, Rc and Rd in General Formula (1) can be mentioned.

In General Formula (2), m and n represent an integer of from 1 to 2, and m+n is 3.

Meanwhile, in no case the structures of three ligands that are coordinated to Ir are identical to each other in General Formula (2).

In General Formula (1) or (2), Y is preferably a single bond and X is preferably O. It is also preferable that m=1.

(1.1.3) Specific Examples

Hereinbelow, specific examples of the organometallic complex represented by General Formula (1), (2) are described. However, the present invention is not limited thereto.

[Chemical Formula 5]

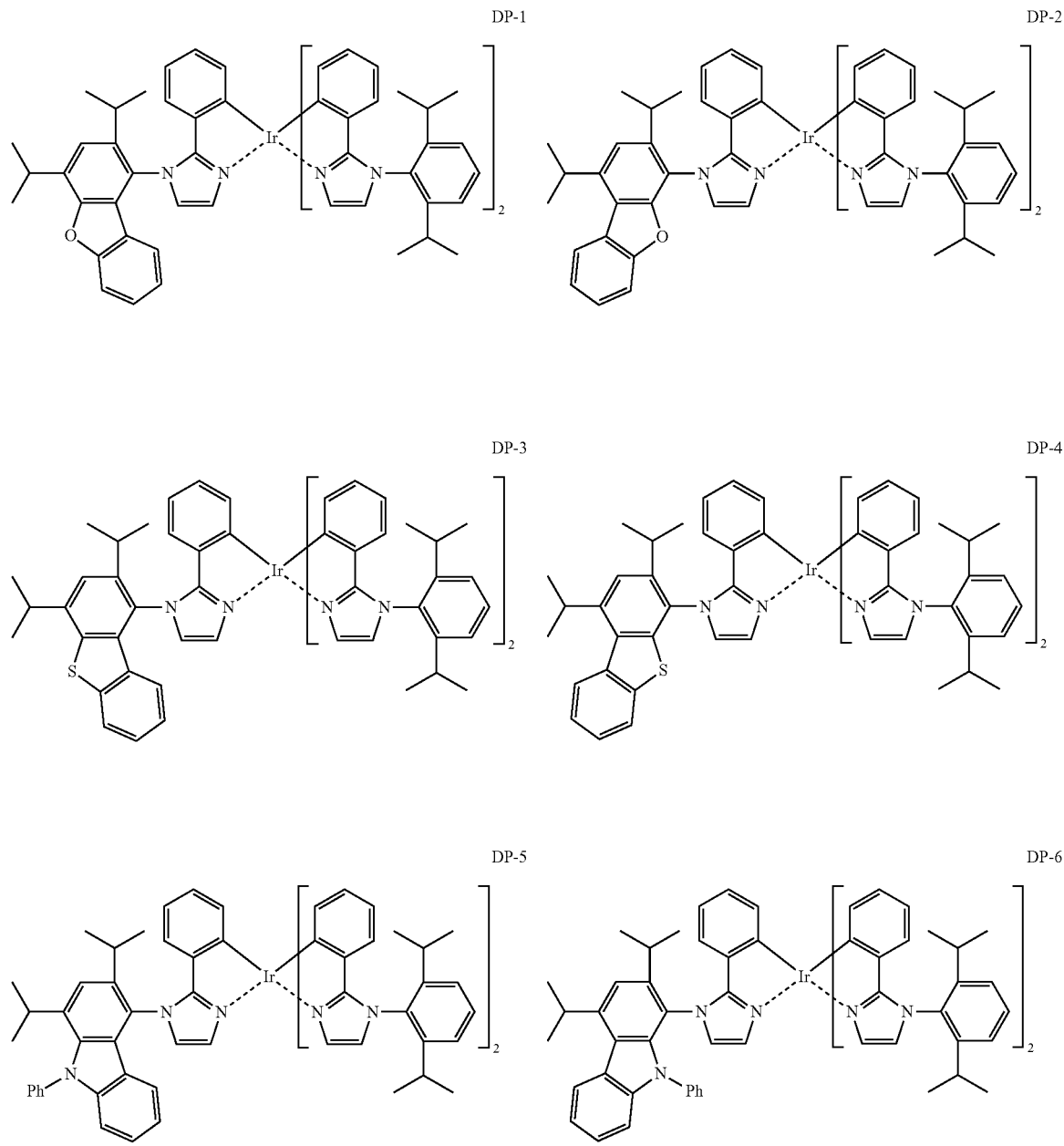

-continued
DP-7 DP-8
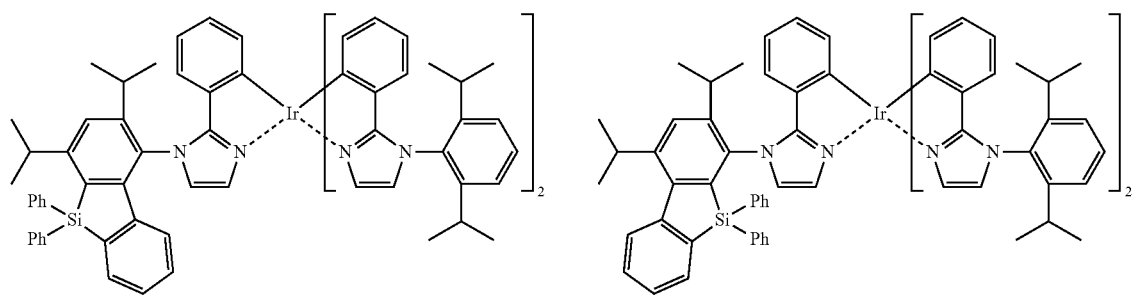
[Chemical Formula 6]
DP-9 DP-10
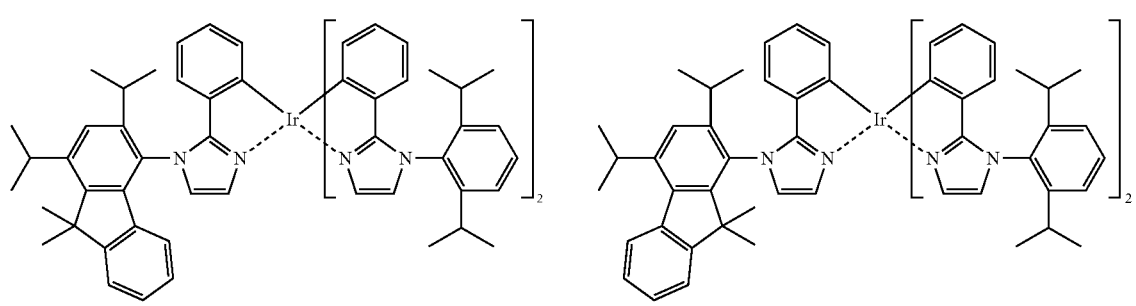
DP-11 DP-12
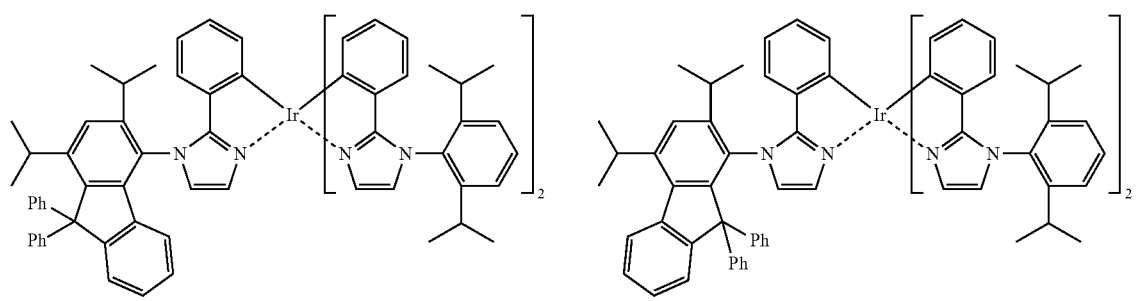
DP-13 DP-14
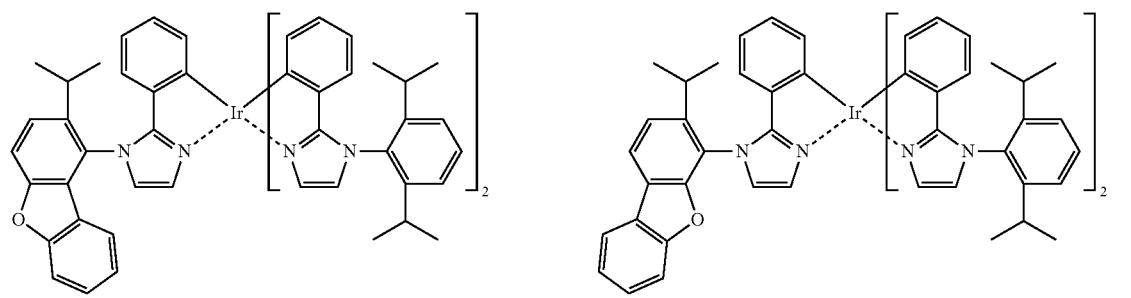
DP-15 DP-16
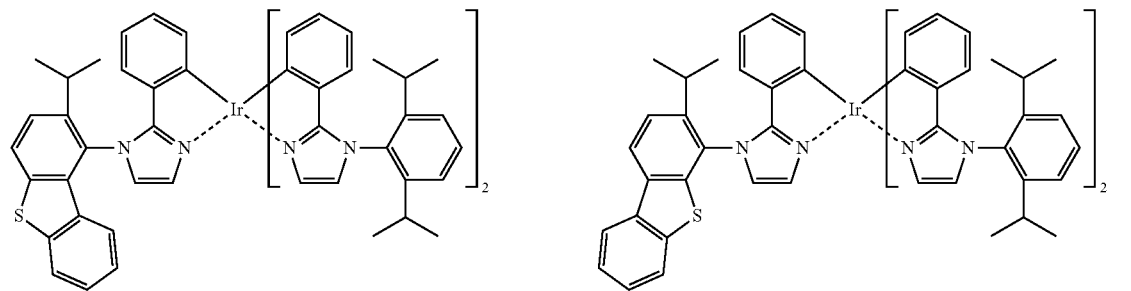

-continued
[Chemical Formula 7]
DP-17
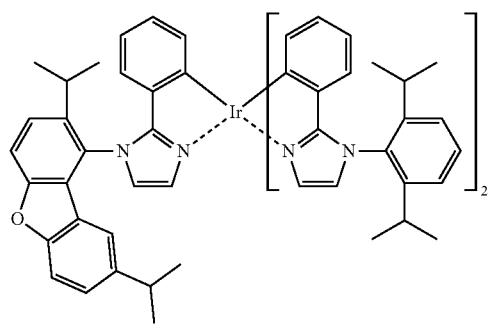
DP-18
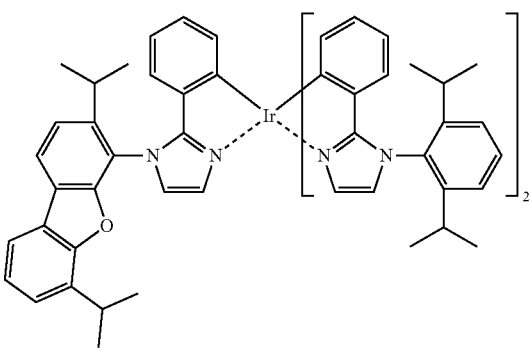
DP-19
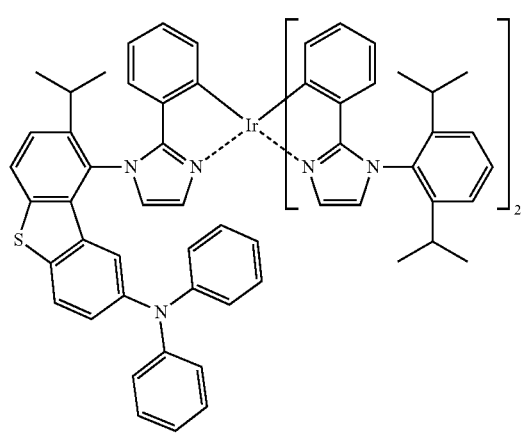
DP-20
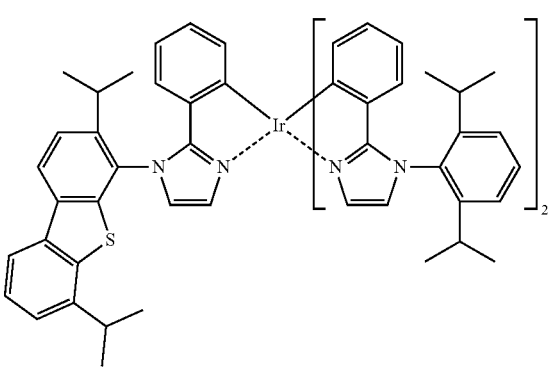
DP-21
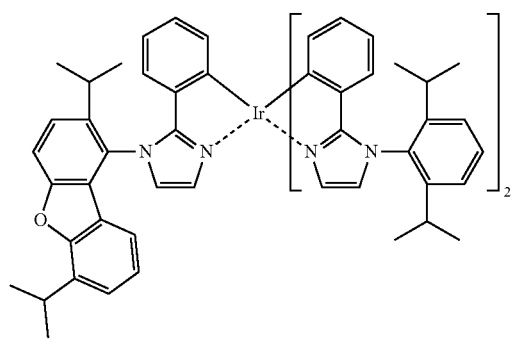
DP-22
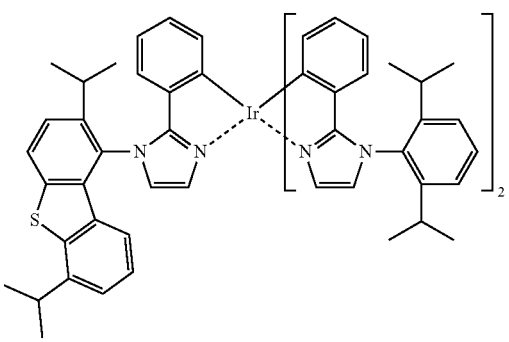
DP-23
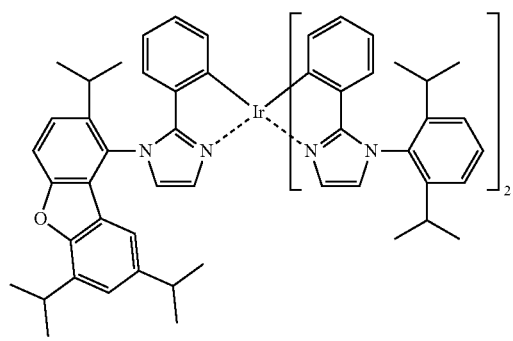
DP-24
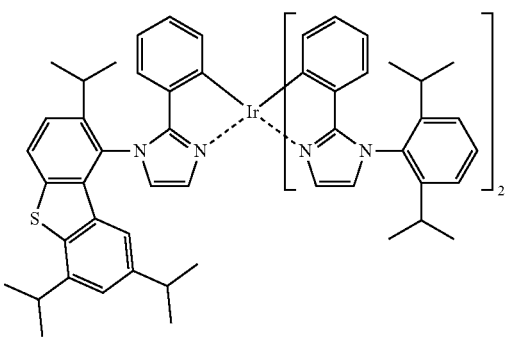

[Chemical Formula 8]
DP-25
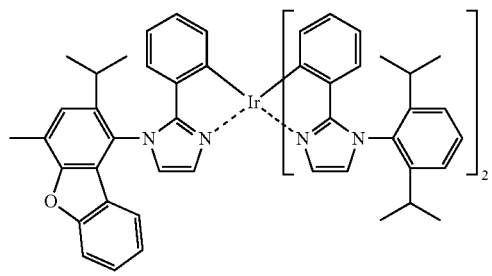
DP-26
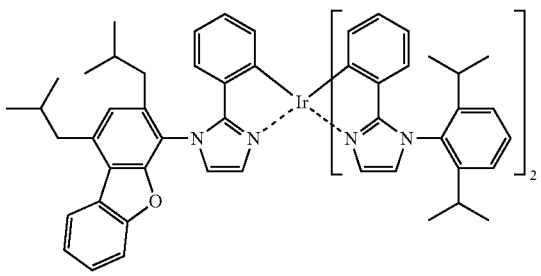
DP-27
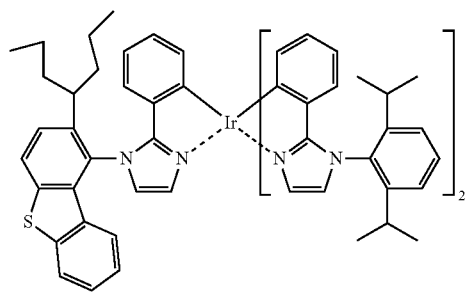
DP-28
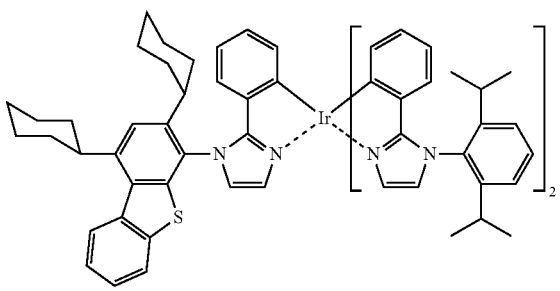
DP-29
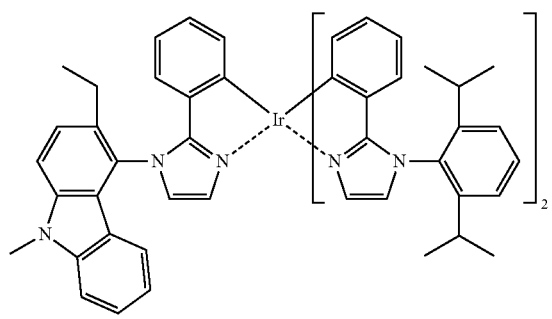
DP-30
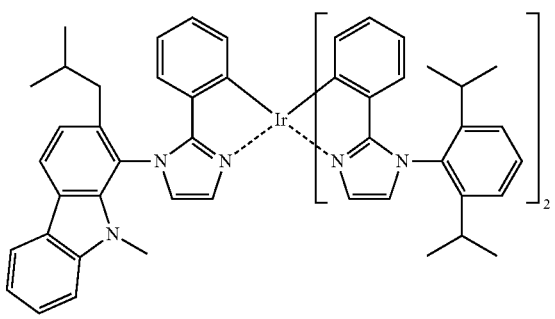
DP-31
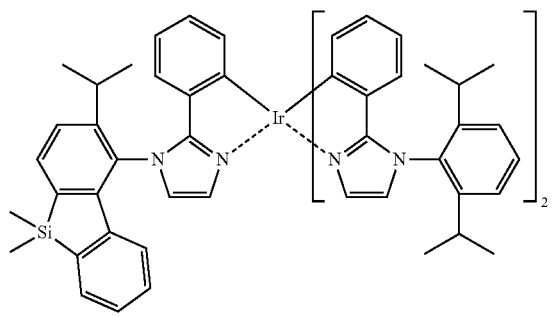
DP-32
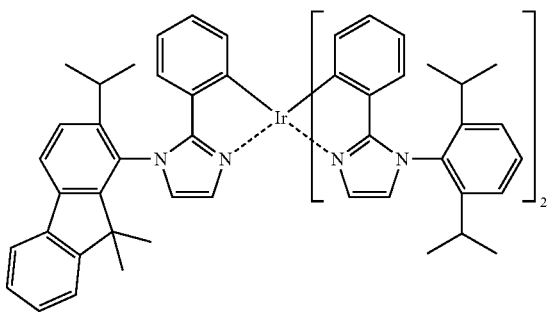
[Chemical Formula 9]
DP-33
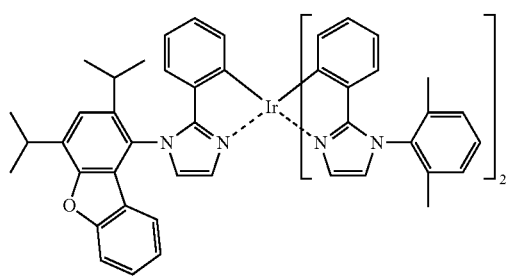
DP-34
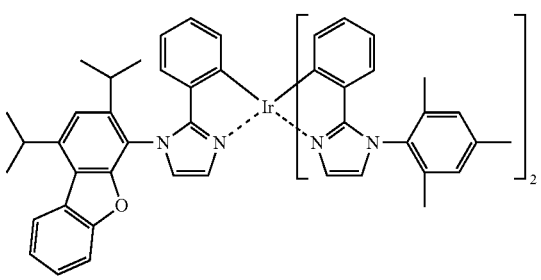

-continued
DP-35
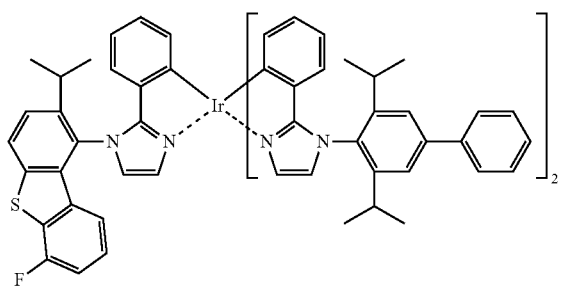
DP-36
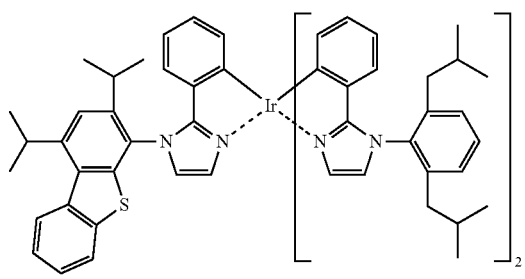
DP-37
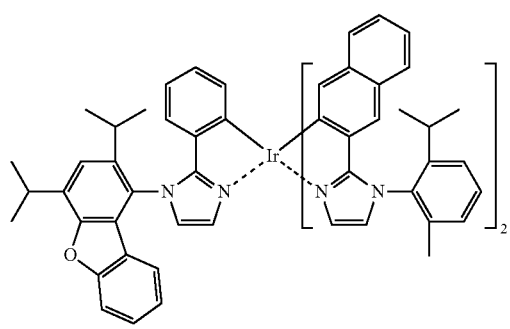
DP-38
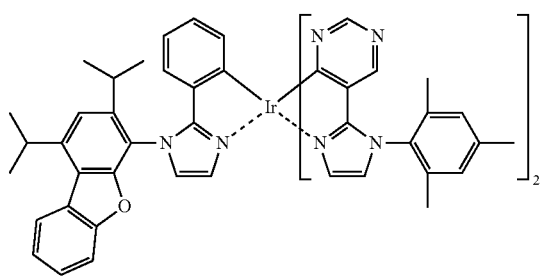
DP-39
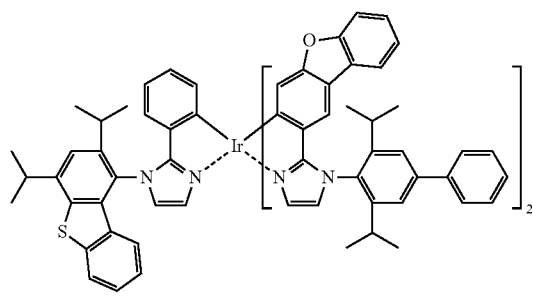
DP-40
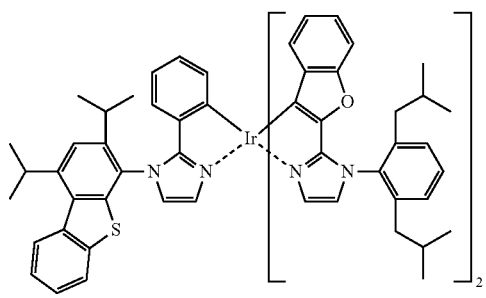
[Chemical Formula 10]
DP-41
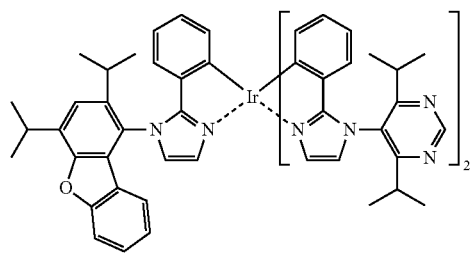
DP-42
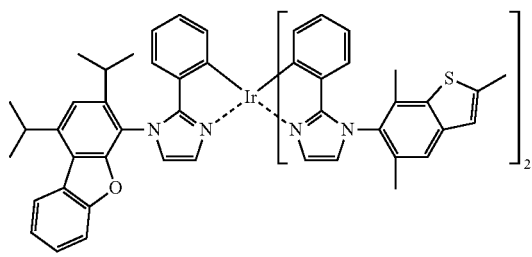
DP-43
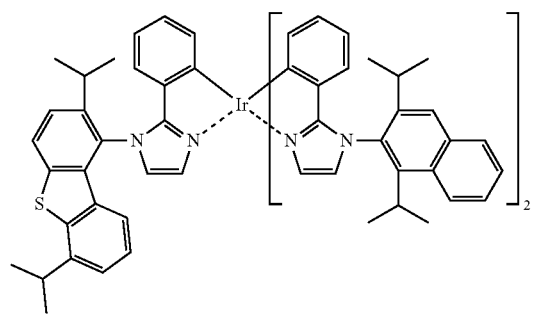
DP-44
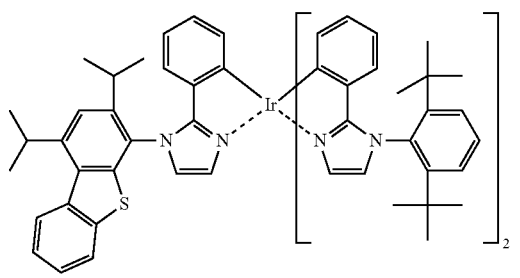

-continued
DP-45
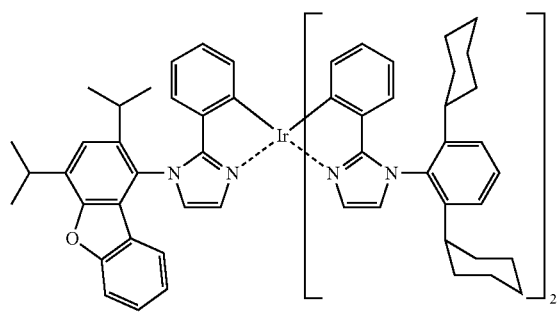
DP-46
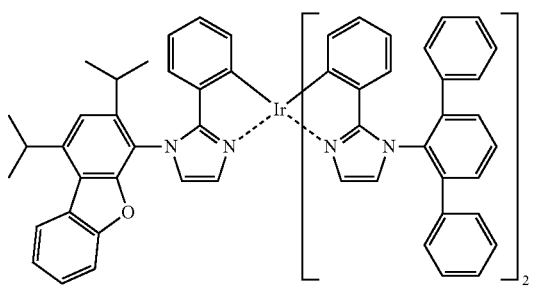
DP-47
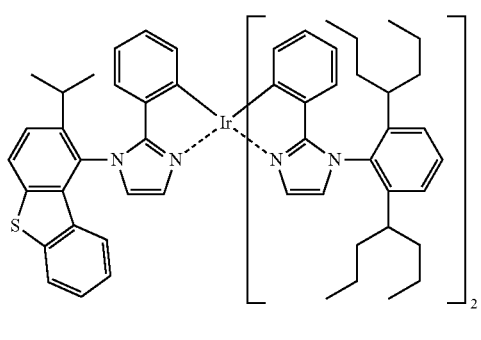
DP-48
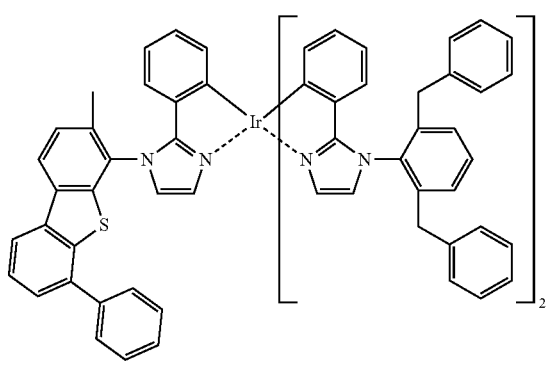
[Chemical Formula 11]
DP-49
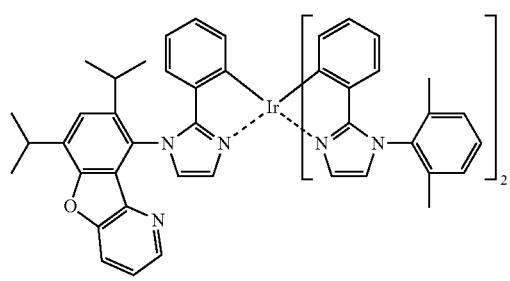
DP-50
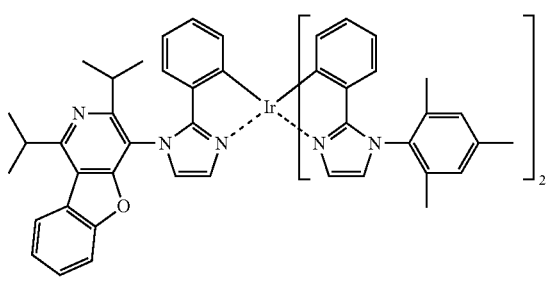
DP-51
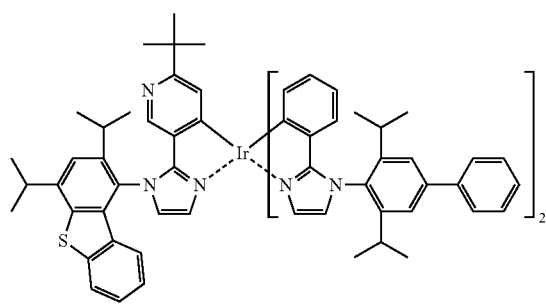
DP-52
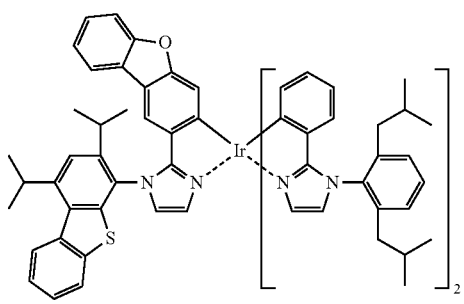

DP-53
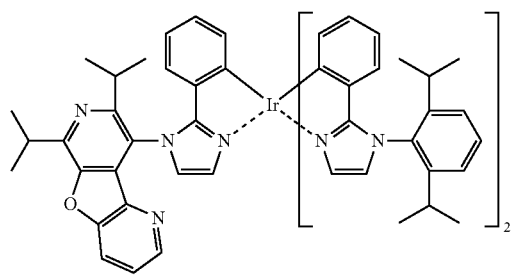
DP-54
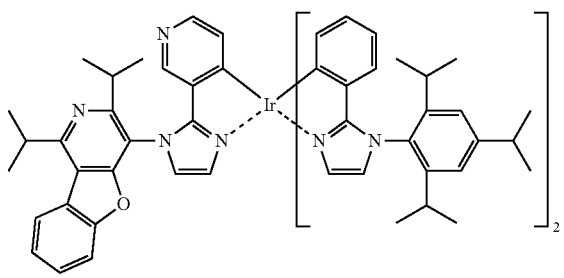
DP-55
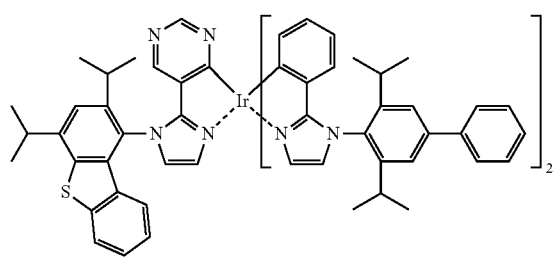
DP-56
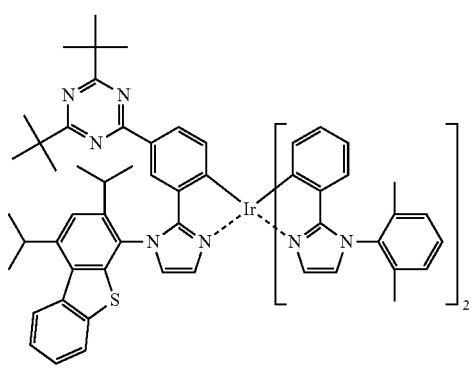
[Chemical Formula 12]
DP-57
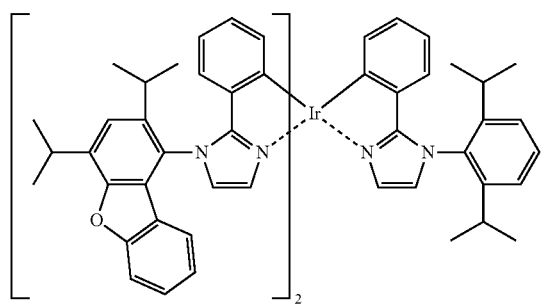
DP-58
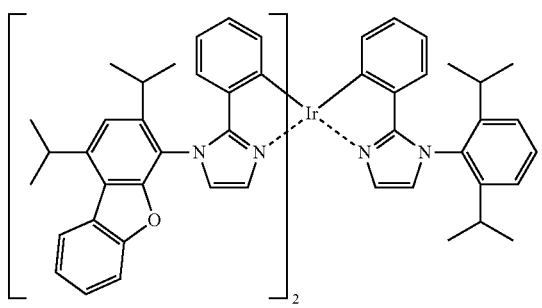
DP-59
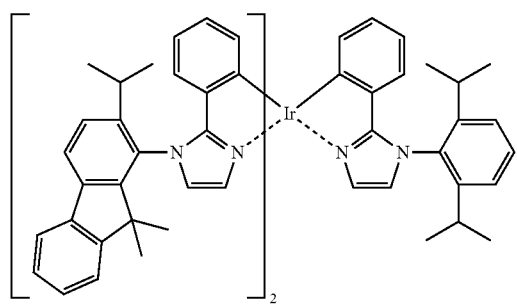
DP-60
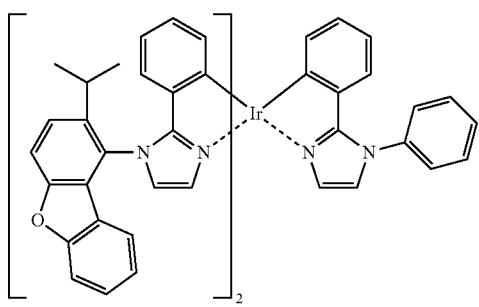

-continued
DP-61
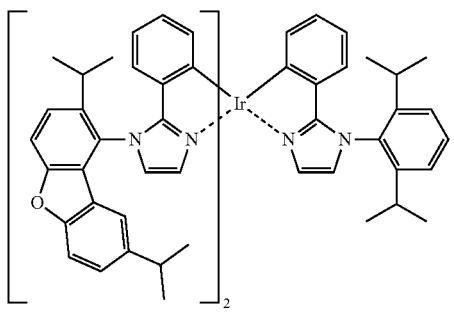
DP-62
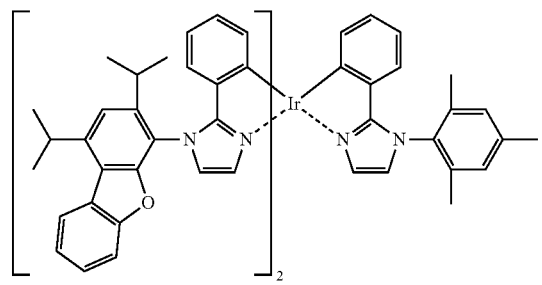
DP-63
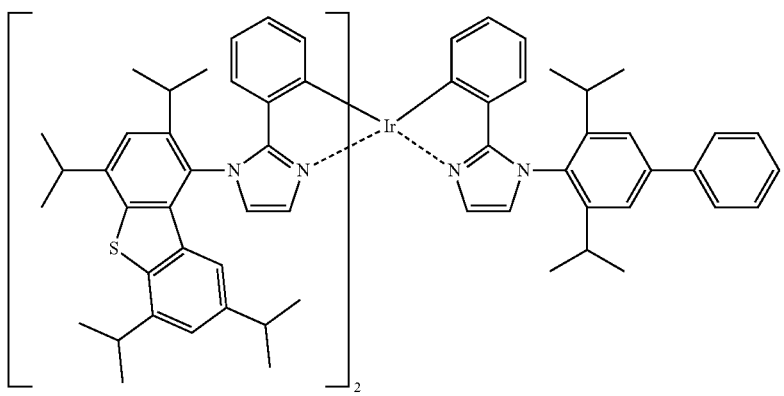
DP-64
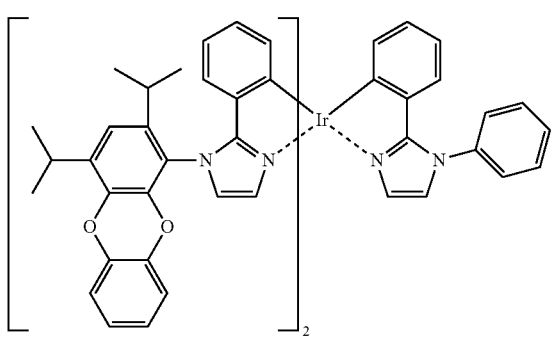
[Chemical Formula 13]
DP-65
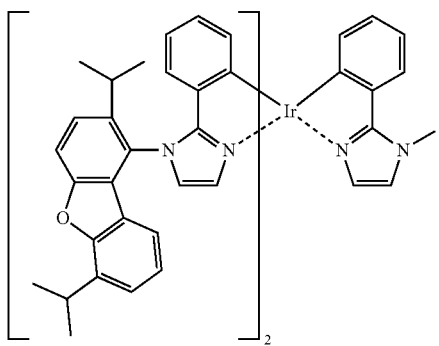
DP-66
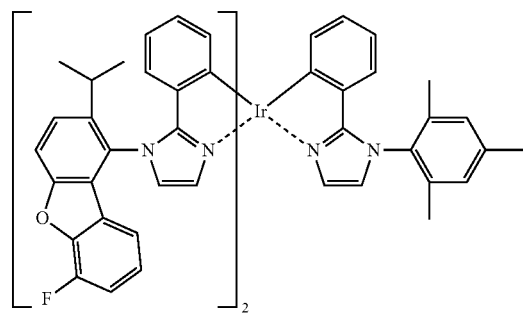

-continued
DP-67
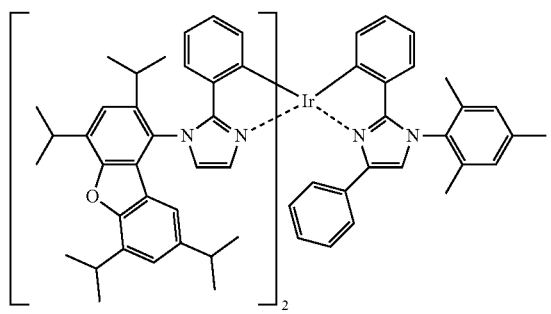
DP-68
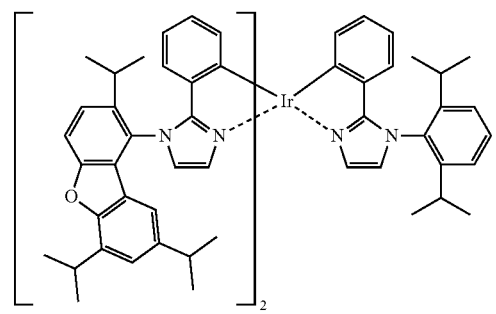
DP-69
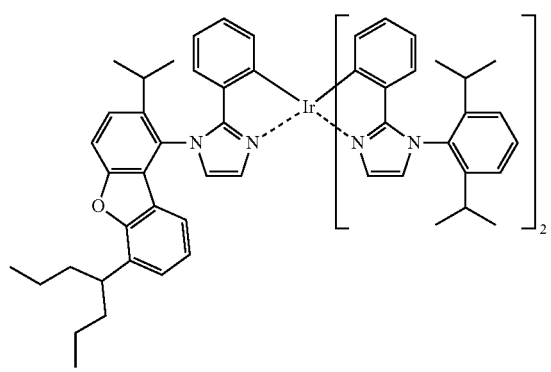
DP-70
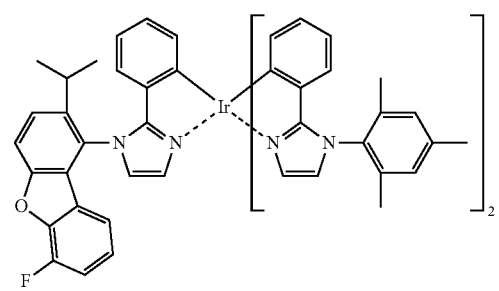
DP-71
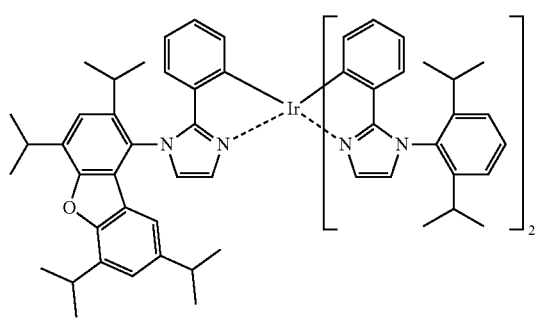
DP-72
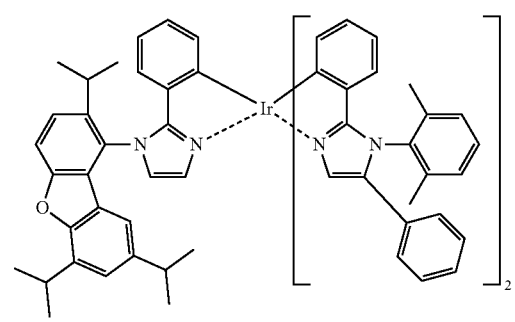
[Chemical Formula 14]
DP-73
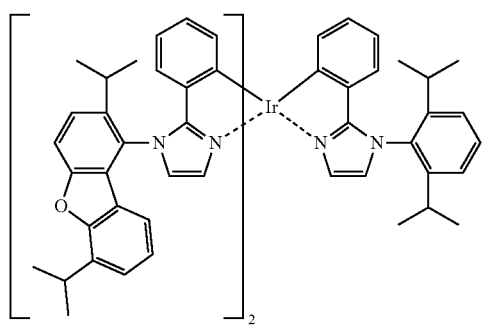
DP-74
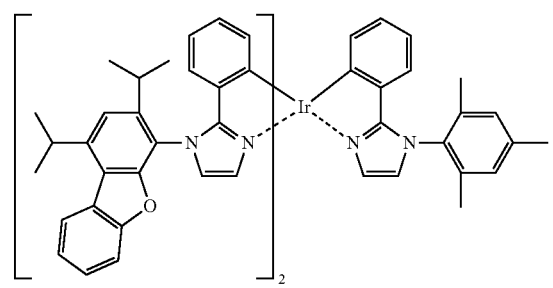

-continued
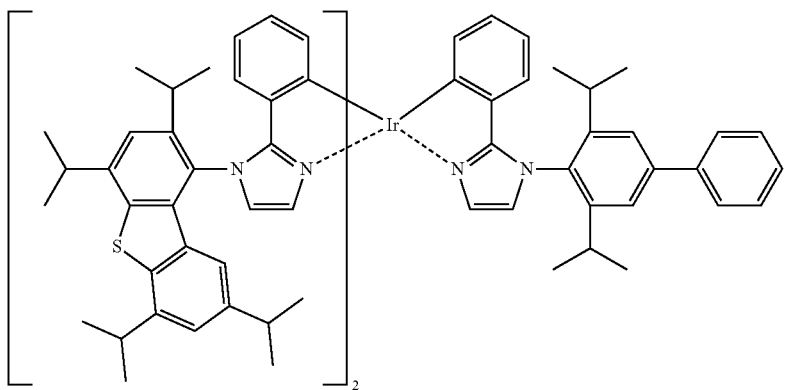
DP-75
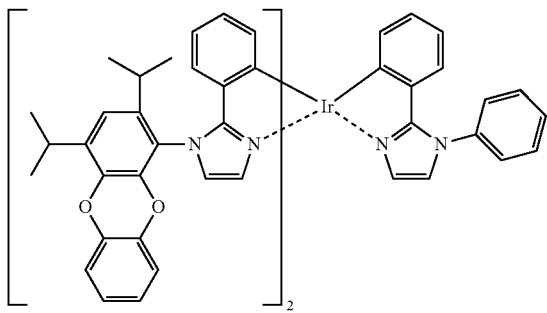
DP-76
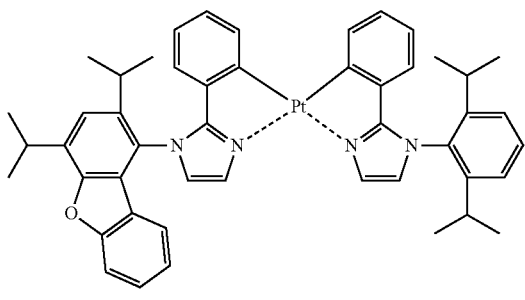
DP-77
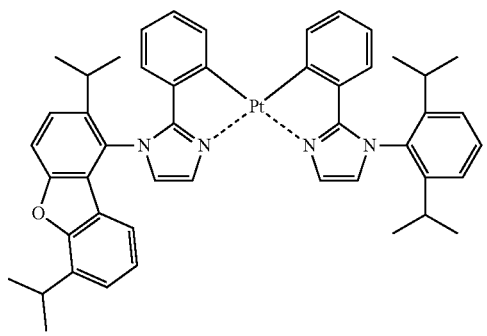
DP-78
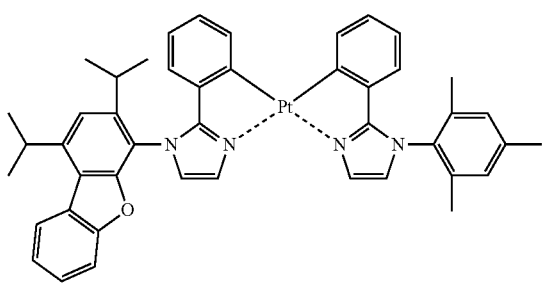
DP-79
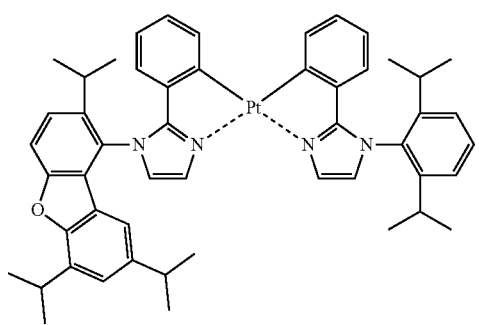
DP-80

[Chemical Formula 15]
DP-81 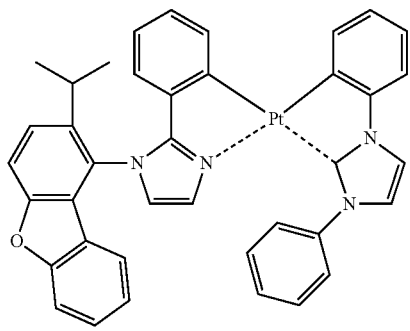
DP-82 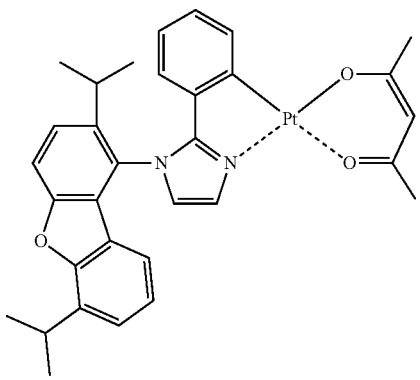
DP-83 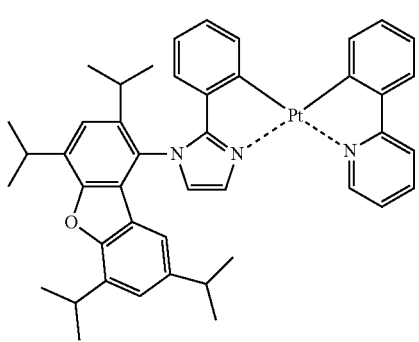
DP-84 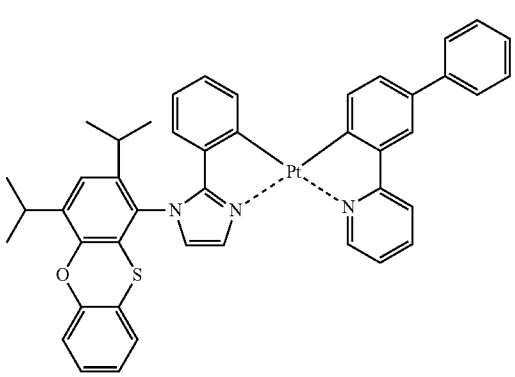
DP-85 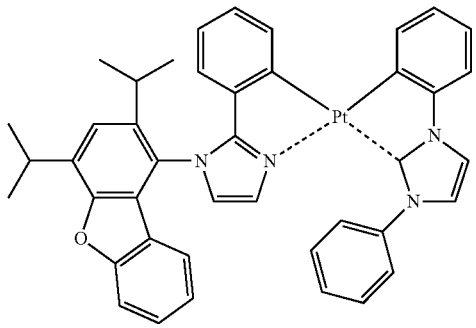
DP-86 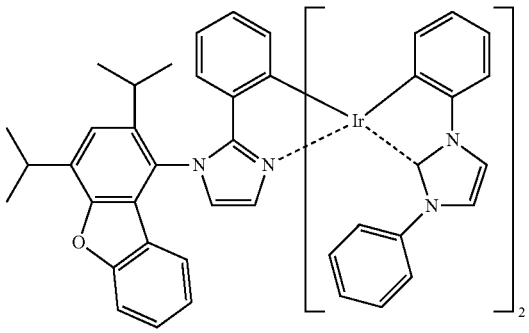
DP-87 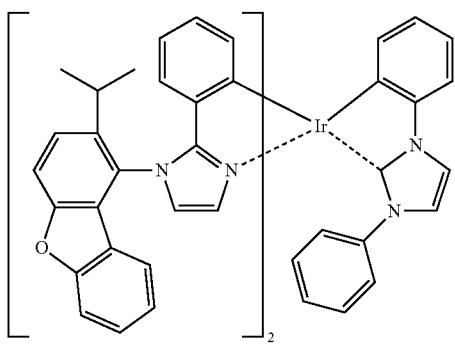
DP-88 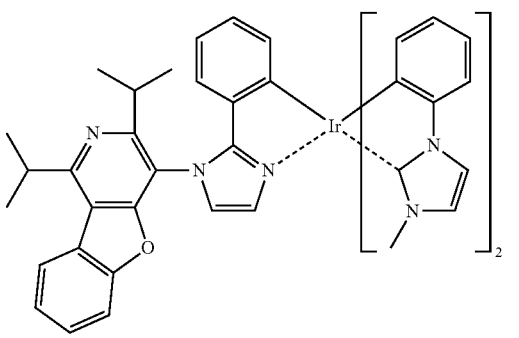

[Chemical Formula 16]
DP-89
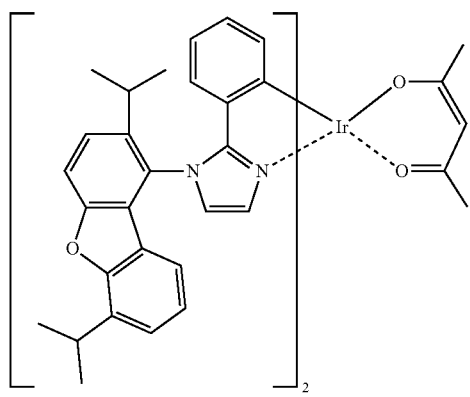
DP-90
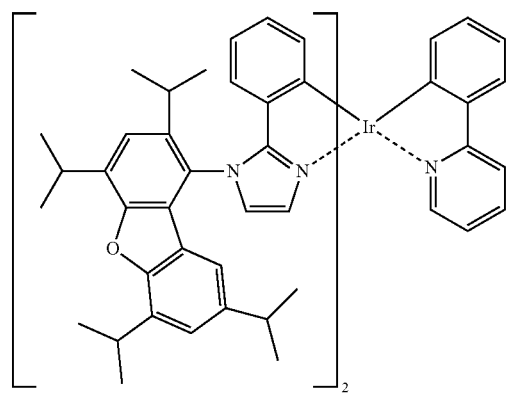
DP-91
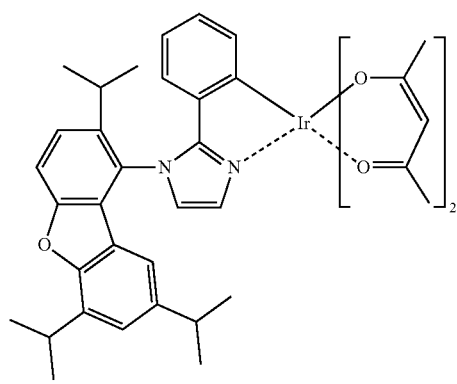
DP-92
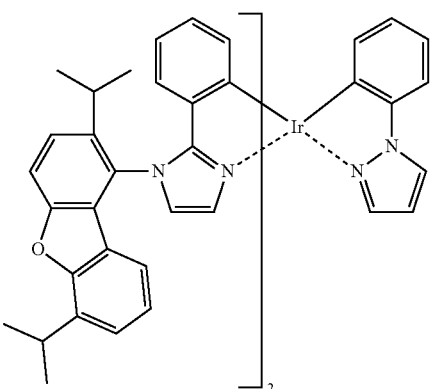
DP-93
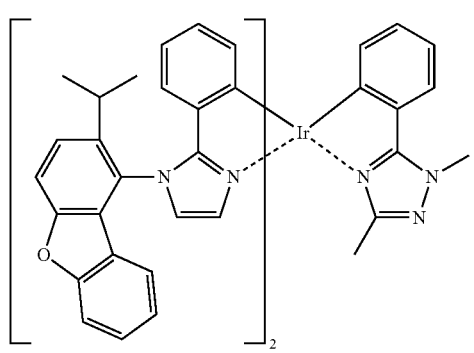
DP-94
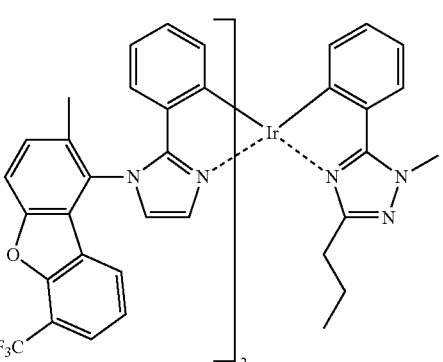
DP-95
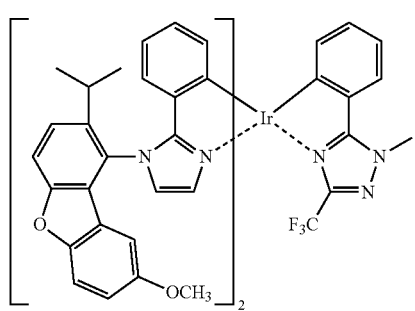
DP-96
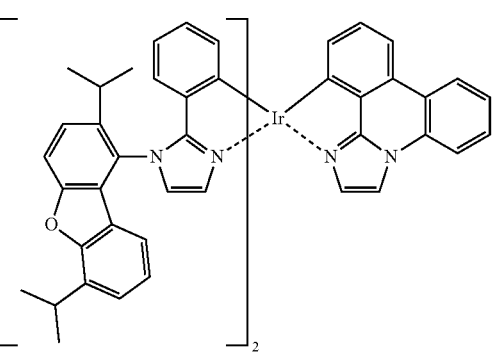

Synthetic Example

Hereinbelow, synthetic examples of a compound represented by General Formula (1), (2) are described. However, the present invention is not limited thereto. Among the specific examples, the synthetic method for DP-1 is described below as an example.

DP-1 can be synthesized according to the following scheme.

[Chemical Formula 17]

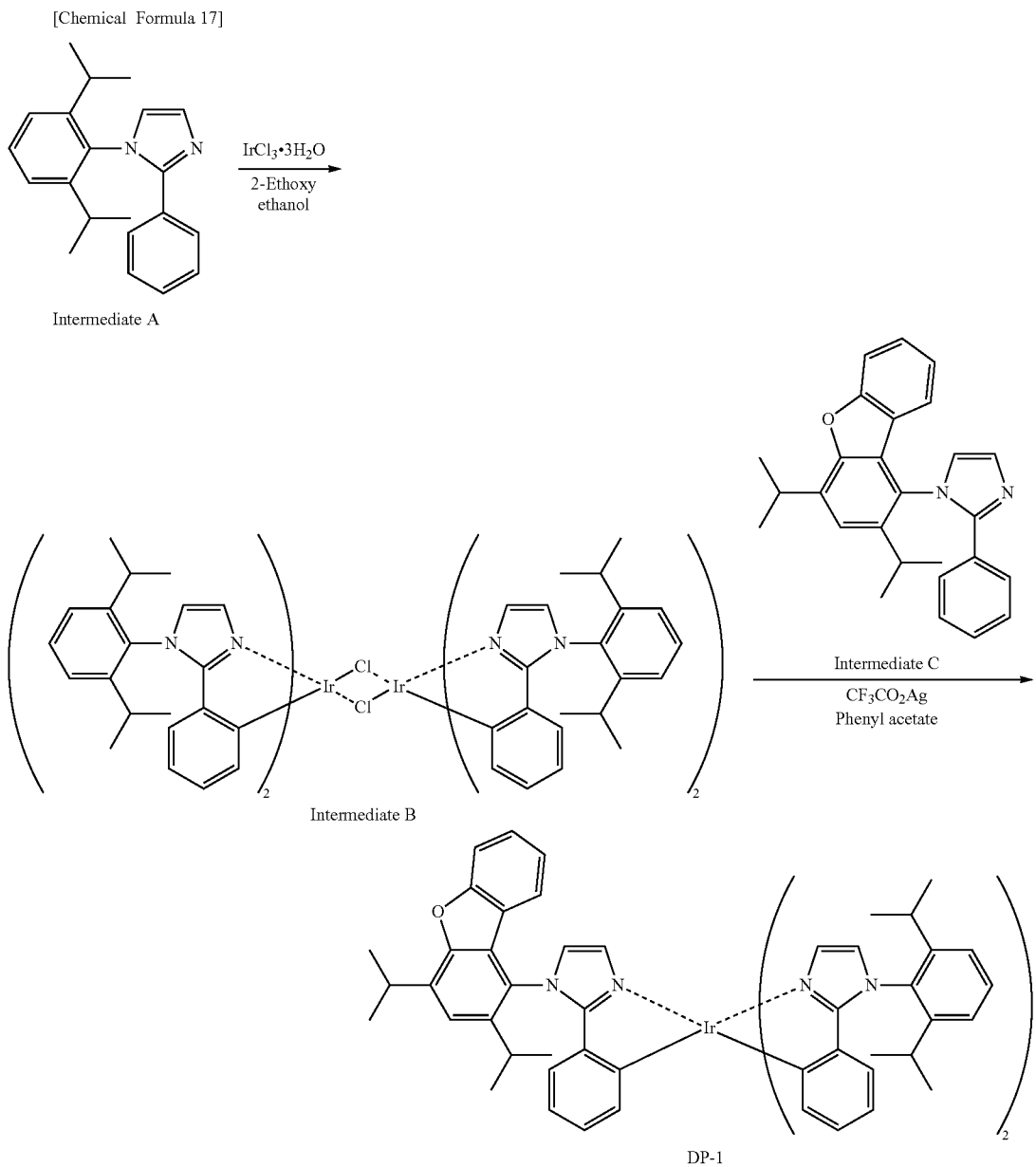

To a 100 ml 4-necked flask, 1.65 g of Intermediate A, 13 ml of 2-ethoxy ethanol, and 3 ml of water are added. After application of a nitrogen inlet, a thermometer, and a condenser, it was set on an oil bath stirrer. Then, 0.55 g of $IrCl_3 \cdot 3H_2O$ were added thereto, and refluxed by boiling for 6 hours with an internal temperature of 135° C. or so under nitrogen stream until the end of the reaction.

After completing the reaction, it was cooled to room temperature and added with methanol followed by filtration and collection of precipitated solids. The obtained solids were washed well with methanol and dried to obtain 1.12 g (77.0%) of Intermediate B.

To a 50 ml 4-necked flask, 1.00 g of Intermediate B, 0.86 g of Intermediate C, 0.30 g of silver trifluoroacetate, and 20 ml of phenyl acetate were added. After application of a nitrogen inlet, a thermometer, and an air cooling pipe, it was set on an oil bath stirrer. Then, it was heated with stirring for 8 hours with an internal temperature of 150° C. or so under nitrogen stream until the end of the reaction.

After completing the reaction, it was cooled to room temperature and added with methanol for dispersion followed by filtration and collection of 1.06 g of crude crystals.

The crystals were purified by column chromatography (solvent for development: tetrahydrofuran/heptane). After that, the obtained crystals were heated and suspended in a mixture solvent of tetrahydrofuran and ethyl acetate followed by filtration to obtain 0.93 g (66.6%) of DP-1. The structure of the compound DP-1 was determined by mass spectrum and $^1$H-NMR.

Mass spectrum (ESI): m/z=1193 [M+]

$^1$H-NMR (THF-d8, 400 MHz): δ 6.40-7.94 (29H, m), δ 2.64-3.48 (6H, m), δ 1.19-1.87 (36H, m)

(1.2) Fluorescent Dopant (Also Referred to as Fluorescent Compound)

Examples of the fluorescent dopant include a coumarin dye, a pyran dye, a cyanine dye, a chloconium dye, a squarylium dye, an oxobenzanthracene dye, a fluorescein dye, a rhodamine dye, a pyrylium dye, a perylene dye, a stilbene dye, a polythiophene dye, a rare earth fluorescent complexes, and a compound having high fluorescence quantum yields represented by a laser dye.

(1.3) Combined Use with Conventionally Known Dopant

The luminescent dopant which can be used in the present invention may be used in combination with a plurality of other compounds. A combination of phosphorescent dopants having different structures or a combination of a phosphorescent dopant and a fluorescent dopant may be also employed.

Herein, as for a luminescent dopant, specific examples of a conventionally known luminescent dopant that can be used in combination of the organometallic complex represented by General Formula (1) according to the present invention are given. However, the present invention is not limited thereto.

[Chemical Formula 18]

D-1

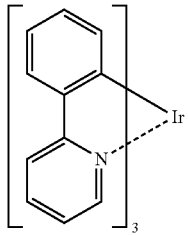

D-2

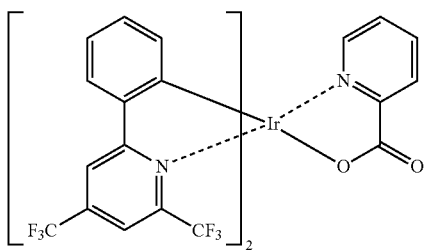

D-3

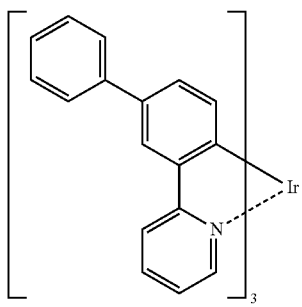

D-4

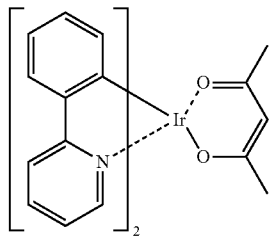

D-5

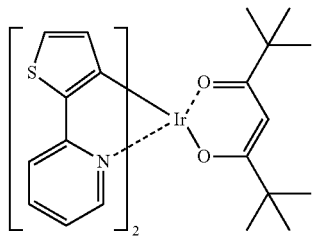

D-6

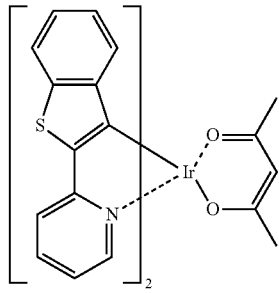

D-7

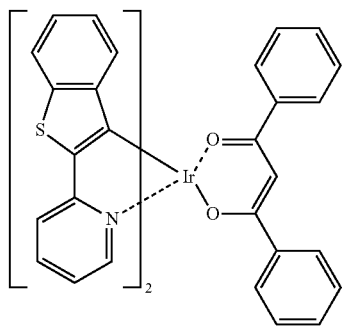

D-8

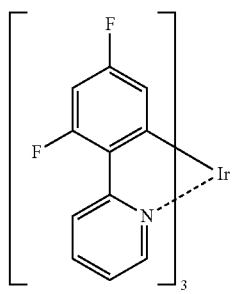

D-9
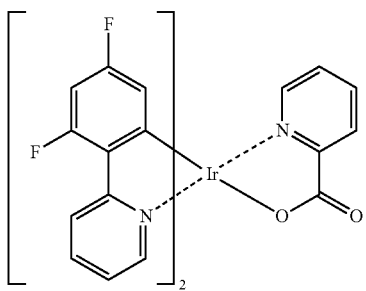
D-10
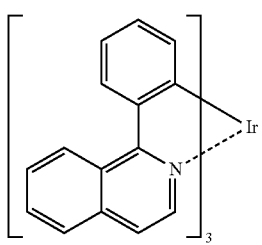
D-11
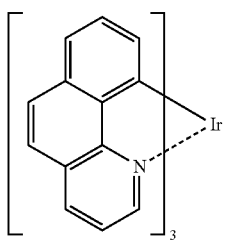
D-12
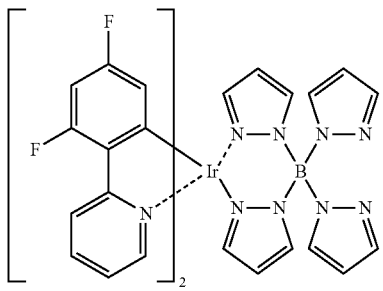
[Chemical Formula 19]
D-13
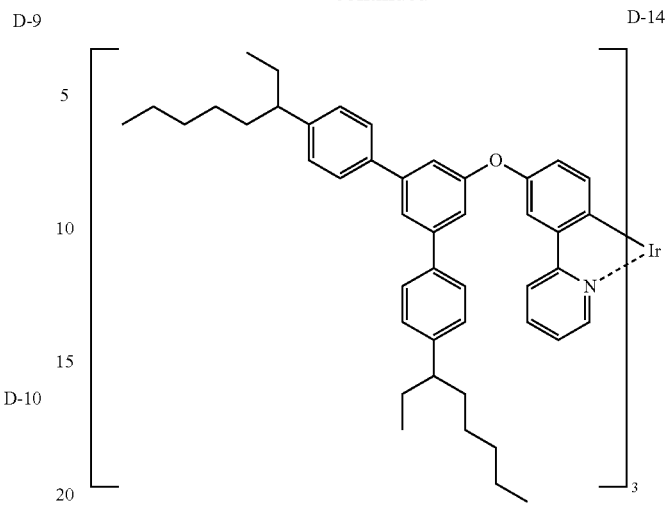
D-14
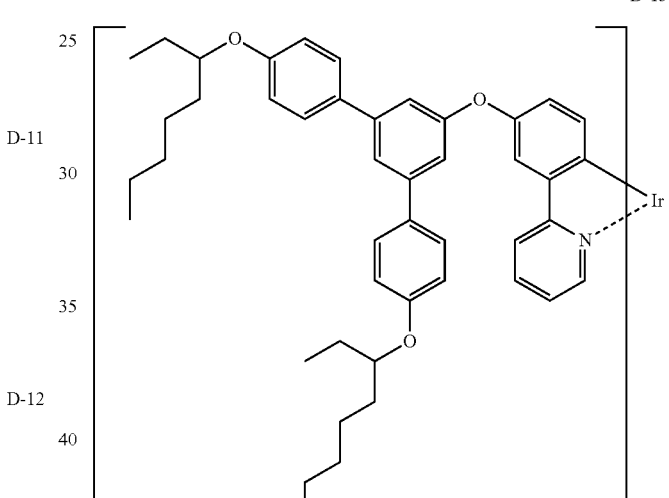
D-15
[Chemical Formula 20]
D-16
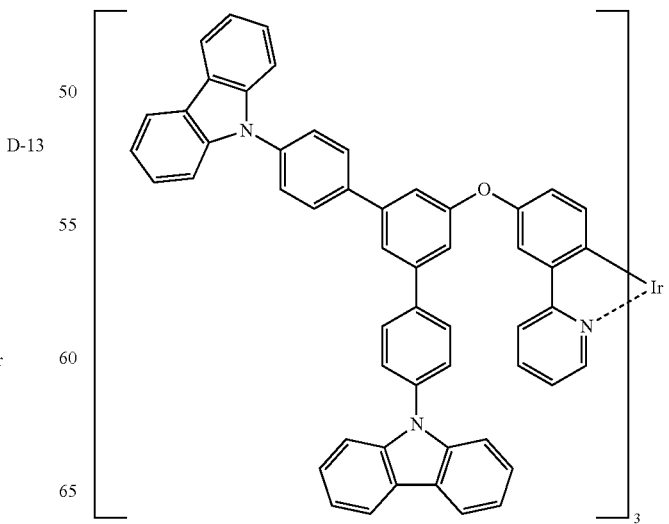

D-17
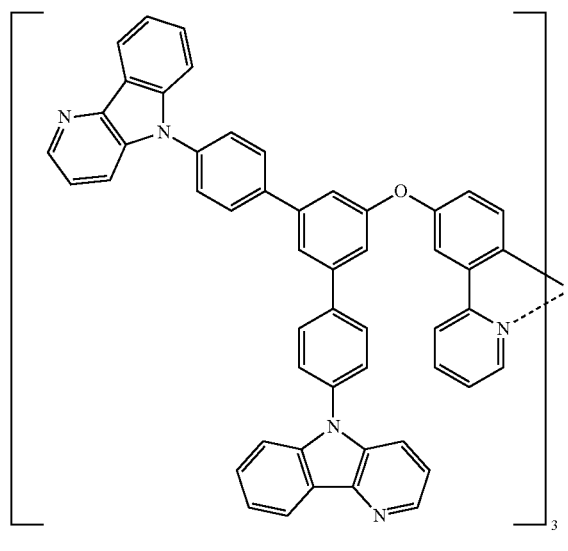
D-18
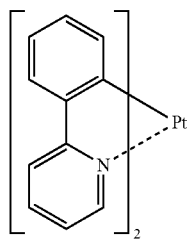
D-19
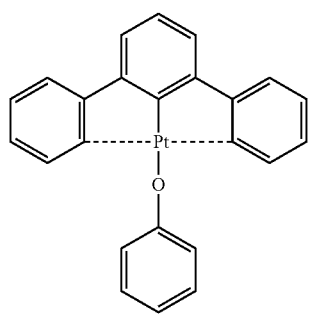
D-20
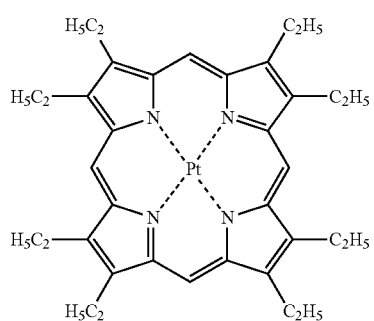
[Chemical Formula 21]
D-21
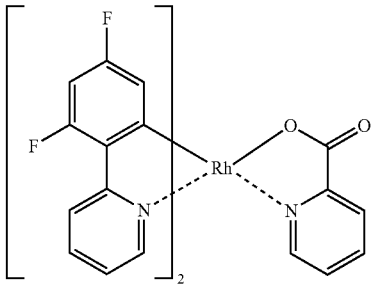
D-22
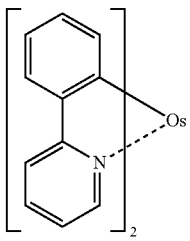
D-23
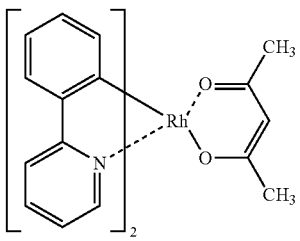
D-24
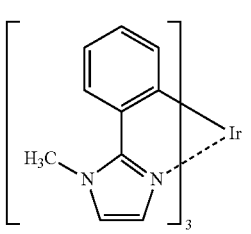
D-25
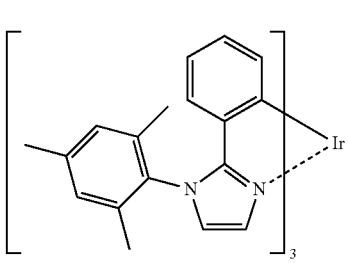
D-26

D-27 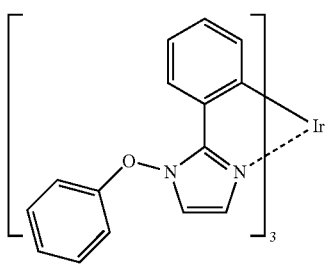
D-28 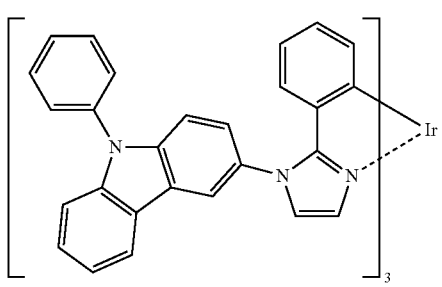
D-29 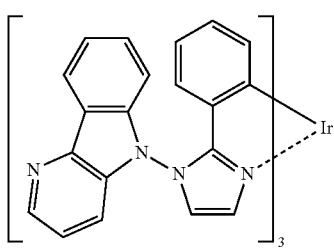
D-30 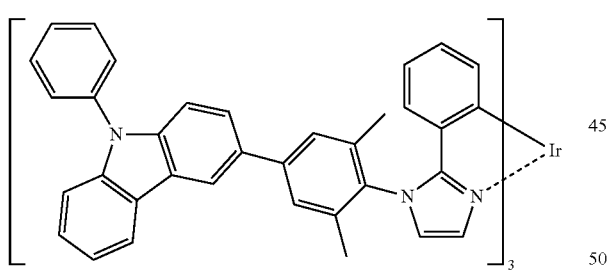
D-31 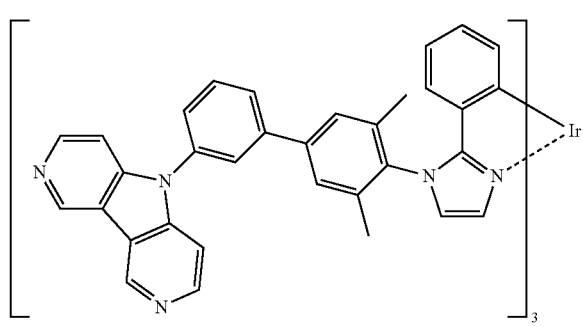
[Chemical Formula 22]
D-32 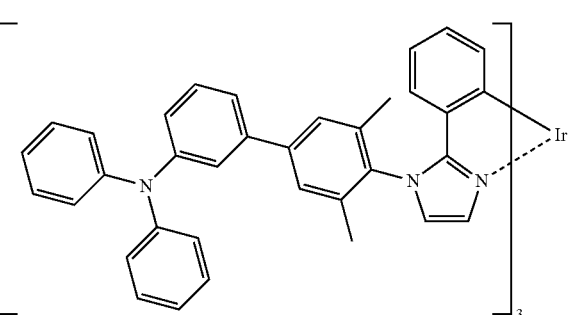
D-33 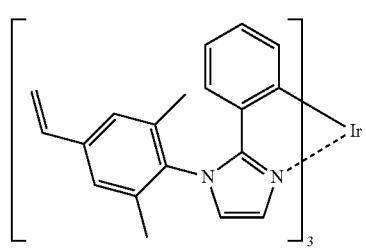
D-34 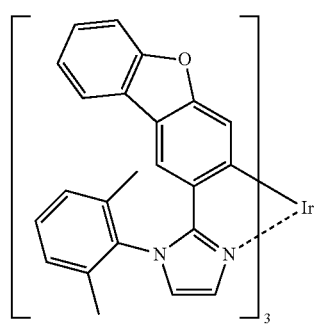
D-35 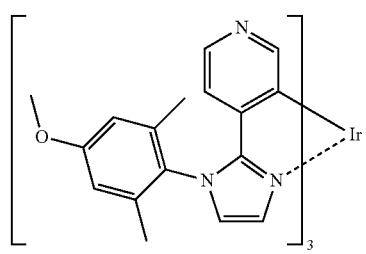
D-36 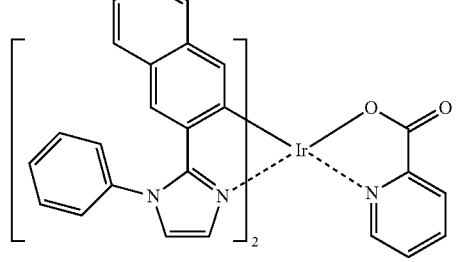

-continued
D-37
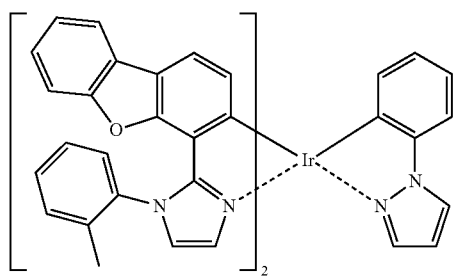
D-38
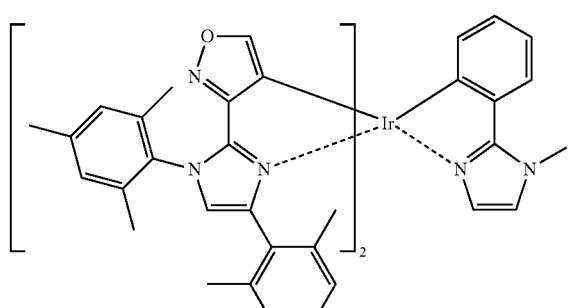
D-39
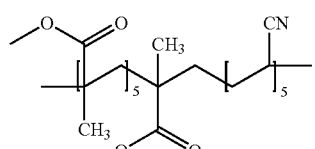
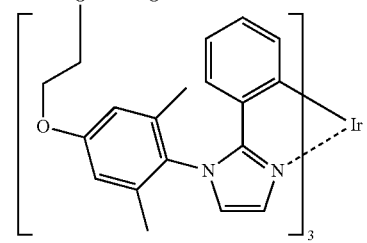
[Chemical Formula 23]
D-40
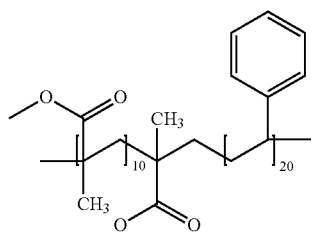
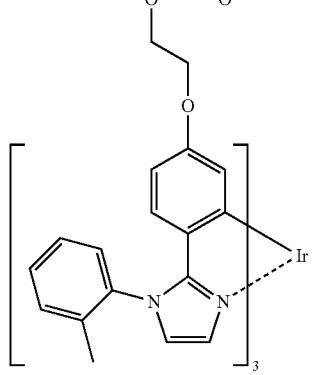
-continued
D-41
D-42
D-43
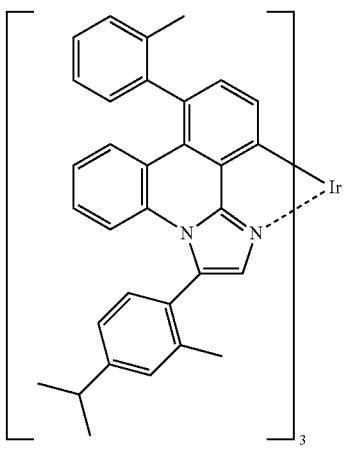
[Chemical Formula 24]
D-44
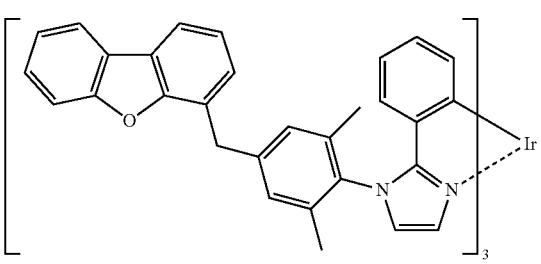

-continued

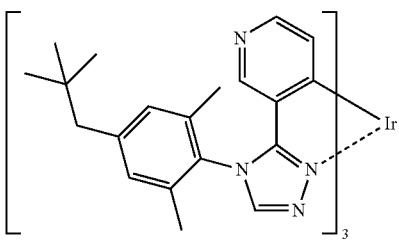
D-45

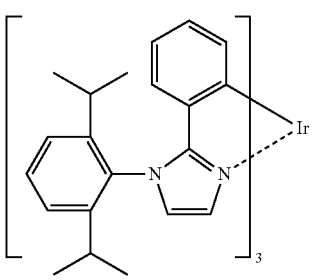
D-46

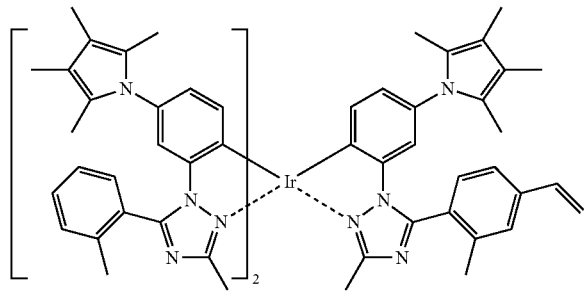
D-47

(2) Luminescent Host Compound (Also Referred to as Luminescent Host or Host Compound)

The host compound in the present invention is defined as a compound that is contained in the light emitting layer in an amount of 20% by mass or more based on the layer and that has a phosphorescence quantum yield of phosphorescent light emission of less than 0.1, preferably less than 0.01, at room temperature (25° C.). Further, among the compounds that are contained in a light emitting layer, those having the mass ratio of 50% or more in the layer are preferable.

The luminescent host which can be used in the present invention is not particularly limited, and the compound that are conventionally used for an organic EL element can be used. Typical examples include carbazole derivatives, triarylamine derivatives, aromatic derivatives, nitrogen-containing heterocyclic compounds, thiophene derivatives, furan derivatives, compounds having basic skeletons of, for example, oligoarylene compounds, carboline derivatives, and diazacarbazole derivatives (herein, the diazacarbazole derivative is a compound having a nitrogen atom substituted for at least one carbon atom on the hydrocarbon ring constituting the carboline ring of a carboline derivative).

The well-known luminescent host that can be used in the present invention is preferably a compound having hole transportability and electron transportability, and also preventing the shift of luminescence to the longer wavelength side, and having a high Tg (glass transition temperature).

Furthermore, in the present invention, a conventionally known luminescent host can be used either singly or in combination of several types. By using several types of luminescent hosts, it becomes possible to control the migration of charge so that the efficiency of the organic EL element can be increased. Furthermore, the use of several types of the metal complex of the present invention and/or of conventionally known compounds used as the phosphorescent dopants allows mixing of different luminescences, and thus the any emission color can be obtained.

The luminescent host used in the present invention may be a low molecular weight compound, a high molecular weight compound having a repeating unit, a low molecular weight compound having a polymerizable group such as a vinyl group or an epoxy group (polymerizable luminescent host), and those compounds can be used singly or several types of them can be used.

Specific examples of the conventionally known luminescent host include those described in the following documents.

JP 2001-257076 A, JP 2002-308855 A, JP 2001-313179 A, JP 2002-319491 A, JP 2001-357977 A, JP 2002-334786 A, JP 2002-8860 A, JP 2002-334787 A, JP 2002-15871 A, JP 2002-334788 A, JP 2002-43056 A, JP 2002-334789 A, JP 2002-75645 A, JP 2002-338579 A, JP 2002-105445 A, JP 2002-343568 A, JP 2002-141173 A, JP 2002-352957 A, JP 2002-203683 A, JP 2002-363227 A, JP 2002-231453 A, JP 2003-3165 A, JP 2002-234888 A, JP 2003-27048 A, JP 2002-255934 A, JP 2002-260861 A, JP 2002-280183 A, JP 2002-299060 A, JP 2002-302516 A, JP 2002-305083 A, JP 2002-305084 A, and JP 2002-308837 A.

Hereinbelow, specific examples of those used as a luminescent host of the organic EL element of the present invention are described. However, the present invention is not limited thereto.

[Chemical Formula 25]
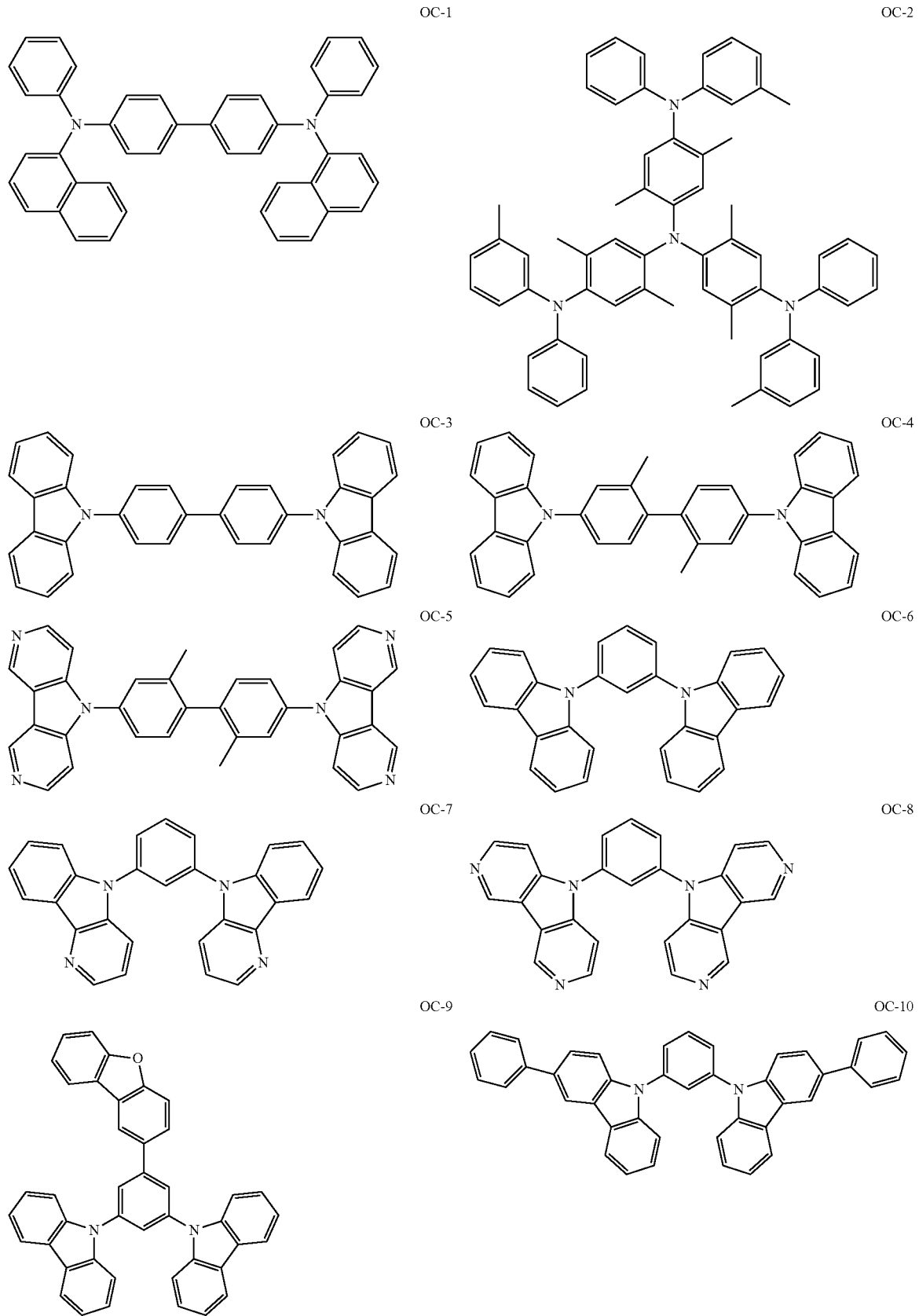

[Chemical Formula 26]
OC-11
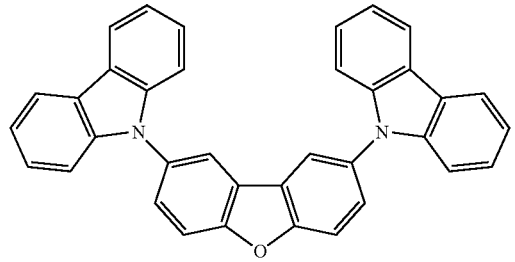
OC-12
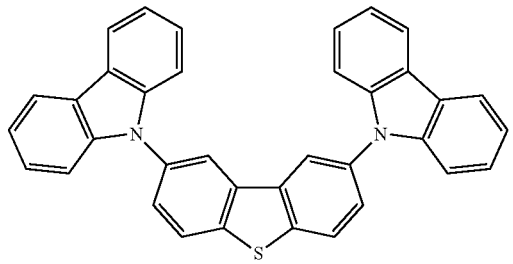
OC-13
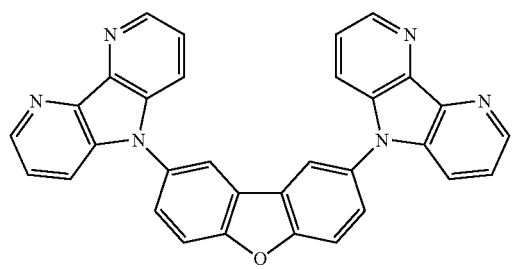
OC-14
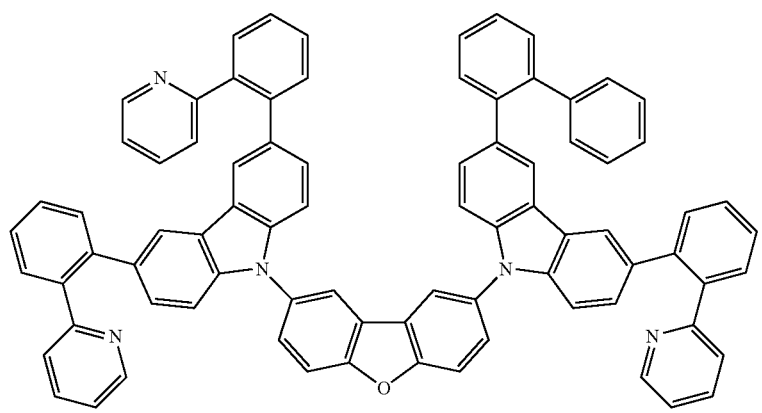
OC-15
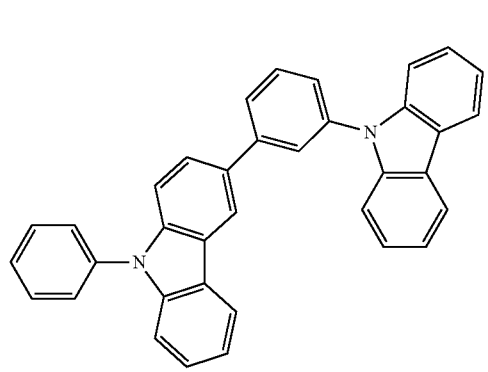
OC-16
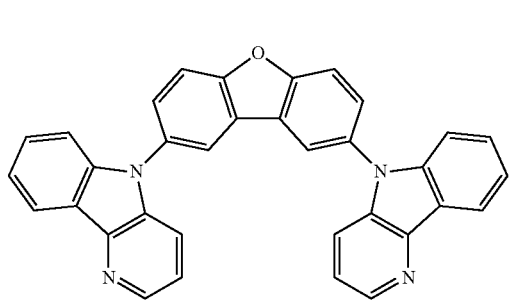

-continued
OC-17
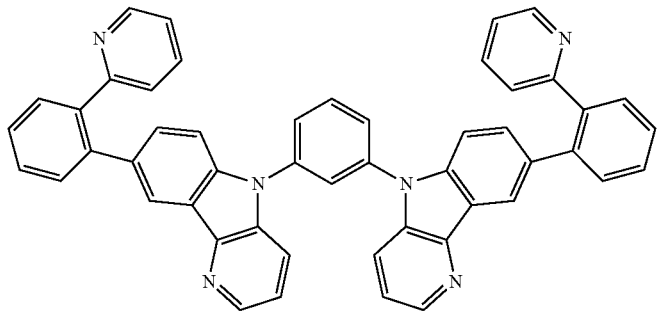
[Chemical Formula 27]
OC-18
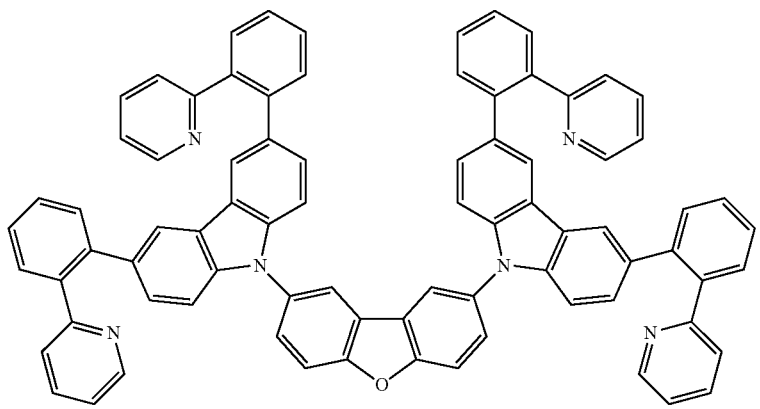
OC-19
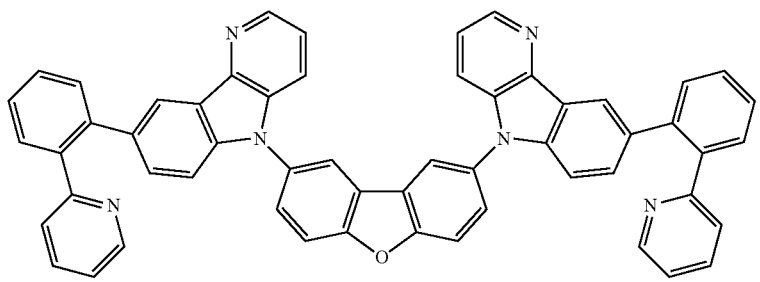
OC-20
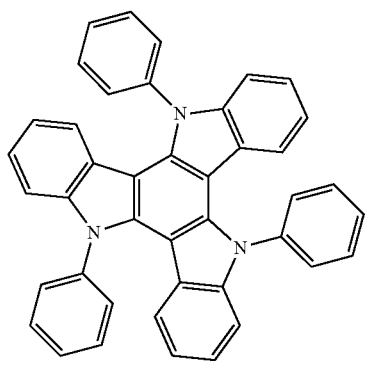
OC-21
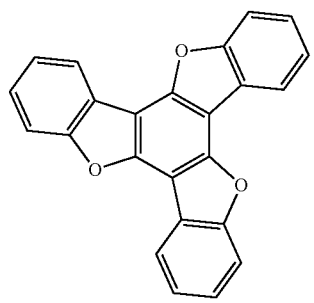

-continued
OC-22
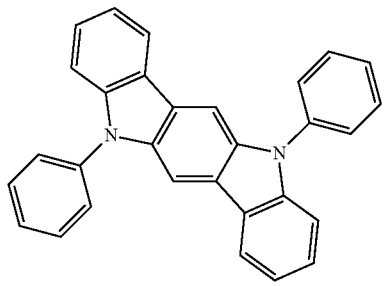
OC-23
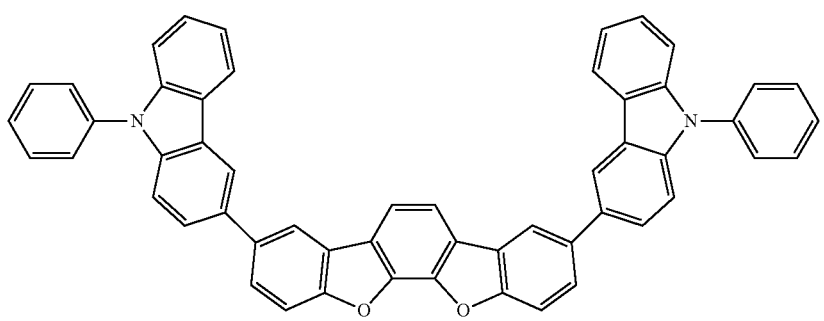
[Chemical Formula 28]
OC-24
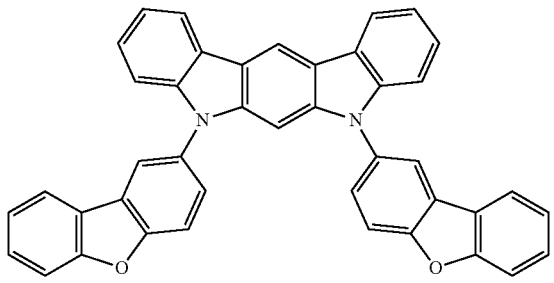
OC-25
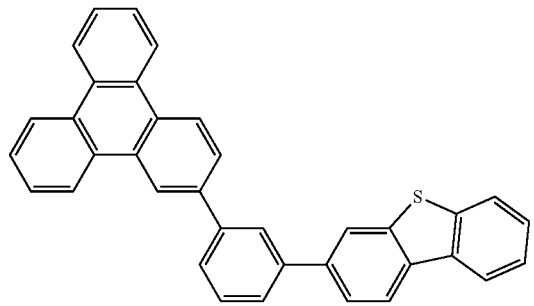
OC-26
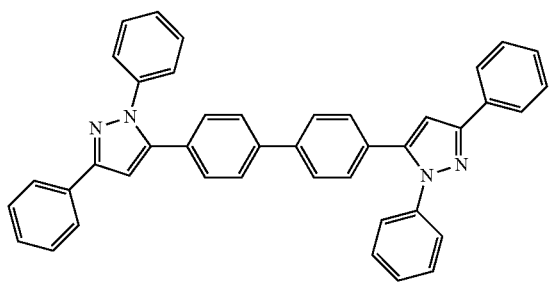
OC-27
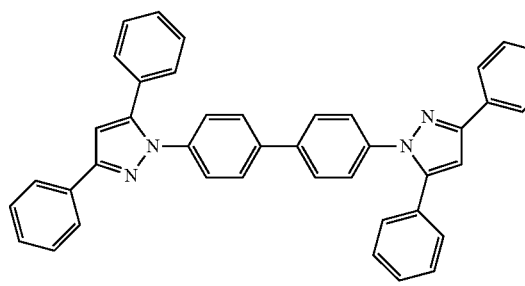

-continued

OC-28

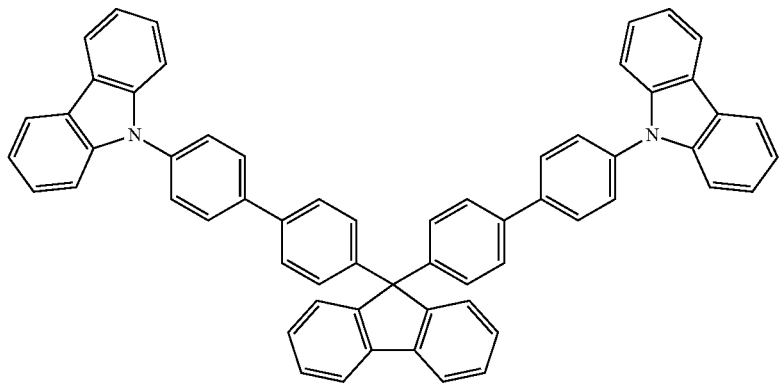

[Chemical Formula 29]

OC-29   OC-30

OC-31   OC-32

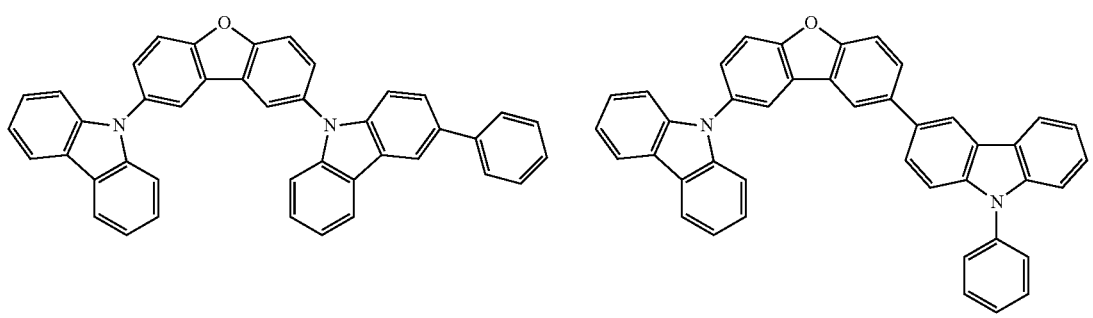

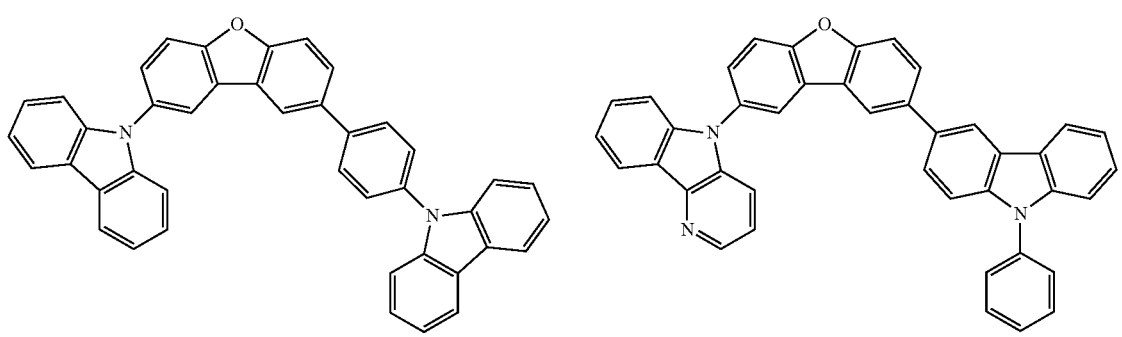

Furthermore, the compounds that are particularly preferred as a luminescent host of the light emitting layer of the organic EL element of the present invention are the compounds that are represented by the following General Formula (B) or General Formula (E).

[Chemical Formula 30]

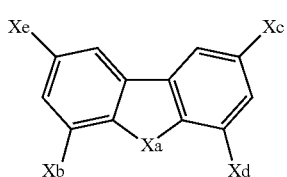

General Formula (B)

-continued

General Formula (E)

In General Formula (B) and (E), Xa represents O or S, Xb, Xc, Xd and Xe each independently represent a hydrogen atom, a substituent group, or a group represented by the following General Formula (C), at least one of Xb, Xc, Xd and Xe represents a group represented the following General Formula (C), and, in at least one of the groups represented by the following General Formula (C), Ar represents a carbazolyl group.

Ar-(L₄)ₙ-*    General Formula (C)

In General Formula (C), $L_4$ represents a divalent linking group derived from an aromatic hydrocarbon ring or an aromatic heterocycle. n represents an integer of from 0 to 3, and when n is 2 or more, plural $L_4$ may be the same or different from each other. * represents a linking site with General Formula (B) or (E). Ar represents a group represented by the following General Formula (D).

[Chemical Formula 31]

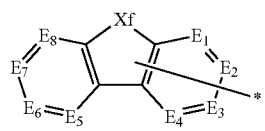

General Formula (D)

[Chemical Formula 32]

In General Formula (D), Xf represents N(R"), O, or S, E1 to E8 represent C(R"$_1$) or N, and R" and R"$_1$ represent a hydrogen atom, a substituent group, or a linking site with $L_4$ in General Formula (C). * represents a linking site with $L_4$ in General Formula (C).

With regard to the compound represented by the above General Formula (B), preferably, at least two of Xb, Xc, Xd and Xe are represented by General Formula (C). More preferably, Xc is represented by General Formula (C) and Ar in General Formula (C) represents a carbazolyl group which may have a substituent group.

Hereinbelow, specific examples of the compound represented by General Formula (B) that are preferably used as a host compound (also referred to as a luminescent host) of the light emitting layer of the organic EL element of the present invention are described. However, the present invention is not limited thereto.

1

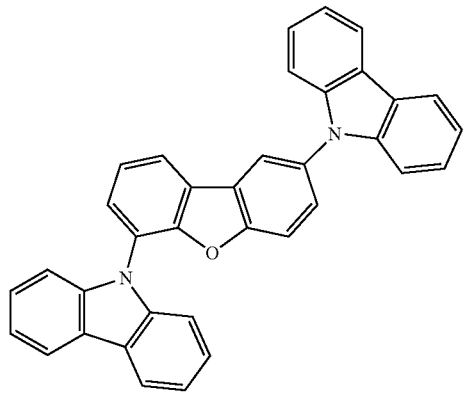

2

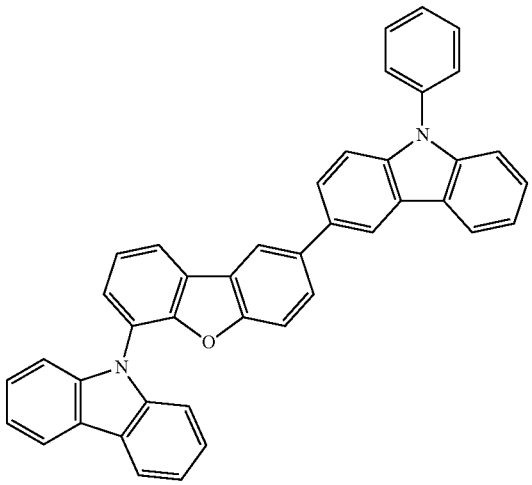

3

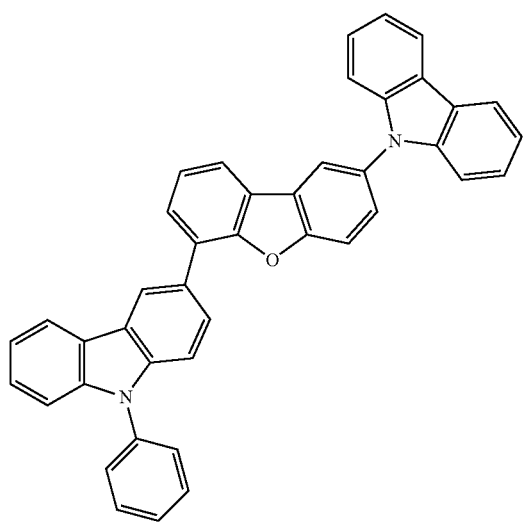

4

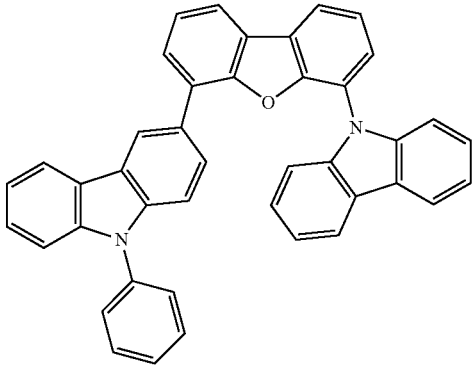

-continued
5
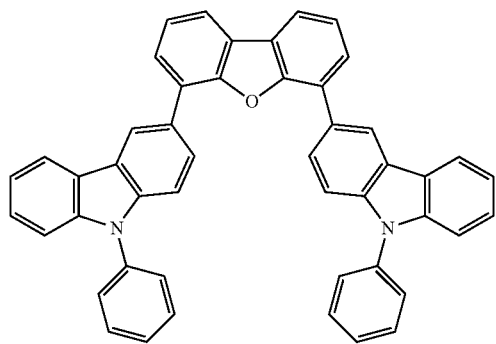
6
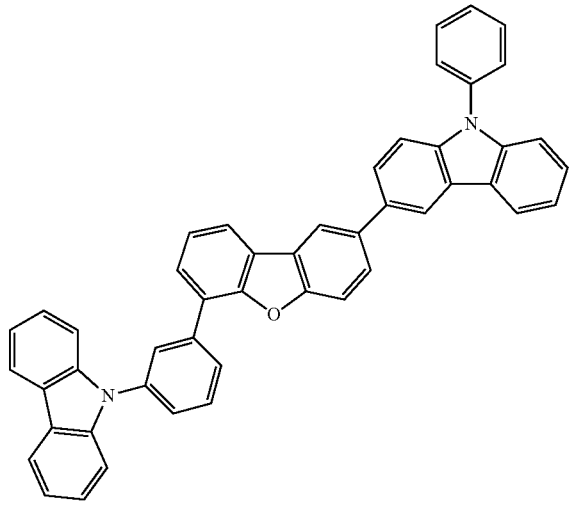
[Chemical Formula 33]
7
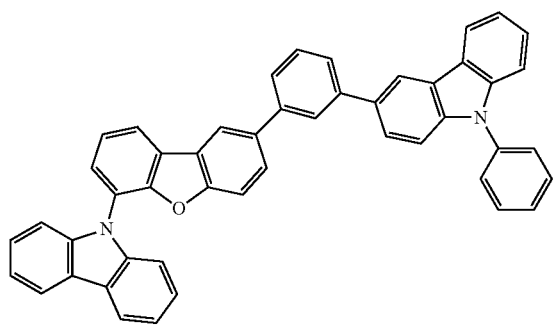
8
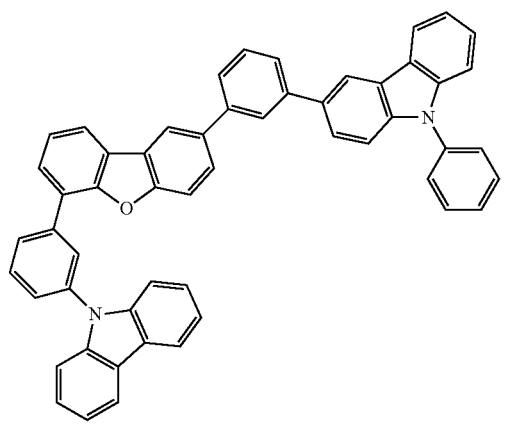
9
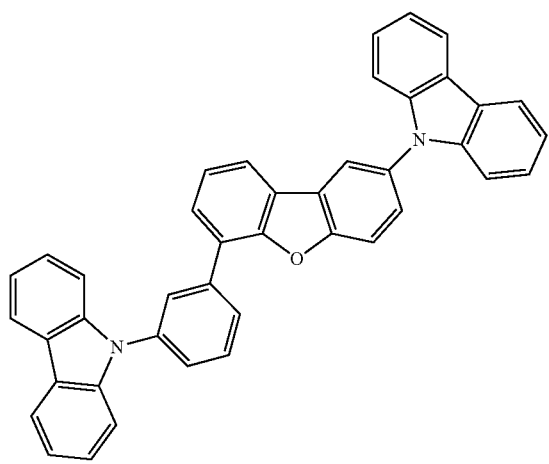
10
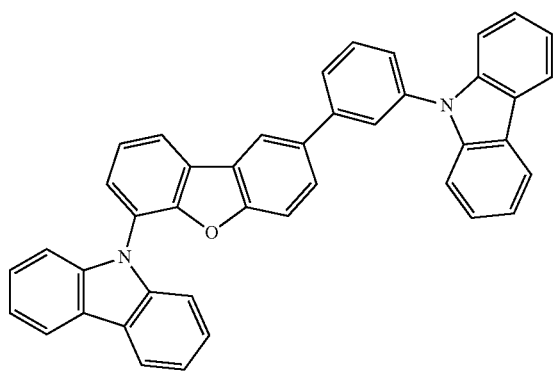

-continued
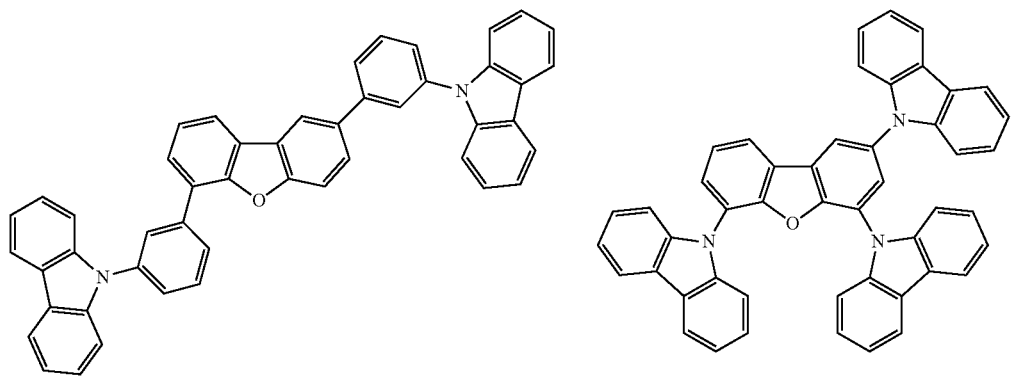
[Chemical Formula 34]
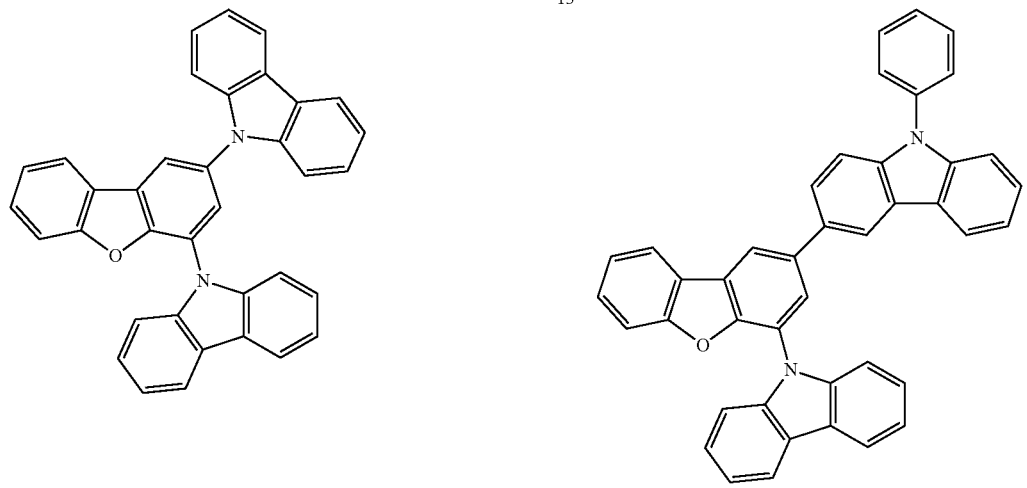
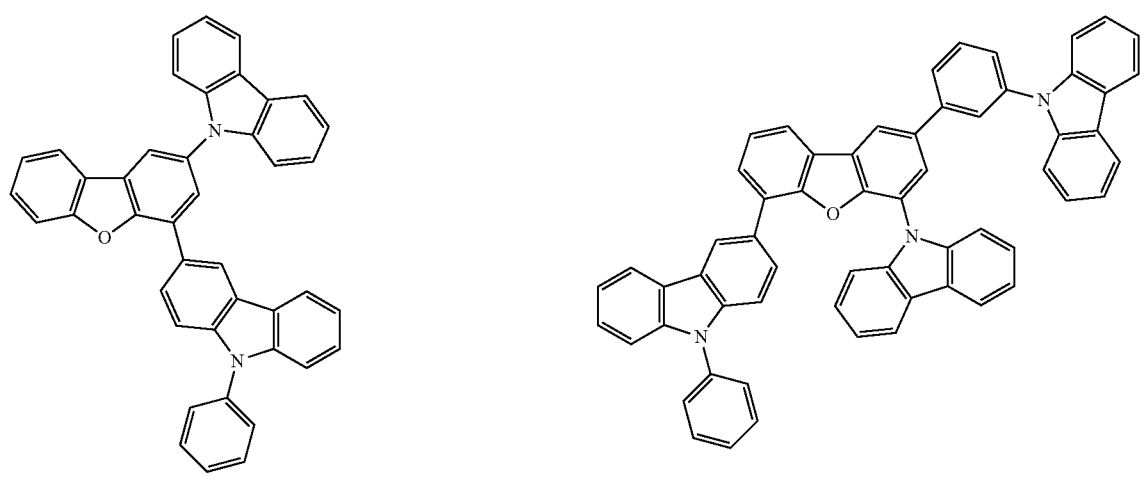

17
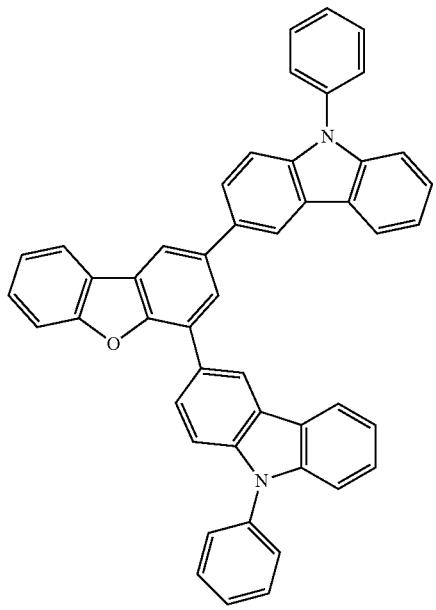
18
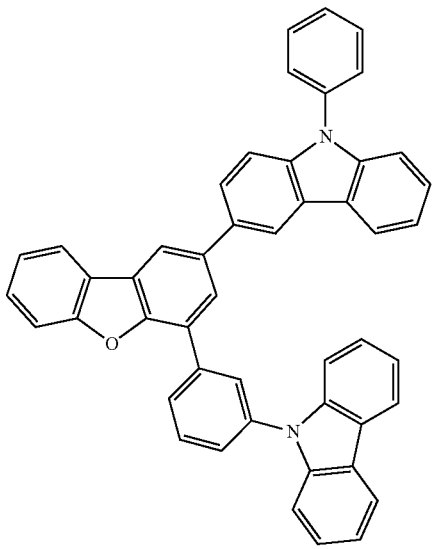
[Chemical Formula 35]
19
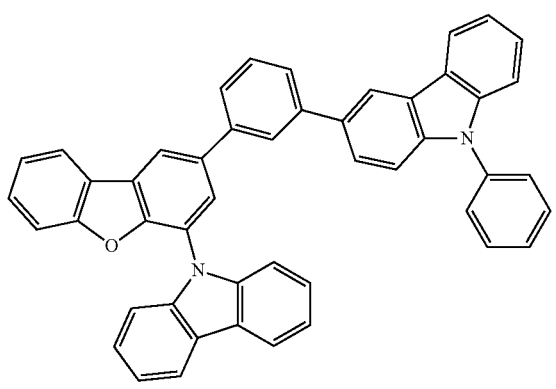
20
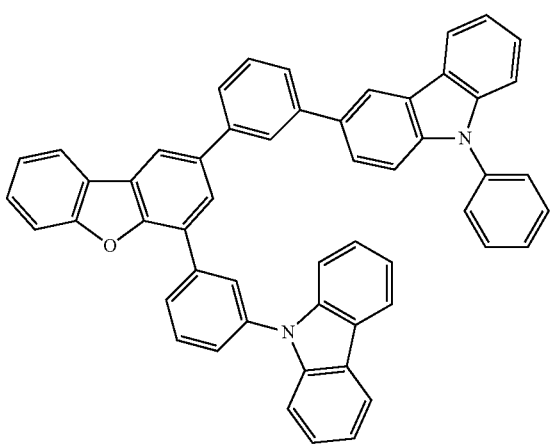
21
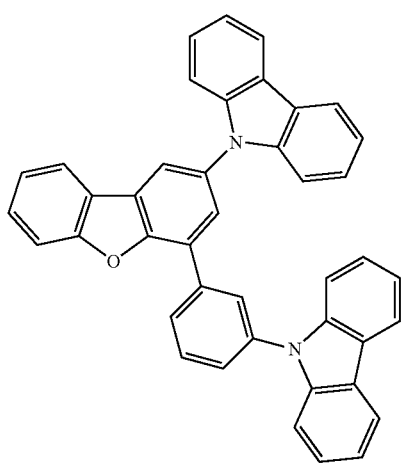
22
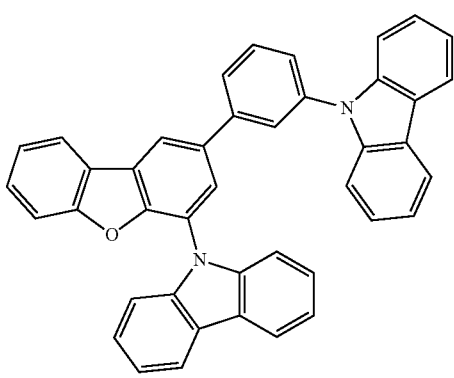

-continued
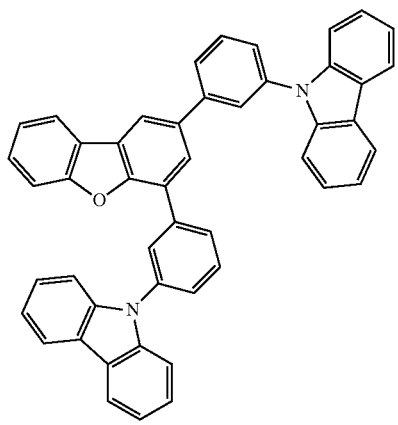
23
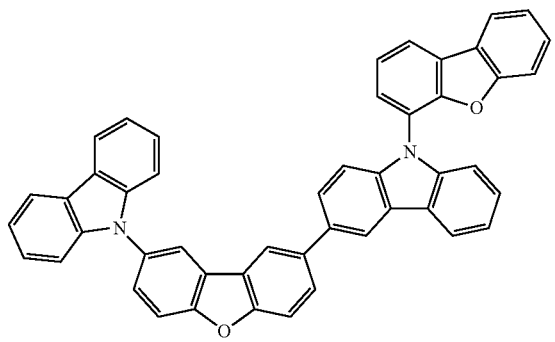
24
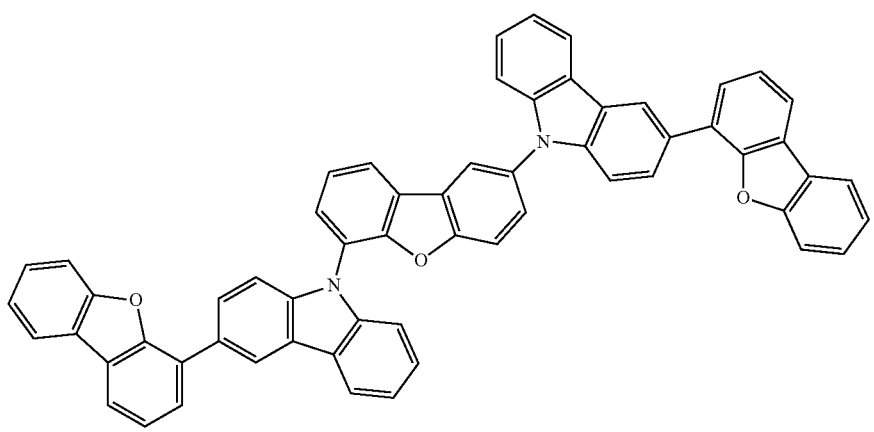
25
[Chemical Formula 36]
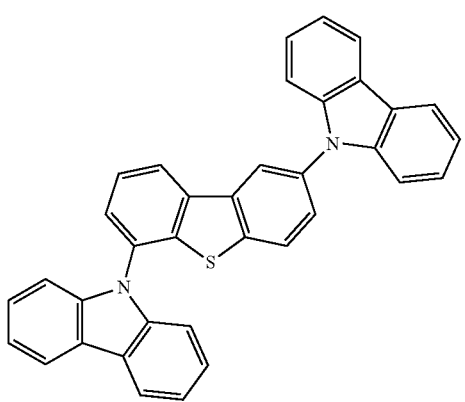
26

-continued
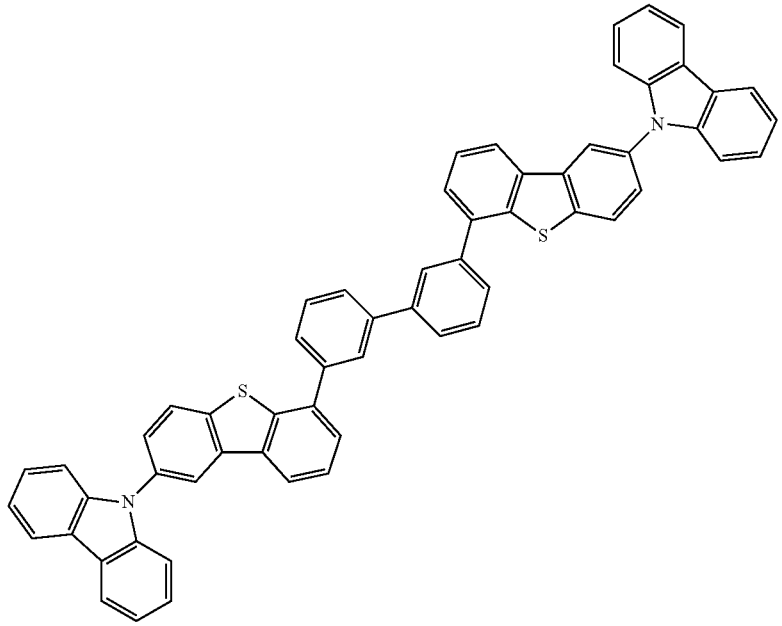
27
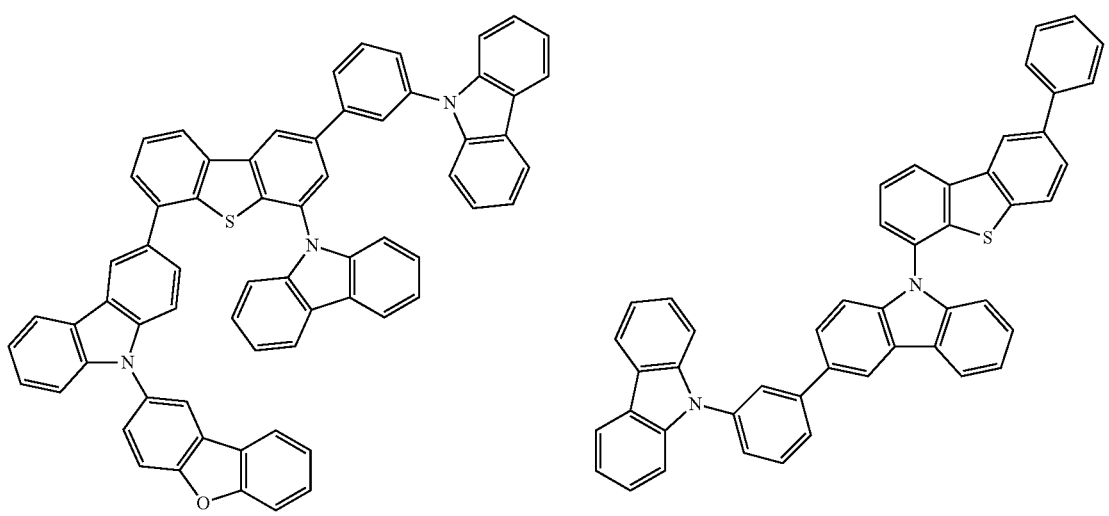
28
29
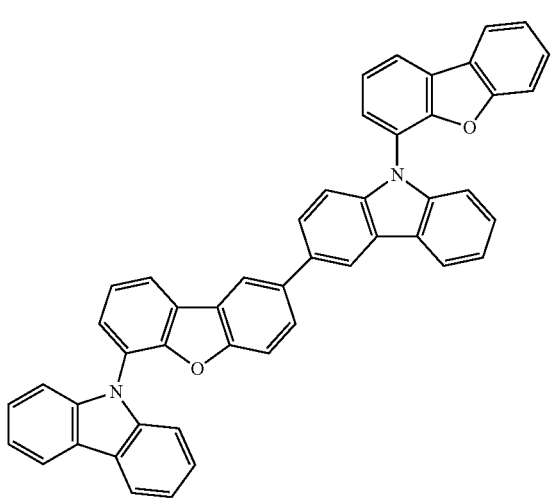
30

[Chemical Formula 37]
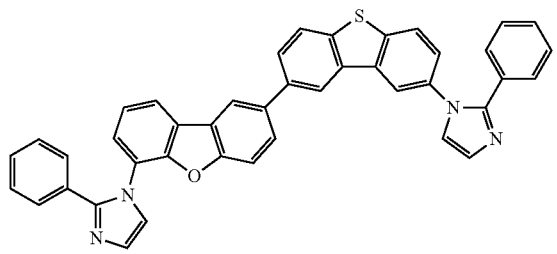
31
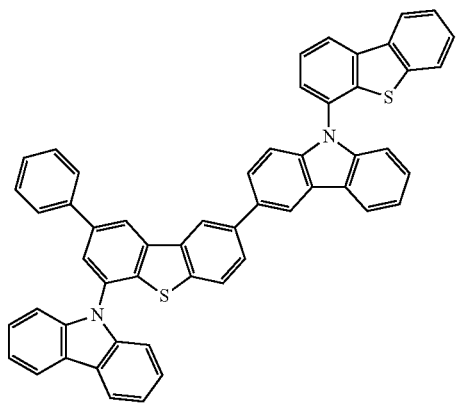
32
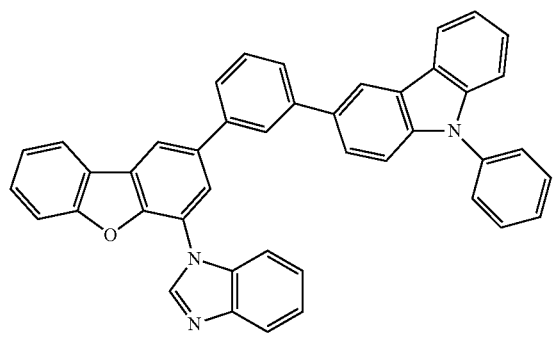
33
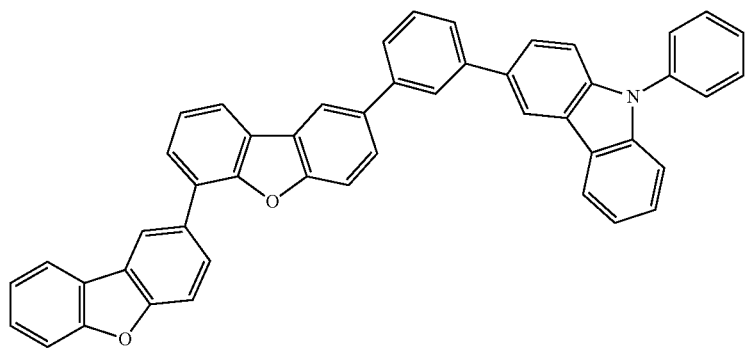
34

35
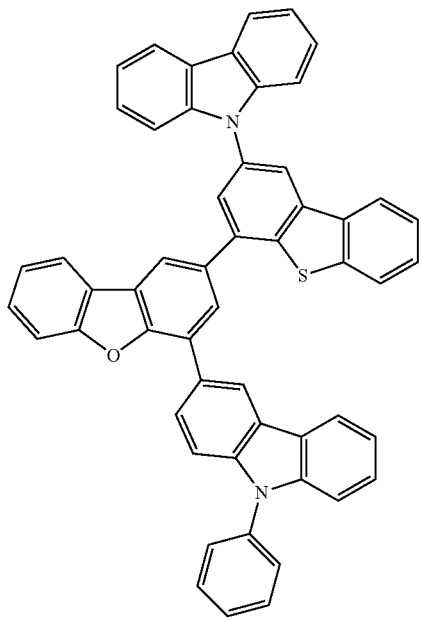
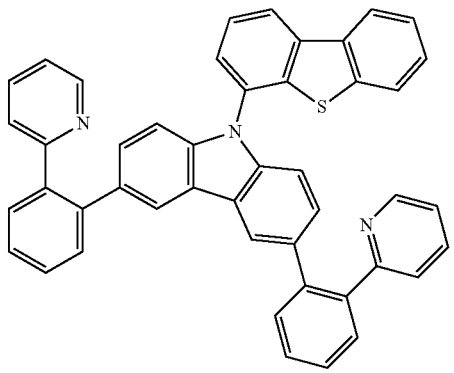
[Chemical Formula 38]
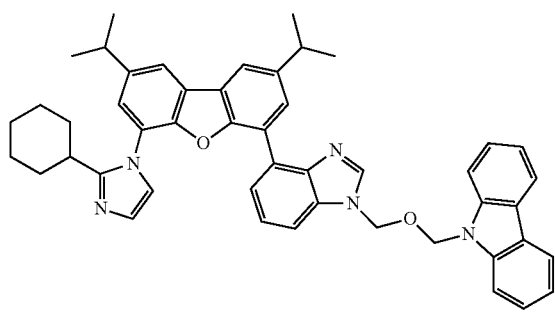
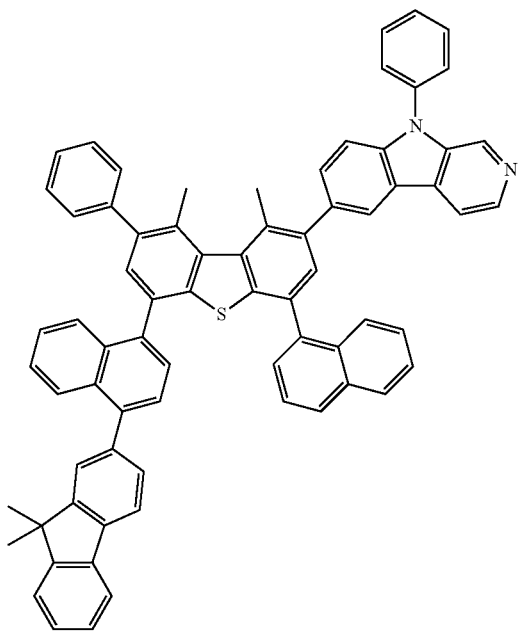

39
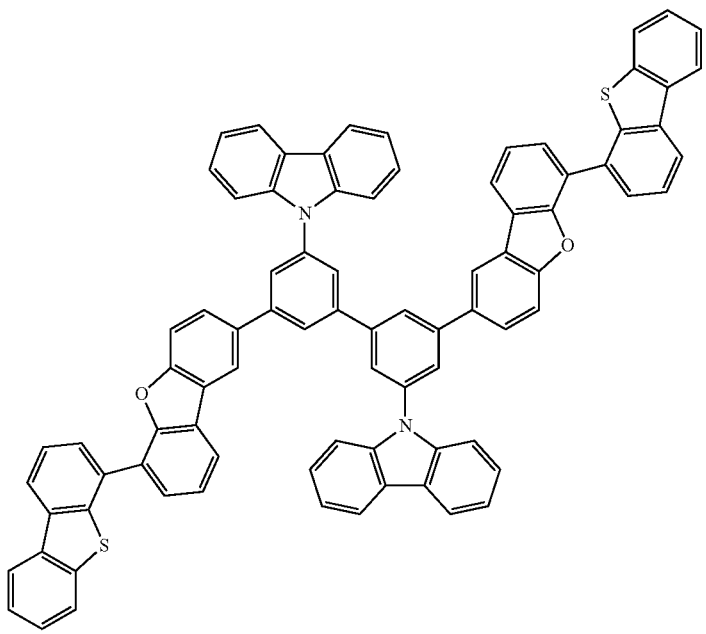
40
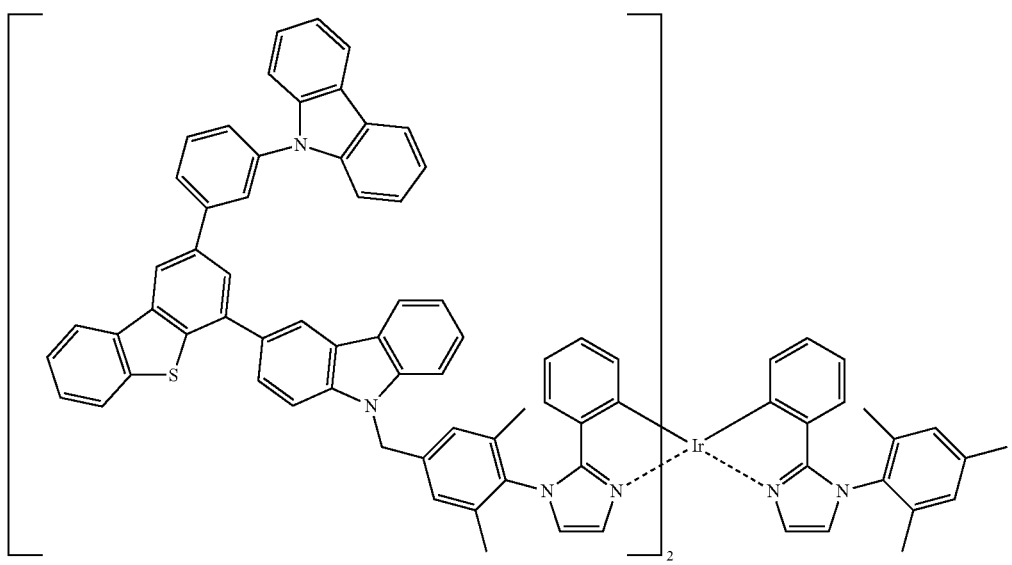

[Chemical Formula 39]
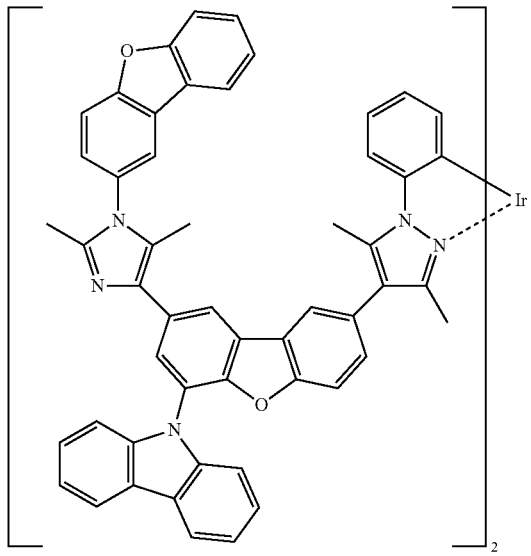
41
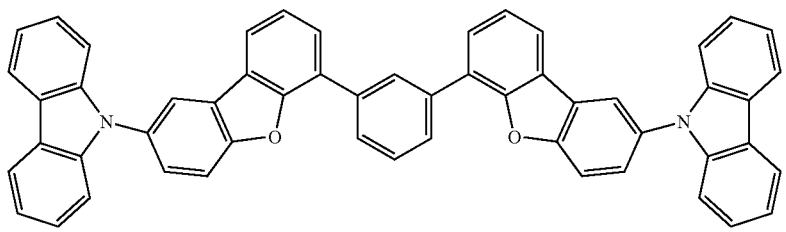
42
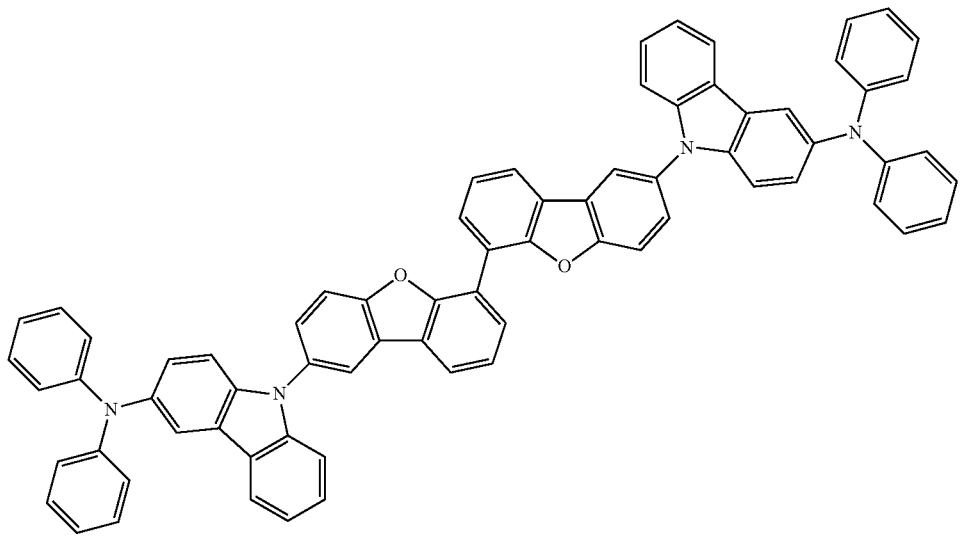
43

-continued
[Chemical Formula 40]
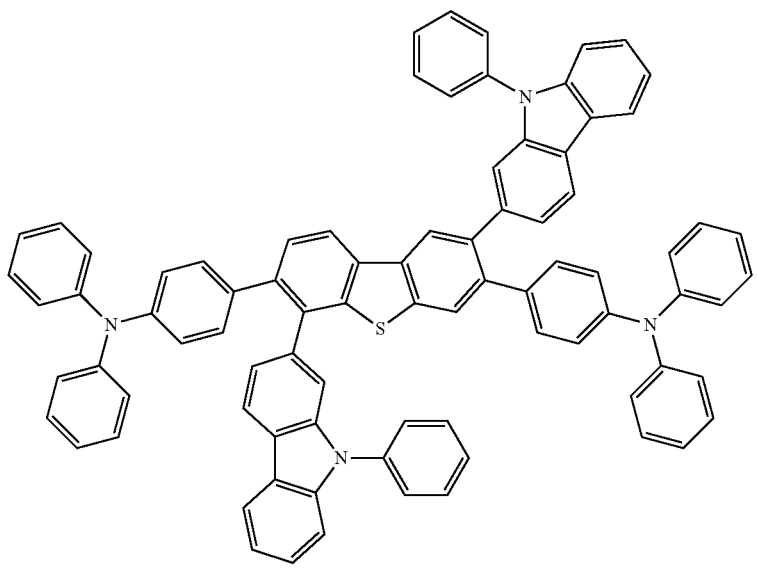
44
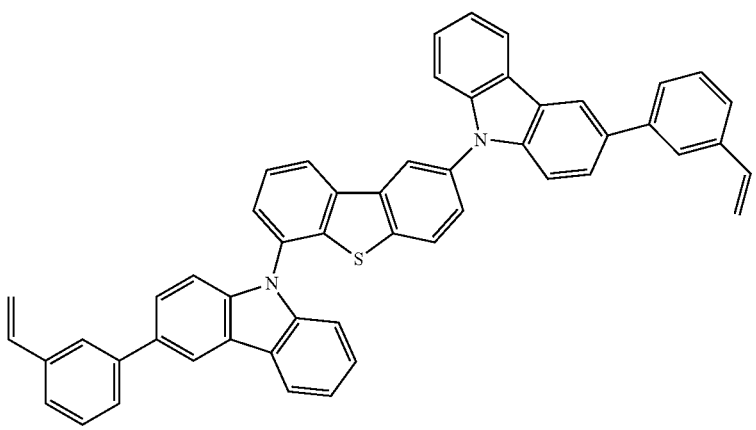
45
[Chemical Formula 41]
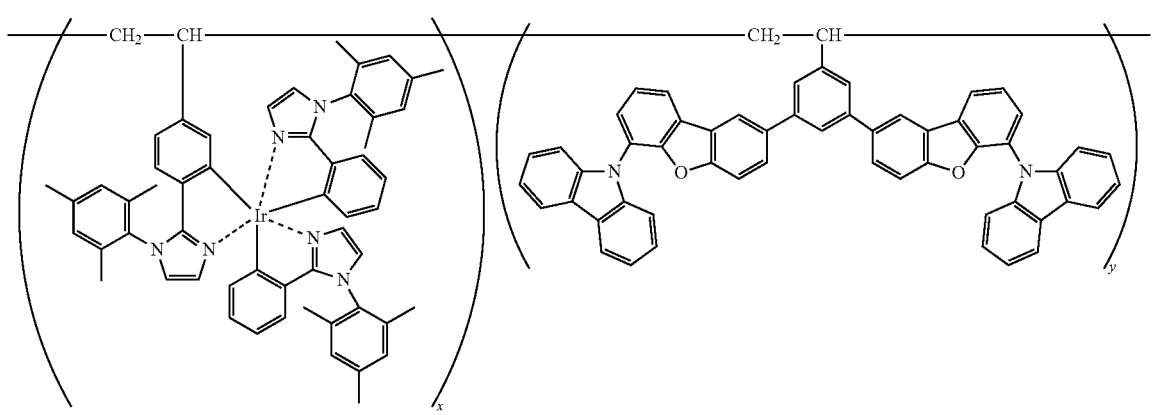
46
x:y = 1:10
random co-polymer

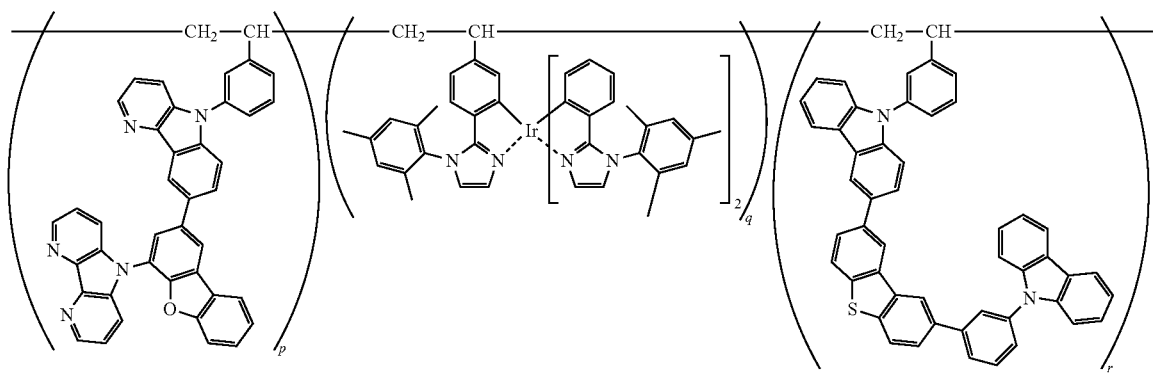
(Chemical Formula 42)
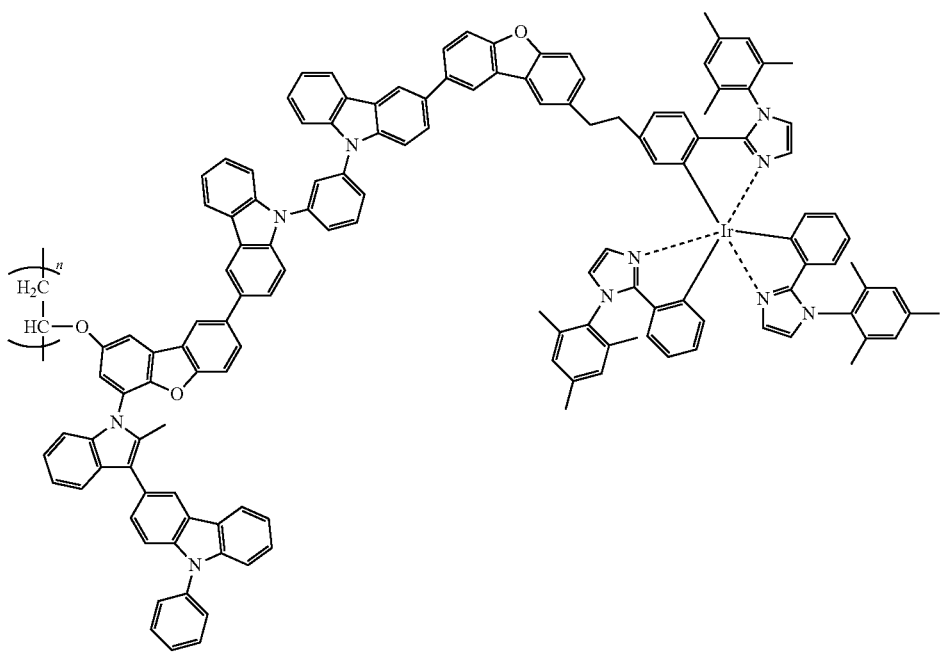
[Chemical Formula 43]
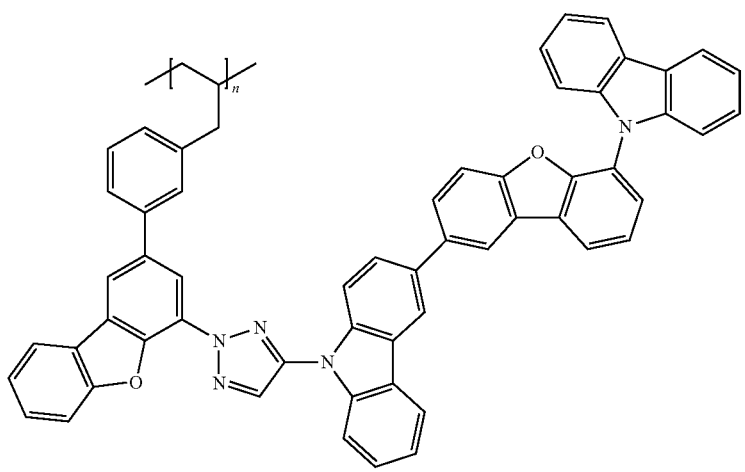

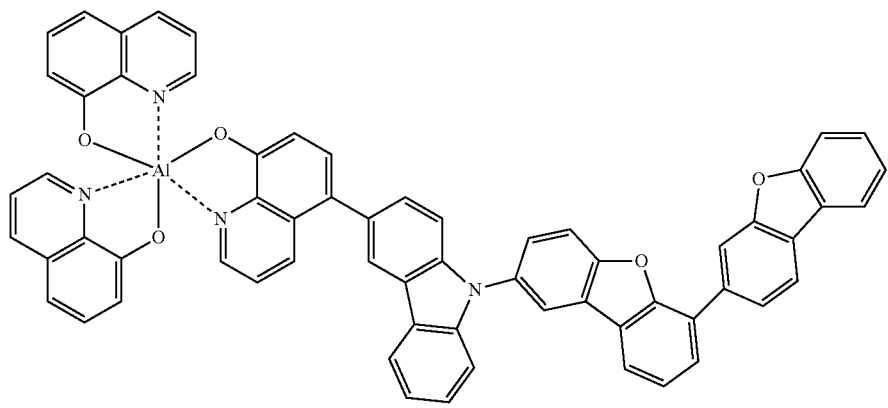
50
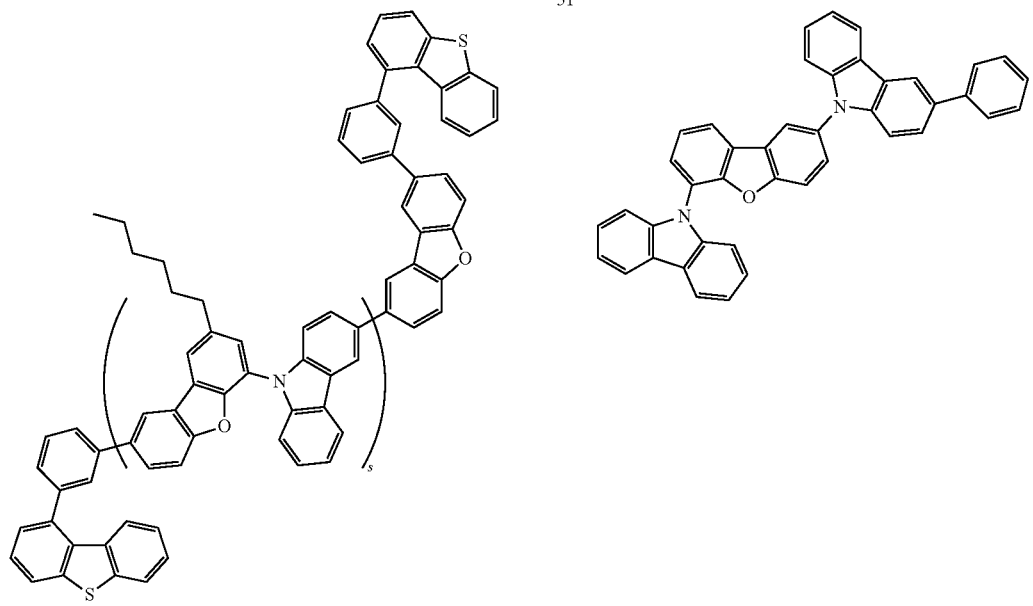
51
52
[Chemical Formula 44]
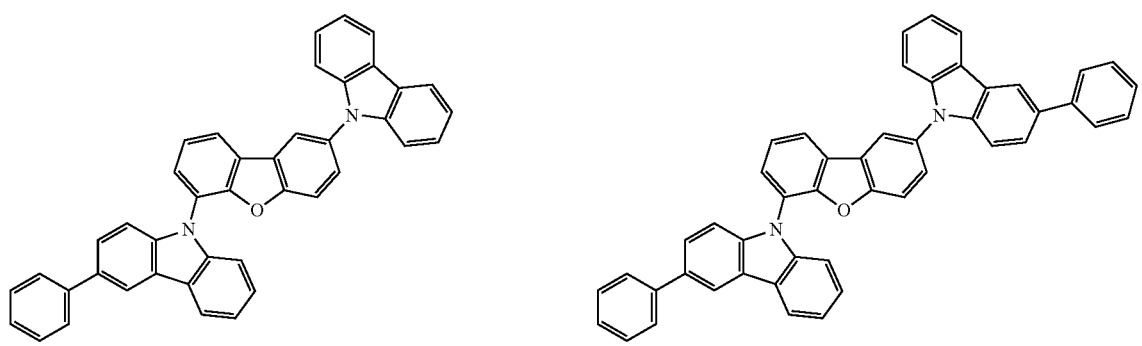
53
54

-continued
55
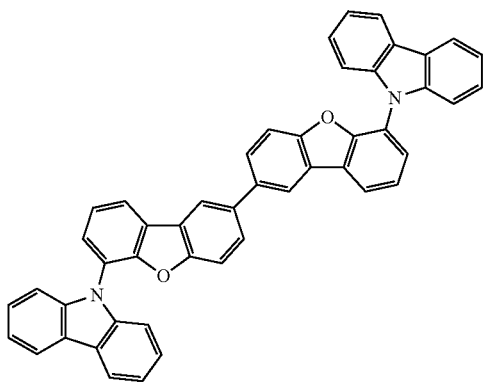
56
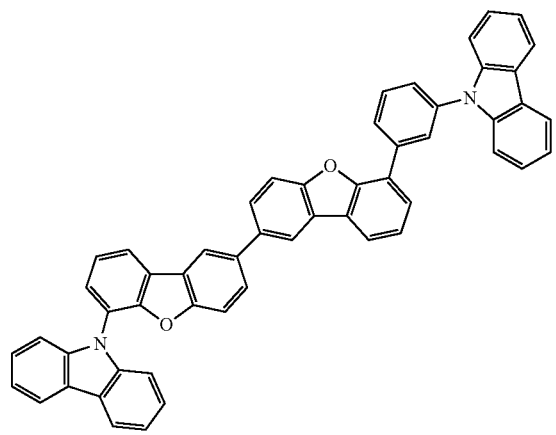
57
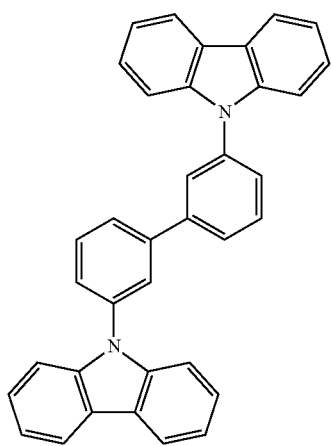
58
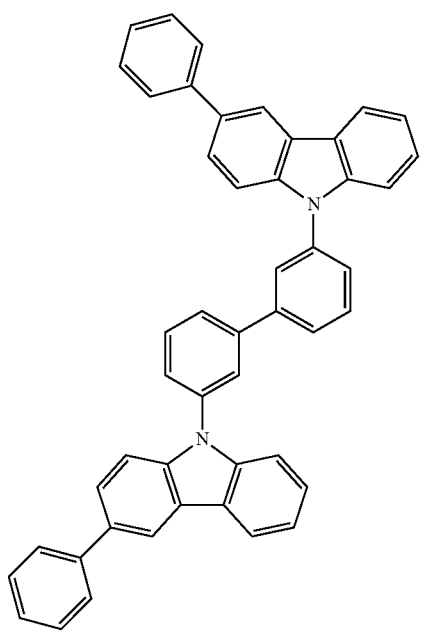
59
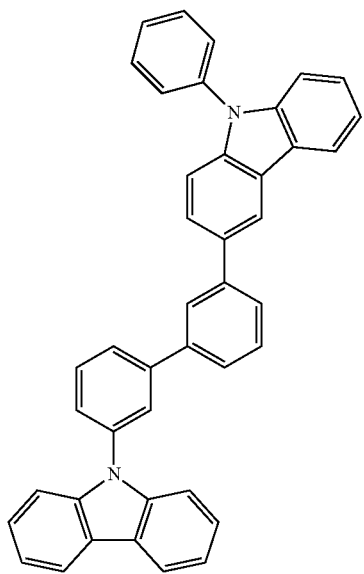

Furthermore, the compound represented by the following General Formula (B') is also particularly preferably used as a luminescent host of the light emitting layer of the organic EL element of the present invention.

[Chemical Formula 45]

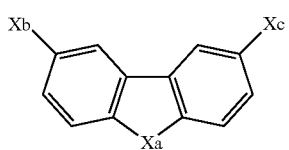

General Formula (B')

In General Formula (B'), Xa represents O or S, Xb and Xc each independently represent a substituent group or a group represented by the above General Formula (C).

At least one of Xb and Xc represents a group represented the above General Formula (C), and, in at least one of the groups represented by the above General Formula (C), Ar represents a carbazolyl group.

With regard to the compound represented by the above General Formula (B'), Ar in General Formula (C) preferably represents a carbazolyl group which may have a substituent group. More preferably, Ar in General Formula (C) may have a substituent group and also it represents a carbazolyl group linked at N position to $L_4$ of General Formula (C).

Specific examples of the compound, represented by General Formula (B'), which is preferably used as a host compound (also referred to as a luminescent host) of a light emitting layer of the organic EL element of the present invention include OC-9, OC-11, OC-12, OC-14, OC-18, OC-29, OC-30, OC-31, and OC-32 that have been mentioned above as a specific example of those used as a luminescent host. However, the present invention is not limited thereto.

«Electron Transport Layer»

The electron transport layer is composed of a material having electron transportability, and the electron injection layer and the hole blocking layer are also included in the electron transport layer in a broad sense. The electron transport layer may be formed as a monolayer or a multi-layer.

The electron transport layer may have a function of delivering electrons injected from a negative electrode to a light emitting layer. As for the materials for constituting an electron transport layer, any material can be selected from conventionally known compounds and used in combination.

Examples of the conventionally known materials that are used for an electron transport layer (hereinafter, referred to as electron transport material) include nitro-substituted fluorene derivatives, diphenylquinone derivatives, thiopyran dioxide derivatives, polycyclic aromatic hydrocarbons such as naphthalene perylene, heterocyclic tetracarboxylic anhydride, carbodiimide, fluolenylidenemethane derivatives, anthraquinodimethane and anthrone derivatives, oxadiazole derivatives, carboline derivatives, derivatives with a ring structure in which at least one carbon atom of the hydrocarbon ring constituting carboline ring of the carboline derivatives is substituted with a nitrogen atom, and hexaazatriphenylene derivatives.

Furthermore, thiadiazole derivatives in which oxygen atoms of the oxadiazole rings of the oxadiazole derivatives mentioned above are substituted with sulfur atoms and quinoxaline derivatives having quinoxaline rings known as electron withdrawing groups can be also used as the electron transport materials.

Polymer materials having these materials introduced into the polymer chains or having the materials as main polymer chains can also be used.

Examples of the usable electron transport material include metal complexes of 8-quinolinol derivatives, such as aluminum tris(8-quinolinol) (Alq), aluminum tris(5,7-dichloro-8-quinolinol), aluminum tris(5,7-dibromo-8-quinolinol), aluminum tris(2-methyl-8-quinolinol), aluminum tris(5-methyl-8-quinolinol), and zinc bis(8-quinolinol) (Znq), and metal complexes in which the central metals of the metal complexes mentioned above are replaced with In, Mg, Cu, Ca, Sn, Ga, or Pb.

In addition, the usable electron transport material may be a metal-free or metal-containing phthalocyanine or its terminal having an end substituted by an alkyl group or sulfonate group, for example.

Furthermore, an inorganic semiconductor such as n-type Si or n-type SiC can be also used as an electron transport material.

The electron transport layer is preferably produced by forming the electron transport material in a thin film based on, for example, a vacuum deposition or a wet method (also referred to as wet process, and examples thereof include spin coating, casting, die coating, blade coating, roll coating, ink jetting, printing, spray coating, curtain coating, or Langmuir Blodgett method (LB deposition)).

The film thickness of the electron transport layer is not particularly limited. However, it is usually about 5 nm to 5000 nm and preferably 5 nm to 200 nm. The electron transport layer may have a monolayer constitution composed of one or two or more of the materials mentioned above.

Furthermore, it may be used after doping with an n-type dopant like a metal compound including a metal complex and a metal halide.

Hereinbelow, specific examples of the conventionally known compounds that are preferably used for forming an electron transport layer of the organic EL element of the present invention are described. However, the present invention is not limited thereto.

[Chemical Formula 46]
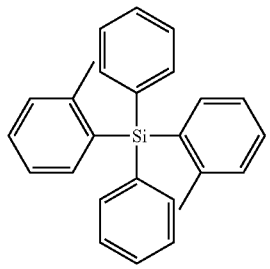
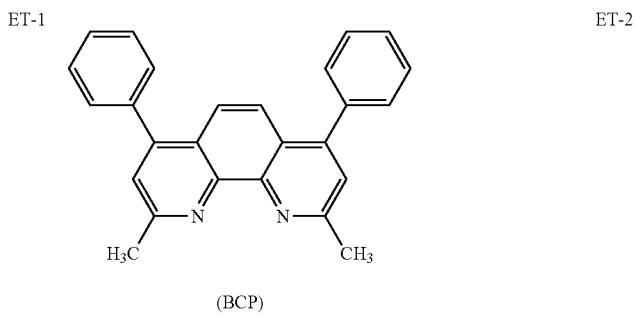
ET-1    ET-2
(BCP)
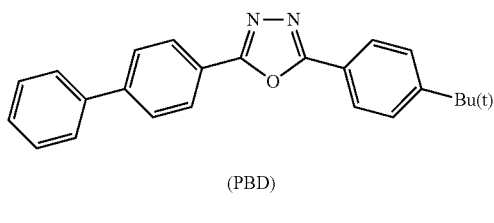
ET-3
(PBD)
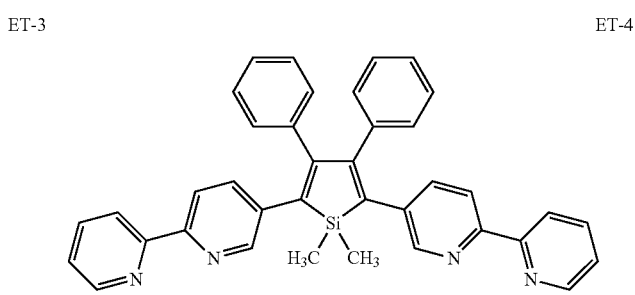
ET-4
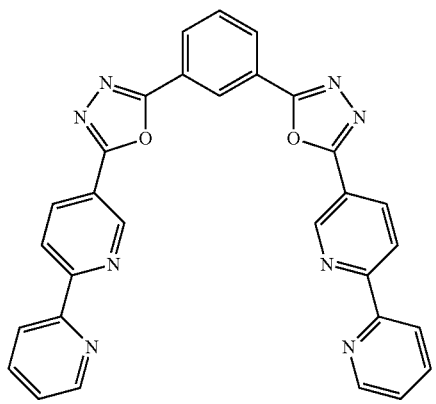
ET-5
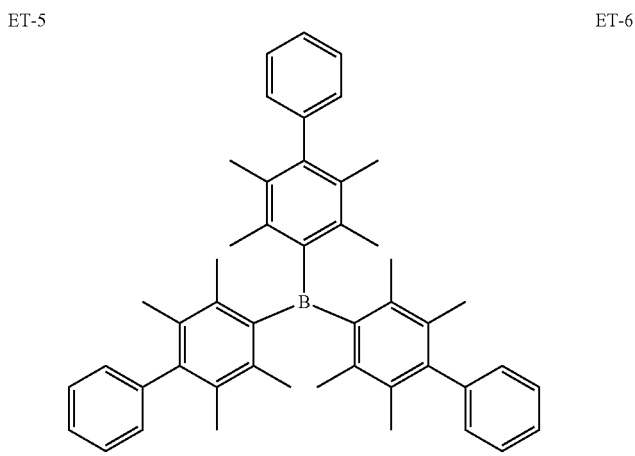
ET-6
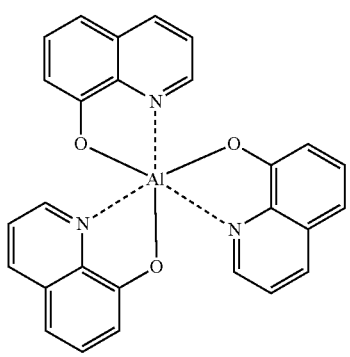
ET-7
(Alq₃)
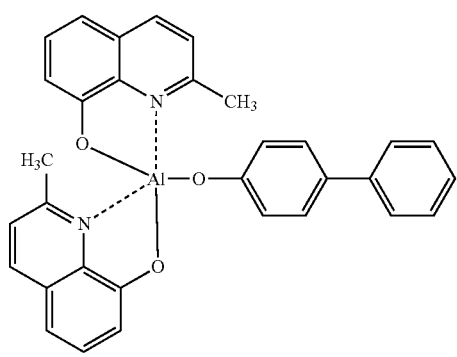
ET-8
(BAlq)

[Chemical Formula 47]
ET-9
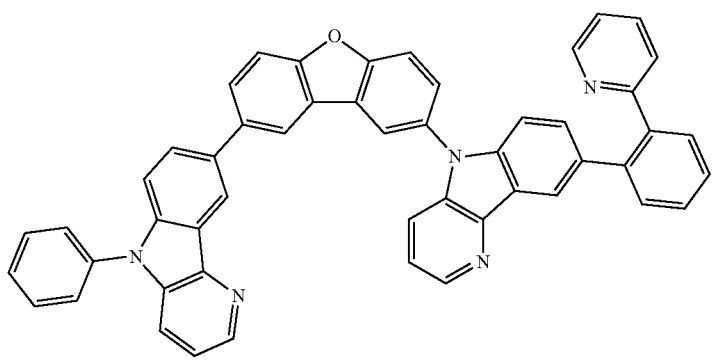
ET-10
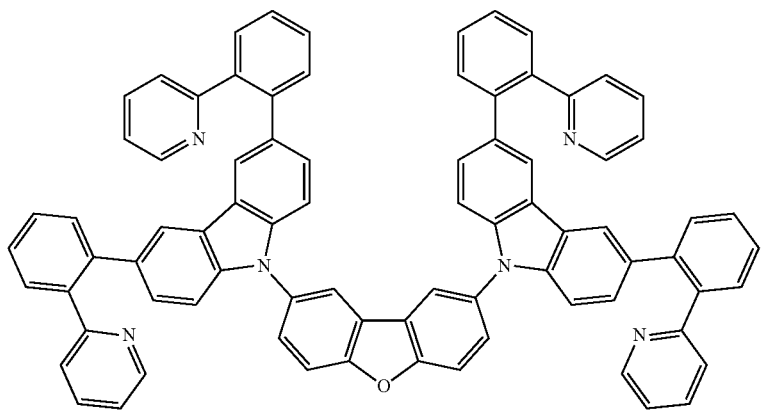
ET-11
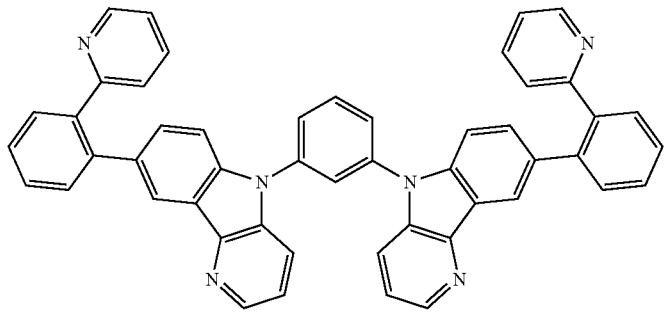
[Chemical Formula 48]
ET-12
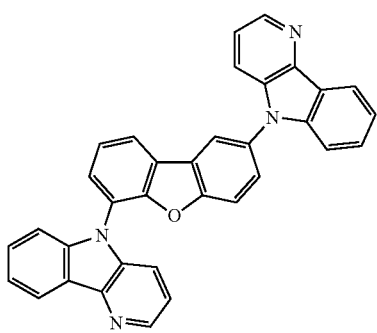
ET-13
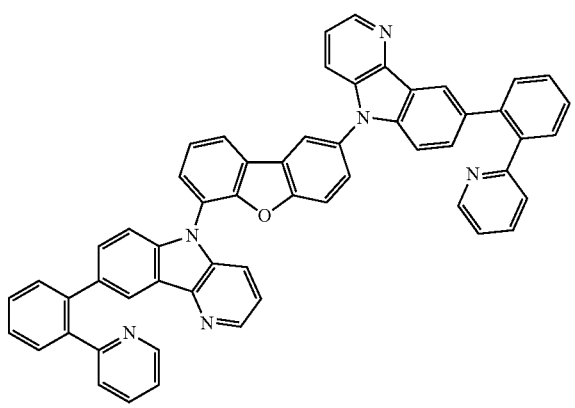

ET-14
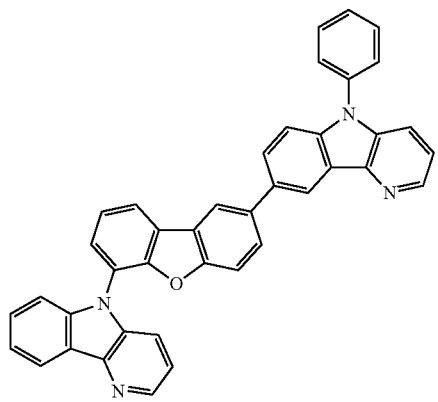
ET-15
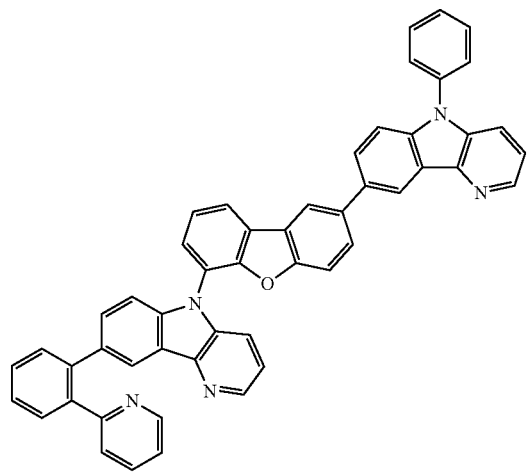
ET-16
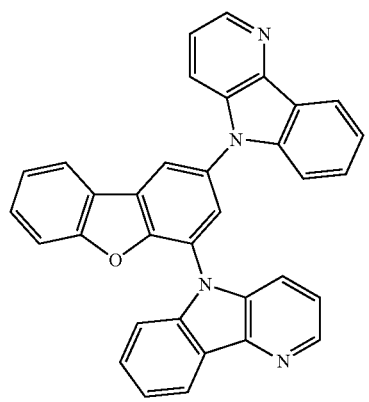
ET-17
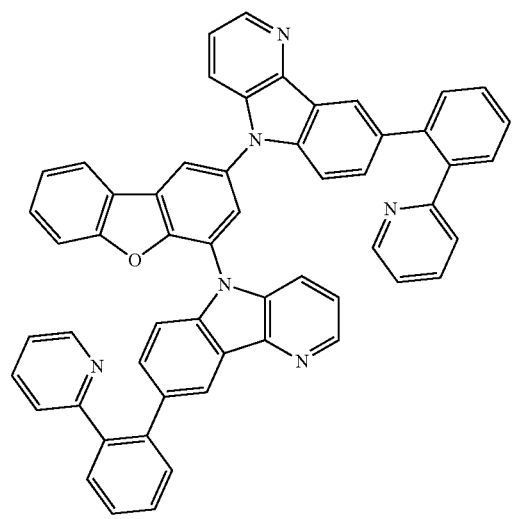
[Chemical Formula 49]
ET-18
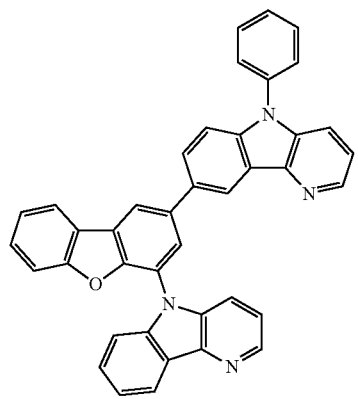
ET-19
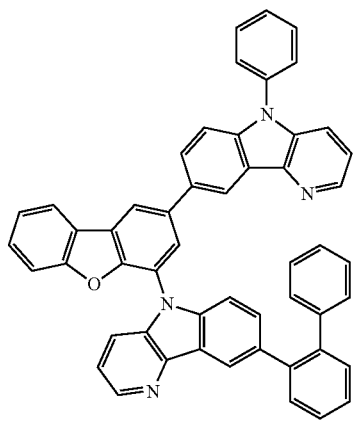

-continued
ET-20
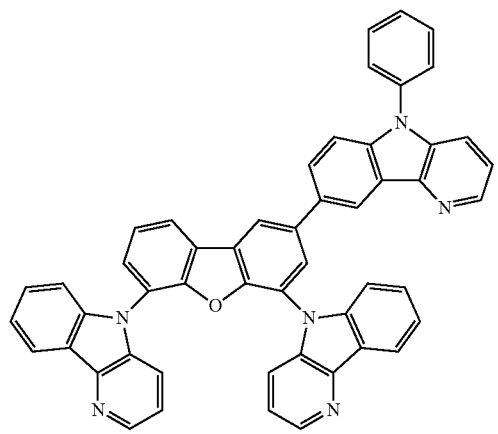
ET-21
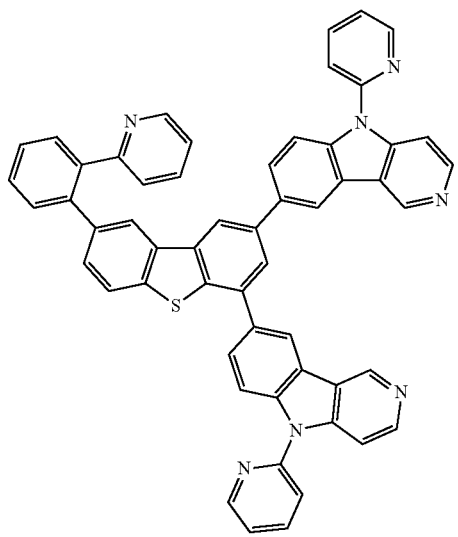
ET-22
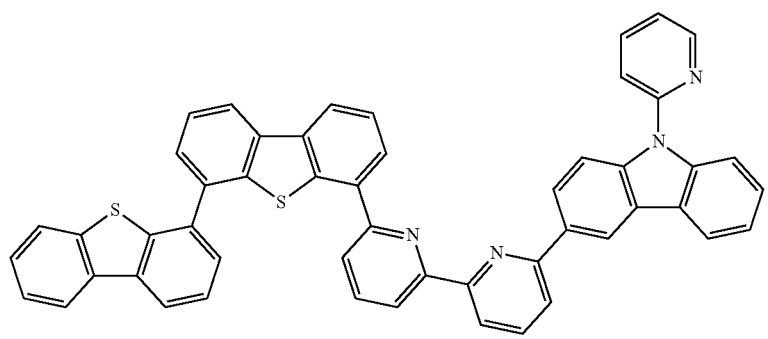
[Chemical Formula 50]
ET-23
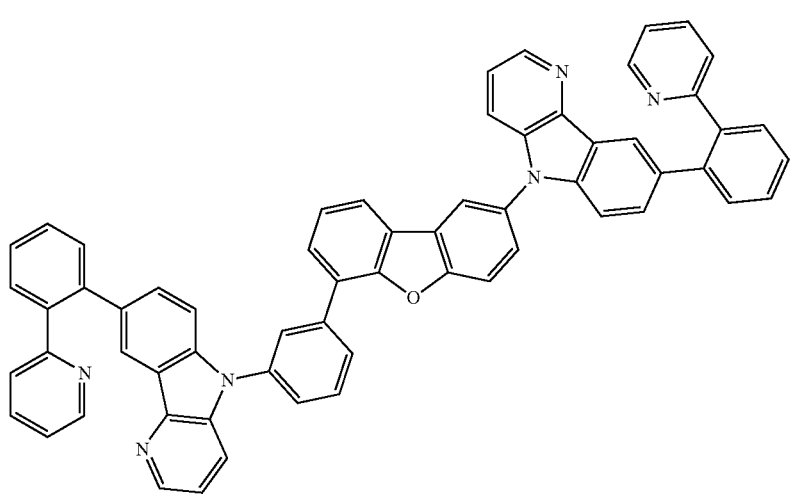

ET-24
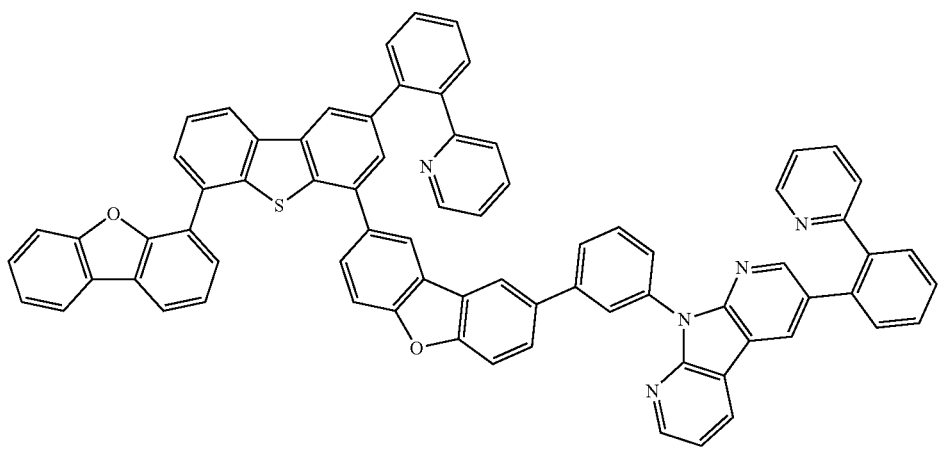
ET-25
ET-26
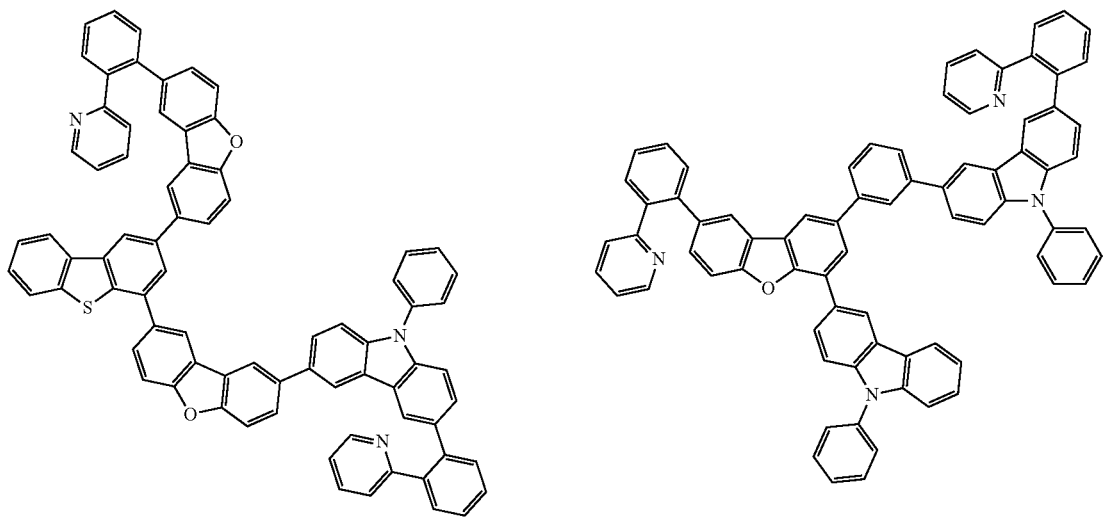
ET-27
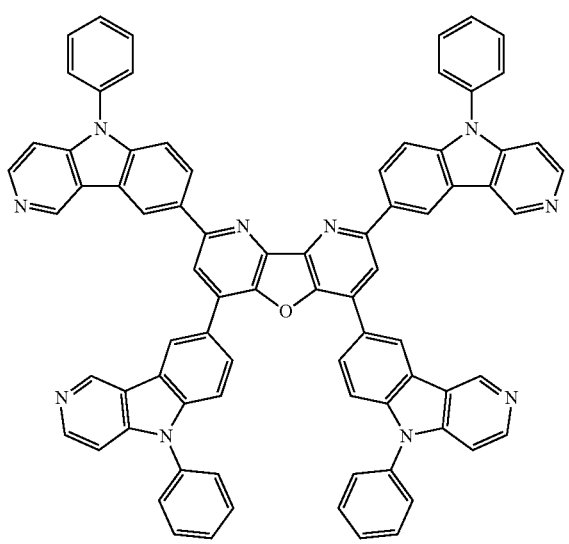

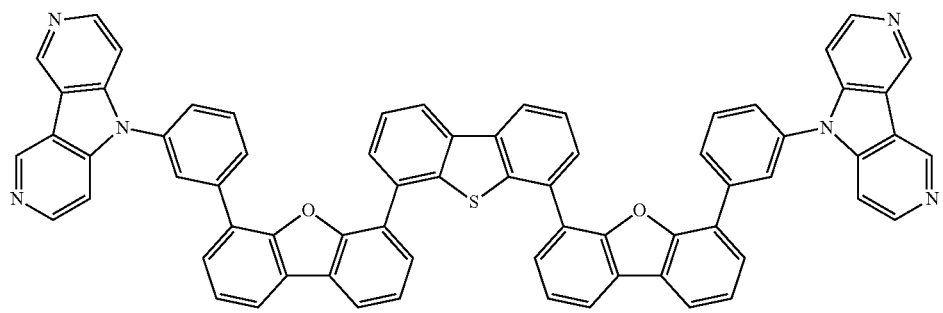
ET-28
[Chemical Formula 52]
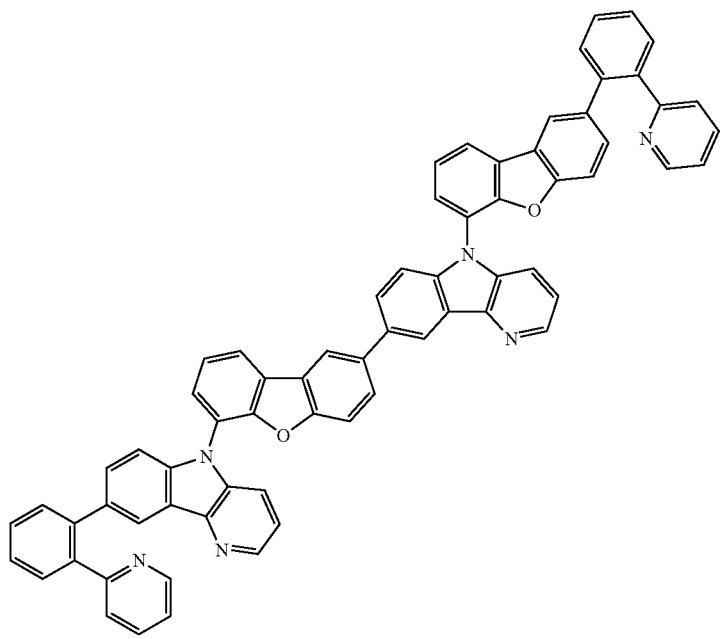
ET-29
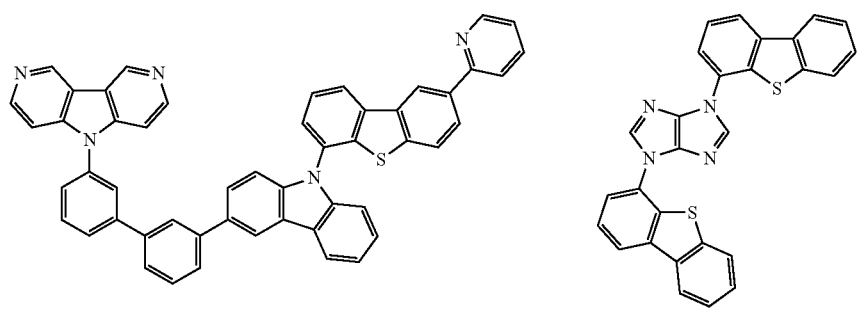
ET-30
ET-31

ET-32 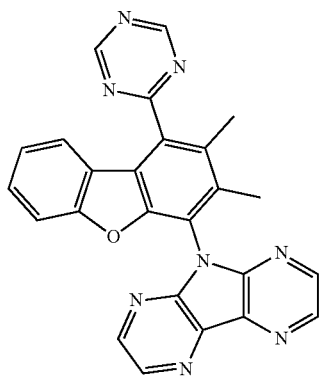
ET-33 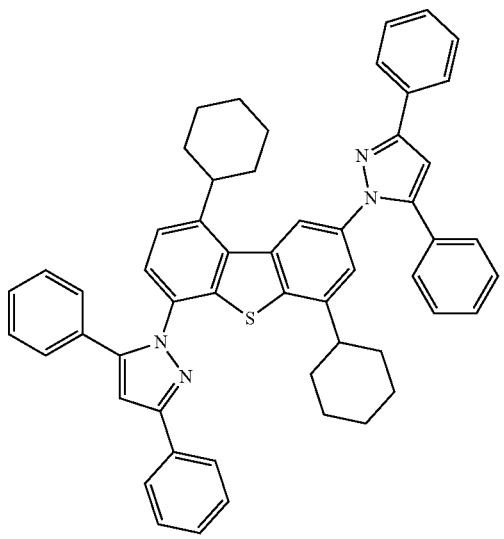
[Chemical Formula 53]
ET-34 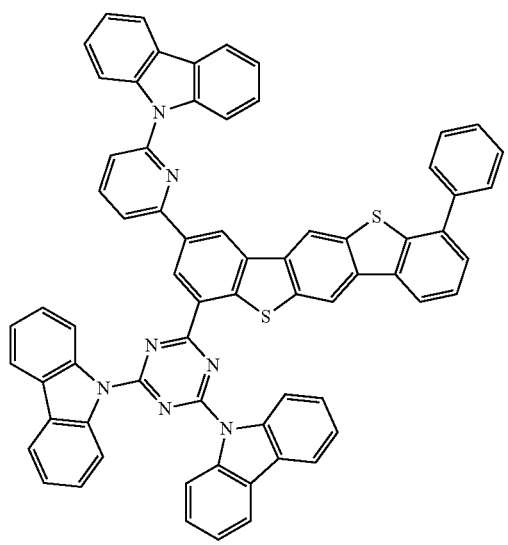
ET-35 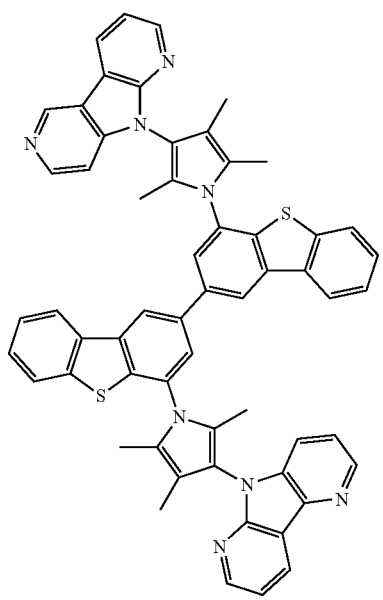
ET-36 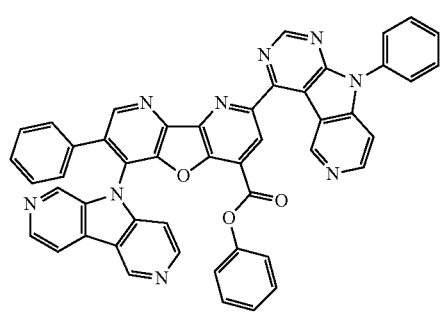
ET-37 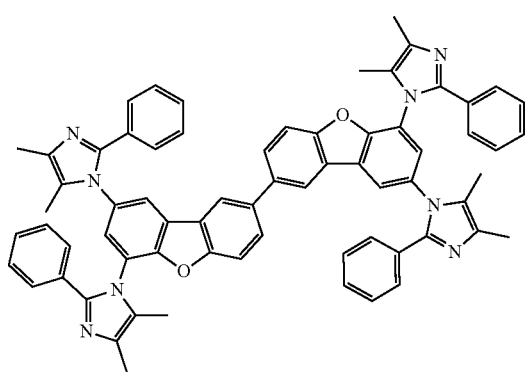

[Chemical Formula 54]
ET-38
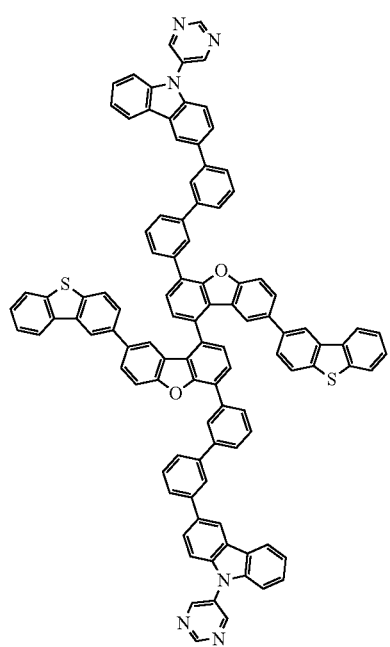
ET-39
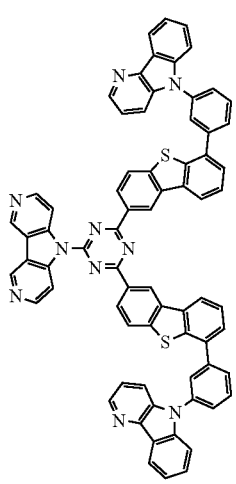
[Chemical Formula 55]
ET-40
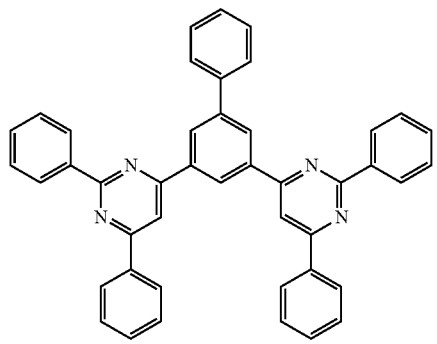
ET-41
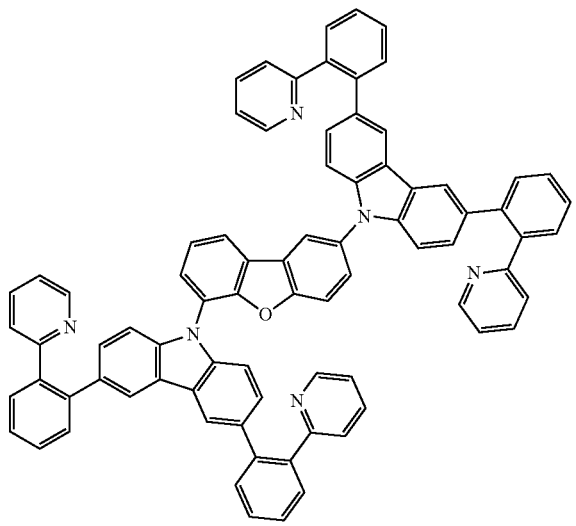

-continued

ET-42

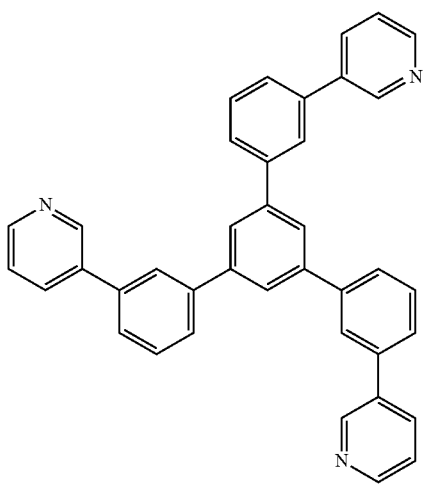

ET-43

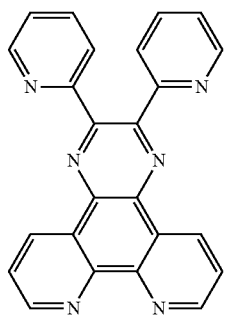

«Negative Electrode»

Meanwhile, as for the negative electrode, an electrode having an electrode material such as a metal having a low work function (not higher than 4 eV) (referred to as electron-injecting metal), alloy, or electroconductive compound, or a mixture thereof is used. Specific examples of the electrode material include sodium, sodium-potassium alloys, magnesium, lithium, a mixture of magnesium and copper, a mixture of magnesium and silver, a mixture of magnesium and aluminum, a mixture of magnesium and indium, a mixture of aluminum and aluminum oxide ($Al_2O_3$), indium, a mixture of lithium and aluminum, and rare-earth metals. Among them, from the viewpoint of the electron injectability and resistance to oxidation, preferred are mixtures of an electron-injecting metal and a second metal having a work function higher than that of the electron-injecting metal and being stable, such as mixtures of magnesium and silver, mixtures of magnesium and aluminum, mixtures of magnesium and indium, mixtures of aluminum and aluminum oxide ($Al_2O_3$), mixtures of lithium and aluminum, and aluminum.

The negative electrode can be produced by forming a thin film from the electrode material by a method, such as deposition or sputtering. Furthermore, the negative electrode preferably has a sheet resistance of several hundred Ω/or less and a thickness in a range of usually 10 nm to 5 μm and preferably 50 nm to 200 nm.

If either the positive electrode or the negative electrode of the organic EL element is transparent or semi-transparent for transmitting emitted light, the light emitting luminance is enhanced, and therefore desirable.

A transparent or semi-transparent negative electrode can be produced by forming a film having a thickness of 1 nm to 20 nm from the metal mentioned above and then forming a layer of an electroconductive transparent material exemplified below for the description of the positive electrode on the metal film. This process can be applied to produce an element having a transparent positive electrode and a transparent negative electrode.

«Injection Layer: Hole Injection Layer (Positive Electrode Buffer Layer), Electron Injection Layer (Negative Electrode Buffer Layer)»

Injection layer is a layer which is formed, if required, and it includes a hole injection layer and an electron injection layer. The electron injection layer may be present between the positive electrode and the hole transport layer or between the negative electrode and the electron transport layer, as shown in the layer constitution described above. Alternatively, it may be present between the positive electrode and the light emitting layer or between the negative electrode and the light emitting layer.

The Injection layer is provided between the electrode and an organic layer in order to reduce the driving voltage or to improve the luminance and is described in detail in "Electrode material", Div. 2 Chapter 2 (pages 123 to 166) of "Organic EL element and its frontier of industrialization" (published by N.T.S Corporation, Nov. 30, 1998). It includes a hole injection layer (positive electrode buffer layer) or an electron injection layer (negative electrode buffer layer).

The positive electrode buffer layer (hole injection layer) is also described in detail in JP 9-45479 A, JP 9-260062 A, and JP 8-288069 A for example, and specific examples thereof include phthalocyanine buffer layers represented by a copper phthalocyanine layer; hezaazatriphenylene derivative buffer layer described in JP 2003-519432 W or JP 2006-135145 A; oxide buffer layers represented by a vanadium oxide layer; amorphous carbon buffer layers; polymer buffer layers containing electroconductive polymers represented by polyaniline (emeraldine) or polythiophene; and ortho-metalated complex layers represented by a tris(2-phenylpyridine) iridium complex layer.

The negative electrode buffer layer (electron injection layer) is also described in detail in JP 6-325871 A, JP 9-17574 A, and JP 10-74586 A for example, and examples thereof include metal buffer layers represented by a strontium or aluminum; alkali metal compound buffer layers represented by lithium fluoride or potassium fluoride; alkali earth metal compound buffer layers represented by magnesium fluoride or cesium fluoride; and oxide buffer layers represented by aluminum oxide. The buffer layer (injection layer) is desirably an extremely thin layer, and preferably has a film thickness in a range of 0.1 nm to 5 μm, although it may vary depending on the material.

«Blocking Layer: Hole Blocking Layer, Electron Blocking Layer»

The blocking layer is optionally provided in addition to the fundamental structural layer of the organic compound thin film as described above. The blocking layer is, for example, a hole blocking layer described in JP 11-204258 A and JP 11-204359 A and on page 237 of "Organic EL element and its frontier of industrialization" (published by N.T.S Corporation, Nov. 30, 1998), for example.

The hole blocking layer functions as an electron transport layer in a broad sense and is composed of a material having electron transportability but extremely poor hole transportability and can increase the probability of recombination of electrons and holes by transporting electrons and blocking holes.

The constitution of an electron transport layer described above can be optionally used as a hole blocking layer, if required.

The hole blocking layer of the organic EL element of the present invention is preferably formed adjacent to the light emitting layer.

The hole blocking layer preferably contains a nitrogen-containing compound, such as a carbazole derivative, a carboline derivative, a diazacarbazole derivative (herein, the diazacarbazole derivative is a compound having at least one nitrogen atom substituted for any of the carbon atoms constituting the carboline ring), which have been mentioned above as a host compound.

In the present invention, when a plurality of light emitting layers emitting lights of different colors are included, a light emitting layer with shortest maximum light emission wavelength (that is, shortest wavelength layer) among the light emitting layers is preferably disposed closest to the positive electrode. In such a case, an additional hole blocking layer is preferably disposed between the shortest wavelength layer and a light emitting layer second closest to the positive electrode. Furthermore, at least 50% by mass of the compounds contained in the hole blocking layer disposed at the position described above preferably has an ionization potential that is at least 0.3 eV higher than that of the host compound contained in the shortest wavelength light emitting layer.

The ionization potential is defined by the energy necessary for releasing an electron in the highest occupied molecular orbital (HOMO) level of a compound to the vacuum level and can be determined, for example, as follows.

(1) The ionization potential can be determined with molecular orbital calculation software, Gaussian 98 (Gaussian 98, Revision A.11.4, M. J. Frisch, et al., Gaussian, Inc., Pittsburgh Pa., 2002) manufactured by Gaussian, Inc. in U.S.A. as a value (eV unit conversion value) calculated by structural optimization using B3LYP/6-31G* as a keyword. This calculated value is valid because of a high correlation between the calculated values determined by such a method and experimental values.

(2) The ionization potential can also be directly measured by photoelectron spectroscopy. For example, a low-energy electron spectrometer "Model AC-1", manufactured by Riken Keiki Co., Ltd. or a method known as ultraviolet photoelectron spectroscopy can be suitably employed.

Meanwhile, the electron blocking layer functions as a hole transport layer in a broad sense and is composed of a material having hole transportability but extremely poor electron transportability and can increase the probability of recombination of electrons and holes by transporting holes and blocking electrons.

The structure of a hole transport layer described below can be optionally used as an electron blocking layer. The hole blocking layer and the electron blocking layer according to the present invention each preferably have a film thickness of 3 nm to 100 nm and more preferably 5 nm to 30 nm.

«Hole Transport Layer»

The hole transport layer is composed of a hole transport material having hole transportability. The hole injection layer and the electron blocking layer are also included in the hole transport layer in a broad sense. The hole transport layer may be formed as a single layer or plural layers.

The hole transport material has a hole injectability, transportability or an electron blockability and may be either an organic material or an inorganic material. Examples of the hole transport material include triazole derivatives, oxadiazole derivatives, imidazole derivatives, polyarylalkane derivatives, pyrazoline derivatives, pyrazolone derivatives, phenylenediamine derivatives, arylamine derivatives, amino substituted chalcone derivatives, oxazole derivatives, styryl anthracene derivatives, fluorenone derivatives, hydrazone derivatives, stilbene derivatives, silazane derivatives, aniline copolymers, and electroconductive polymers/oligomers, particularly a thiophene oligomer.

Azatriphenylene derivatives, such as those described in JP 2003-519432 W or JP 2006-135145 A, for example, can also be used as hole transport materials.

As for the hole transport material, those described above can be used. However, a porphyrin compound, an aromatic tertiary amine compound, and a styrylamine compound, in particular, an aromatic tertiary amine compounds, is preferably used.

Representative examples of the aromatic tertiary amine compound and the styrylamine compound include N,N,N', N'-tetraphenyl-4,4'-diaminophenyl; N,N'-diphenyl-N,N'-bis(3-methylphenyl)-(1,1'-biphenyl)-4,4'-diamine (TPD); 2,2-bis(4-di-p-tolylaminophenyl)propane; 1,1-bis(4-di-p-tolylaminophenyl)cyclohexane; N,N,N',N'-tetra-p-tolyl-4,4'-diaminobiphenyl; 1,1-bis(4-di-p-tolylaminophenyl)-4-phenylcyclohexane; bis(4-dimethylamino-2-methylphenyl) phenylmethane; bis(4-di-p-tolylaminophenyl) phenylmethane; N,N'-diphenyl-N,N'-di(4-methoxyphenyl)-4,4'-diaminobiphenyl; N,N,N',N'-tetraphenyl-4,4'-diaminodiphenyl ether; 4,4'-bis(diphenylamino) quardriphenyl; N,N,N-tri(p-tolyl)amine; 4-(di-p-tolylamino)-4'-[4-(di-p-tolylamino)styryl]stilbene; 4-N,N-diphenylamino-(2-diphenylvinyl)benzene; 3-methoxy-4'-N,N-diphenylaminostylbenzene; N-phenylcarbazole, compounds having two condensed aromatic rings in the molecule, described in U.S. Pat. No. 5,061,569 such as 4,4'-bis[N-(1-naphthyl)-N-phenylamino]biphenyl (NPD), and compounds described in JP 4-308688 A such as 4,4',4"-tris[N-(3-methylphenyl)-N-phenylamino]triphenylamine (MTDATA) in which three triphenylamine units are bonded in a starburst form.

Polymer materials having the compounds mentioned above introduced into the polymer chains or having the materials as main polymer chains can also be used.

An Inorganic compound such as p-type Si and p-type SiC can also be used as the hole injection material or the hole transport material.

So-called p-type hole transport materials as described in JP 11-251067 A or in J. Huang, et al. (Applied Physics Letters, 80 (2002), p. 139) can also be used. In the present invention, these materials are preferably used from the viewpoint of obtaining a light emitting element with higher efficiency.

The hole transport layer can be formed in the form of a thin film prepared from the hole transport material by a known method such as vacuum deposition, spin coating, casting, printing including ink jetting, or LB method.

The film thickness of the hole transport layer is not particularly limited. However, it is usually about 5 nm to 5 µm or so and preferably 5 nm to 200 nm. The hole transport layer may have a monolayer constitution composed of one or more of the materials mentioned above.

A hole transport layer having high p-type properties doped with an impurity can also be used. Examples thereof include those described in, for example, JP 4-297076 A, JP 2000-196140 A, and JP 2001-102175 A and J. Appl. Phys., 95, 5773 (2004).

In the present invention, the use of such hole transport layer having high p-type properties is preferred because an element with lower power consumption can be produced.

«Positive Electrode»

The electrode material of the positive electrode of the organic EL element is preferably a metal, alloy, or electroconductive compound having a high work function (not less than 4 eV) or a mixture thereof. Specific examples of the electrode material include metals such as Au and transparent electroconductive materials such as CuI, indium tin oxide (ITO), $SnO_2$, and ZnO.

A material, such as IDIXO ($In_2O_3$—ZnO), capable of forming an amorphous transparent electroconductive film, may be also used. The positive electrode may be produced by forming a thin film from the electrode material by a method, such as deposition or sputtering, and then patterning the film into a desired shape by photolithography. If a high precision pattern is not required (not less than about 100 µm), the pattern may be formed by depositing or sputtering the electrode material through a mask having a desired shape.

Alternatively, when a coatable material such as an organic electroconductive compound is used, wet film coating, such as printing or coating, is also available. For extraction of light from the positive electrode, the transmittance of the positive electrode is desirably 10% or more, and the sheet resistance of the positive electrode is preferably several hundred Ω/or less. The film thickness is usually selected from a range of 10 nm to 1000 nm and preferably 10 nm to 200 nm, although it may vary depending on the material.

«Supporting Substrate»

The supporting substrate (also referred to as a base, a substrate, a base member, or a support hereinbelow) that can be used for the organic EL element of the present invention may be composed of any material, such as glass or plastic, and may be transparent or opaque. For extraction of light from the supporting substrate side, the supporting substrate is preferably transparent. Examples of the transparent supporting substrate preferably used include glass, quartz, and transparent resin films. Particularly preferred supporting substrate is a resin film capable of imparting flexibility to the organic EL element.

Examples of the resin film include films of polyesters such as polyethylene terephthalate (PET) and polyethylene naphthalate (PEN); polyethylene; polypropylene; cellophane; cellulose esters and its derivatives such as cellulose diacetate, cellulose triacetate (TAC), cellulose acetate butyrate, cellulose acetate propionate (CAP), cellulose acetate phthalate, and cellulose nitrate; polyvinylidene chloride; polyvinyl alcohol; poly(ethylene-vinyl alcohol); syndiotactic polystyrene; polycarbonate; a norbornene resin; polymethylpentene; polyether ketone; polyimide; polyether sulfone (PES); polyphenylene sulfide; polysulfone; polyether imide; polyether ketone imide; polyamide; a fluorine resin; Nylon; poly(methyl methacrylate); acrylic and polyarylate and a cycloolefin resin such as ARTON (trade name, manufactured by JSR Corp.) and APEL (trade name, manufactured by Mitsui Chemicals Inc.).

On the surface of the resin film, an inorganic or organic coating film or a hybrid coating film composed of the both may be formed. The coating film is preferably a barrier film having a water vapor transmittance (permeability) of 0.01 g/($m^2$·24 h) or less (at 25±0.5° C. and 90±2% relative humidity (RH)) measured by a method in accordance with JIS K 7129-1992, and more preferably a high barrier film having an oxygen transmittance of 10-mL/($m^2$·24 h·atm) or less measured by a method in accordance with JIS K 7126-1987 and a water vapor transmittance of $10^{-5}$ g/($m^2$·24 h) or less.

As for the material for forming the barrier layer, any material that can block infiltration of substances such as moisture and oxygen causing degradation of the element can be used, and usable examples of the material include silicon oxide, silicon dioxide, and silicon nitride. In order to reduce the fragility of the film, a barrier film having a laminate structure composed of an inorganic layer and an organic material layer is preferred. The inorganic layer and the organic material layer may be laminated in any order, and it is preferable that the both layers be alternately laminated multiple times.

The method for forming the barrier film is not particularly limited, and examples thereof include, vacuum deposition, sputtering, reactive sputtering, molecular beam epitaxy, cluster ion-beam deposition, ion plating, plasma polymerization, atmospheric pressure plasma polymerization, plasma CVD, laser CVD, thermal CVD, and a coating method. Particularly preferred method is atmospheric pressure plasma polymerization as described in JP 2004-68143 A.

Examples of the opaque supporting substrate include a metal plate or film of, for example, aluminum and stainless steel; opaque resin substrate; and ceramic substrate.

The external extraction efficiency of light of the organic EL element of the present invention at room temperature is preferably 1% or more and more preferably 5% or more.

Herein, the external extraction quantum efficiency (%)= (number of photons emitted from the organic EL element to the exterior)/(number of electrons supplied to the organic EL element)×100.

A hue improving filter such as a color filter or a color conversion filter that converts the color of light emitted by the organic EL element to many colors using a fluorescent compound may be used in combination. In case of using the color conversion filter, the λmax of the light emitted from the organic EL element is preferably 480 nm or less.

«Method of Producing Organic EL Element»

As an example of the method for producing an organic EL element, a method of producing an element consisting of positive electrode/hole injection layer (positive electrode buffer layer)/hole transport layer/light emitting layer/hole blocking layer/electron transport layer/electron injection layer (negative electrode buffer layer)/negative electrode is described.

A thin film is formed with a desired electrode material, for example, a material for a positive electrode, on a suitable base such that it can have film thickness of 1 µm or less, preferably 10 nm to 200 nm. As a result, a positive electrode is produced.

Next, a thin film containing an organic compound, that is, a hole injection layer, a hole transport layer, a light emitting layer, a hole blocking layer, an electron transport layer and an electron injection layer, which are a material for an element, is formed on the positive electrode.

With regard to the method for forming a thin film, a film can be formed by a vacuum deposition method, a wet method (also referred to as a wet process), or the like.

As for the wet method, there are spin coating, casting, die coating, blade coating, roll coating, ink jetting, printing, spray coating, curtain coating and a LB method. From the viewpoint of forming a high precision thin film and having high productivity, a process showing high adaptability to a roll-to-roll system such as die coating, roll coating, ink jetting or spray coating is preferred. A different film-forming process may be applied to each layer.

Usable examples of a liquid medium for dissolving or dispersing the organic EL materials which can be used in the present invention include ketones such as methyl ethyl ketone and cyclohexanone; aliphatic acid esters such as ethyl acetate; halogenated hydrocarbons such as dichlorobenzene; aromatic hydrocarbons such as toluene, xylene, mesitylene, and cyclohexylbenzene; aliphatic hydrocarbons such as cyclohexane, decaline, and dodecane; and organic solvents such as DMF and DMSO.

With regard to the method for dispersion, dispersion can be performed by, for example, ultrasonic wave dispersion, high shearing force dispersion, or medium dispersion.

After formation of these layers, a thin film of a material for a negative electrode is formed thereon into a thickness of 1 μm or less, preferably in a range of 50 to 200 nm to provide a negative electrode to obtain a desired organic EL element.

Alternatively, the production can be performed in the reverse order, that is, in order of an electron transport layer, a hole blocking layer, a light emitting layer, a hole transport layer, a hole injection layer, and a positive electrode.

In the production of the organic EL element of the present invention, the steps of producing the layers from the hole injection layer to the negative electrode are preferably performed with a single air purge. Alternatively, it may be taken out in the middle of the process and another process may be performed. In such a case, the process is preferably performed under a dry inert gas atmosphere.

«Sealing»

Examples of the sealing means used in the present invention include a method in which a sealing member, an electrode, and a supporting substrate are bonded with an adhesive.

It is sufficient that the sealing member is disposed so as to cover the displaying area of the organic EL element and it can be a concave plate or a flat plate. Further, the sealing member may have any transparency and electrical insulation.

Examples of the sealing member include glass plates, polymer plates and films, and metal plates and films. Examples of the glass plate include soda-lime glass, barium.strontium-containing glass, lead glass, aluminosilicate glass, borosilicate glass, barium borosilicate glass, and quartz plates.

Examples of the polymer plate include polycarbonate, acryl, polyethylene terephthalate, polyether sulfide, and polysulfone plates.

The metal plate may be composed of at least one metal or alloy selected from the group consisting of stainless steel, iron, copper, aluminum, magnesium, nickel, zinc, chromium, titanium, molybdenum, silicon, germanium, and tantalum.

In the present invention, a polymer film or a metal film is preferably used, from the viewpoint of a reduction in the film thickness of the element.

The polymer film preferably has an oxygen transmittance of $1\times10^{-3}$ mL/(m$^2\cdot$24 h·atm) or less measured by a method in accordance with JIS K 7126-1987 and a water vapor transmittance of $1\times10^{-3}$ g/(m$^2\cdot$24 h) or less (at 25±0.5° C. and 90±2% relative humidity (RH)) measured by a method in accordance with JIS K 7129-1992.

The sealing member is formed into a concave shape by, for example, sand blasting or chemical etching.

Examples of the adhesive include photo-curable or thermo-curable adhesives having reactive vinyl groups, such as acrylic acid oligomers and methacrylic acid oligomers; moisture curable adhesives such as 2-cyanoacrylate; and thermally or chemically curable (two-liquid mixing type) adhesives, such as epoxy adhesives. Examples of the adhesive include hot-melt polyamide, polyester, and polyolefin adhesives; and UV curable epoxy resin adhesives of cation curing type.

Meanwhile, since the organic EL element may be degraded during heat treatment, an adhesive curable at a temperature from room temperature to 80° C. is preferred. A drying agent may be dispersed in the adhesive. The adhesive may be applied to the adhering portion with a commercially available dispenser or by printing such as screen printing.

It is also preferred that an inorganic or organic layer is formed as a sealing film on the outer side of the electrode on the opposite side of the supporting substrate over the organic layer to cover the electrode and the organic layer and to come into contact with the supporting substrate. In such a case, the sealing film may be formed of any material that can block infiltration of substances such as water and oxygen that causes degradation of the element. Usable examples of the material include silicon oxide, silicon dioxide, and silicon nitride.

In order to improve the fragility of the film, a sealing film having a laminate structure composed of an inorganic layer and an organic material layer is preferred. The sealing film may be formed by any method, for example, vacuum deposition, sputtering, reactive sputtering, molecular beam epitaxy, cluster ion-beam deposition, ion plating, plasma polymerization, atmospheric pressure plasma polymerization, plasma CVD, laser CVD, thermal CVD, or a coating method.

The gap between the sealing member and the displaying portion of the organic EL element is preferably filled with, in the form of a gas or liquid phase, an inert gas such as nitrogen or argon or an inactive liquid such as fluorinated hydrocarbon or silicone oil. The gap can be in a vacuum state. Alternatively, it may be filled with a hygroscopic compound.

Examples of the hygroscopic compound include metal oxides (for example, sodium oxide, potassium oxide, calcium oxide, barium oxide, magnesium oxide, and aluminum oxide), sulfates (for example, sodium sulfate, calcium sulfate, magnesium sulfate, and cobalt sulfate), metal halides (for example, calcium chloride, magnesium chloride, cesium fluoride, tantalum fluoride, cerium bromide, magnesium bromide, barium iodide, and magnesium iodide), and perchlorates (for example, barium perchlorate and magnesium perchlorate). The sulfates, metal halides, and perchlorates are suitably used in the form of anhydride.

«Protection Film, Protection Plate»

In order to enhance the mechanical strength of the element, a protection film or plate may be provided on the outer side of the sealing layer or film on the opposite side of the supporting substrate over the organic layer. In particular, when a sealing film is used for sealing, the mechanical strength of the sealing film is not sufficiently high; hence, such a protection film or plate is desirable. Usable examples of the material for the protection film or plate include glass plates, polymer plates and films, and metal plates and films, which have been exemplified as materials for sealing. The polymer film is preferred from the viewpoint of a reduction in the weight and the film thickness.

«Light Extraction»

It is generally said that an organic EL element generates light in a layer having a refractive index higher than air (that is, refractive of about 1.7 to 2.1), and can emit merely about 15% to 20% of the light generated in the light emitting layer. This is because incident light on the interface between a transparent substrate and the air at an angle θ larger than a critical angle is totally reflected and cannot be extracted from the element, or is because light is totally reflected at the interface between the transparent electrode or light emitting layer and the transparent substrate and is guided to the transparent electrode or the light emitting layer to escape the light to the side face of the element.

The light extraction efficiency can be improved by forming irregularities on a surface of a transparent substrate to prevent total reflection at the interface between the transparent substrate and the air (U.S. Pat. No. 4,774,435); by providing light-condensing properties to a substrate to improve the efficiency (JP 63-314795 A); by forming a reflection surfaces on the side surfaces of an element (JP 1-220394 A); by disposing a flat anti-reflection layer between a substrate and a luminescent material, where the anti-reflection layer has a refractive index between those of the substrate and the luminescent material (JP 62-172691 A); by disposing a flat layer between a substrate and a luminescent material, where the flat layer has a refractive index lower than that of the substrate (JP 2001-202827 A); and by forming a diffraction grating between any layers of a substrate, transparent electrode layer, and light emitting layer (including on the substrate surface facing the exterior) (JP 11-283751 A).

In the present invention, these methods can be used in combination with the organic EL element of the present invention. In particular, the method of disposing a flat layer having a refractive index lower than that of the substrate between the substrate and the luminescent material or the method of forming a diffraction grating between any layers of a substrate, transparent electrode layer, and light emitting layer (including on the substrate surface facing the exterior) can be suitably employed.

The present invention can provide an element exhibiting higher luminance or excellent durability by combining those means.

By having a low refractive index medium with a thickness greater than light wavelength between a transparent electrode and a transparent substrate, the extraction efficiency of light from the transparent electrode to the exterior increases with a decrease in the refractive index of the medium.

Examples of materials for the low refractive index layer include aero gel, porous silica, magnesium fluoride, and fluorinated polymer layers. Since the refractive index of a transparent substrate is usually about 1.5 to 1.7, the refractive index of the low refractive index layer is preferably about 1.5 or less and more preferably 1.35 or less.

The low refractive index medium desirably has a thickness twice or more the wavelength of the light in the medium for the following reason. If the low refractive index medium has a thickness similar to the wavelength of the light, the electromagnetic waves exuding as evanescent waves penetrate into the substrate, resulting in a reduction in the effect of the low refractive index layer.

The method for incorporation of a diffraction grating onto the interface at which total reflection occurs or into any media is characterized in that it can increase the effect of enhancing the light extraction efficiency. In this method, a diffraction grating is incorporated onto the interface between any two layers or in any medium (in the transparent substrate or the transparent electrode) to extract the light that is generated in the light emitting layer that cannot exit due to, for example, total reflection at the interface between the layers, by the use of the property of the diffraction gratings that can change the direction of light to a specific direction different from that of refraction by Bragg diffraction such as primary diffraction or secondary diffraction.

The diffraction grating to be introduced desirably has two-dimensional periodic refractive indices. Because light generated in a light emitting layer is emitted randomly in all directions, a general one-dimensional diffraction grating having a periodic refractive index distribution only in the specific direction can diffract only the light travelling in a specific direction and cannot greatly increase the light extraction efficiency.

A diffraction grating having a two-dimensional refractive index distribution can diffract light travelling in all directions, resulting in an increase in light extraction efficiency.

The diffraction grating may be introduced between any two layers or in any medium (in the transparent substrate or the transparent electrode) as described above, but is desirably introduced near the organic light emitting layer that generates light.

The period of the diffraction grating is preferably about ½ to 3 times the wavelength of light in the medium.

The array of the diffraction grating is preferably two-dimensionally repeated such as a square lattice shape, a triangular lattice shape, or a honeycomb lattice shape.

«Light-Condensing Sheet»

The organic EL element of the present invention can enhance the luminance in a specific direction by condensing light in this specific direction, for example, in the front direction with respect to the light emitting plane of the element by providing, for example, a micro-lens array structure on the light extraction side of the substrate of the element or combining with a light-condensing sheet.

In an example of a micro-lens array, quadrangular pyramids having a side of 30 μm and having a vertex angle of 90 degrees are two-dimensionally arranged on the light extraction side of the substrate. The quadrangular pyramid preferably has a side of 10 μm to 100 μm. A side shorter than this range causes coloration due to the effect of diffraction, while a side longer than this range makes the thickness unfavorably large.

A usable light-condensing sheet is one practically used for an LED backlight of a liquid crystal display device. A typical example of the sheet is a brightness enhancing film (BEF) produced by SUMITOMO 3M Limited.

A prism sheet may have a shape, for example, a shape with triangular stripes with a vertex angle of 90 degrees and a pitch of 50 μm, a shape having a round apex, a shape having randomly changed pitches or other shapes, formed on a base material.

In order to control the emission angle of light from the light emitting element, a light diffusion plate or film may be used in combination with the light-condensing sheet. For example, a diffusion film (Light-Up) manufactured by KIMOTO Co., Ltd. can be used.

«Application»

The organic EL element of the present invention can be used as a display device, a display, or various light emission sources. Examples of the light emission source include, but not limited to, lighting devices (lamps for household use and car room lamps), backlights for watches and liquid crystals, light sources for board advertisements, traffic lights, and optical memory media, light sources for electrophotographic copiers, light sources for optical communication instruments, and light sources for optical sensors. In particular, the organic EL element can be advantageously used as a backlight for a liquid crystal display device or a lighting source.

In the organic EL element of the present invention, films are optionally patterned with a metal mask or by ink-jet printing during formation of the films. The patterning may be performed for only the electrodes or for the electrodes and the light emitting layer or for all layers of the element. In the production of the element, conventionally known methods can be employed.

Figure 4:
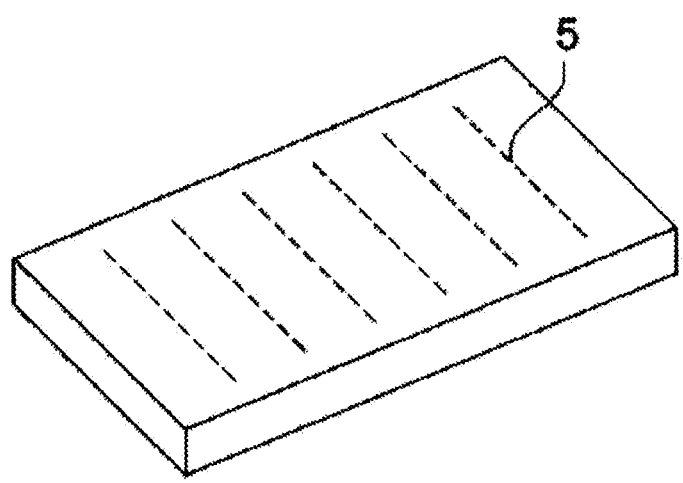
FIG. 4 is a schematic diagram of a full-color passive-matrix type display device which is related to the display part A in FIG. 2.
Figure 4:
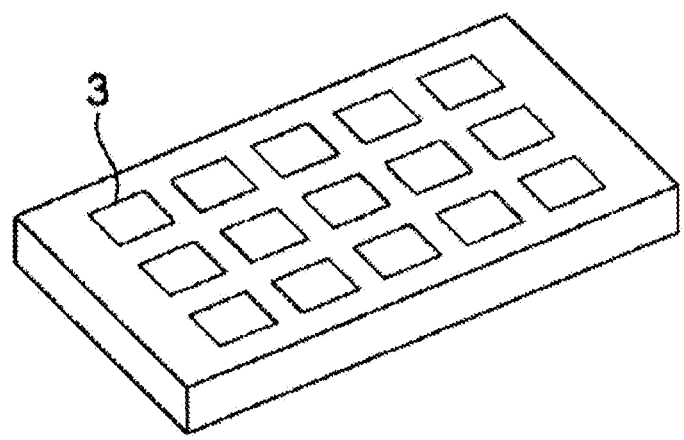
Figure 4:
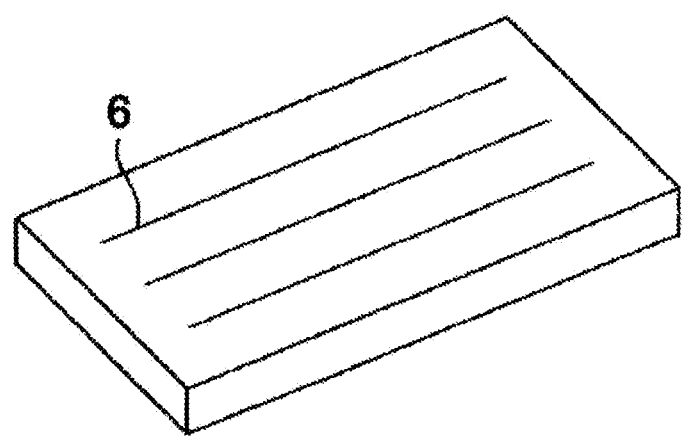

Colors of light emitted from the organic EL element of the present invention or the compounds according to the present invention are specified with the color determined by applying the results of measurements with a spectral radiance meter CS-1000 (manufactured by Konica Minolta Sensing Co., Ltd.) to the CIE chromaticity coordinates in FIG. 4.16 on page 108 of "New Edition Color Science Handbook" (edited by The Color Science Association of Japan, University of Tokyo Press, 1985).

When the organic EL element of the present invention is a white-emitting element, white means that when the front luminance of a two-degree viewing angle is measured by the method described above, the chromaticity in the CIE 1931 chromaticity system at 1000 cd/m$^2$ is within a region of X=0.33±0.07 and Y=0.33±0.1.

«Display Device»

The display device of the present invention will now be described. The display device of the present invention has the organic EL element of the present invention. The display device of the present invention may be monochromatic or multichromatic. A multichromatic display device will now be described.

In the case of a multichromatic display device, a shadow mask is provided only during formation of the light emitting layer and the film can be formed on one side by, for example, vacuum deposition, casting, spin coating, ink jetting or printing.

In the case of patterning only the light emitting layer, the patterning may be performed by any method and is preferably performed by a vacuum deposition method, an ink jet method, a spin coating method, or a printing method.

The structure of the organic EL element provided to the display device is appropriately selected from the constitution of the organic EL element mentioned above.

The method of producing the organic EL element is as shown in one embodiment of the production of the organic EL element of the present invention which has been described above.

When a direct current voltage is applied to the multichromatic display device which has been obtained as above, luminescence can be observed by having the positive electrode at a positive (+) polarity and the negative electrode at a negative (−) polarity and applying the voltage of 2 V to 40 V or so. Furthermore, even when a voltage is applied with reverse polarity, no current flows and light emission does not occur at all. Furthermore, when an alternating current is applied, light is emitted only in the state of the positive electrode being positive (+) and negative electrode being negative (−). Meanwhile, the alternating current to be applied may have any wave shape.

The multichromatic display device can be used as a display device, a display, or various light emission sources. In the display device and the display, full color display can be achieved with three types of organic EL elements that emit blue, red, and green light.

Examples of the display device and the display include television sets, personal computers, mobile equipment, AV equipment, teletext displays, and information displays in automobiles. In particular, the display device may be used for displaying still images or moving images and the driving system in the case of using the display device for displaying moving images may be either a simple matrix (passive matrix) system or an active matrix system.

Examples of the light emission source include a lamp for household use, a car room lamp, a backlight for watches and liquid crystals, a light source for board advertisements, a traffic light, and an optical memory medium, a light source for electrophotographic copying machine, a light source for optical communication instrument, and a light source for optical sensor. However, the present invention is not limited thereto.

Hereinbelow, an example of the display device having the organic EL element of the present invention is described with reference to drawings.

FIG. 1 is a schematic diagram illustrating an example display device composed of the organic EL element of the present invention. It is a schematic diagram illustrating a display for, for example, a mobile phone to perform display of image information through light emission of the organic EL element.

The display 1 is composed of a display part A having a plurality of pixels and a control part B performing image scanning of the display part A based on image information.

The control part B is electrically connected to the display part A and sends scanning signals and image data signals to the respective pixels based on external image information. The pixels of each scanning line receive the scanning signal and sequentially emit light according to the image data signal and the image information is displayed on the display part A through image scanning.

Figure 2:
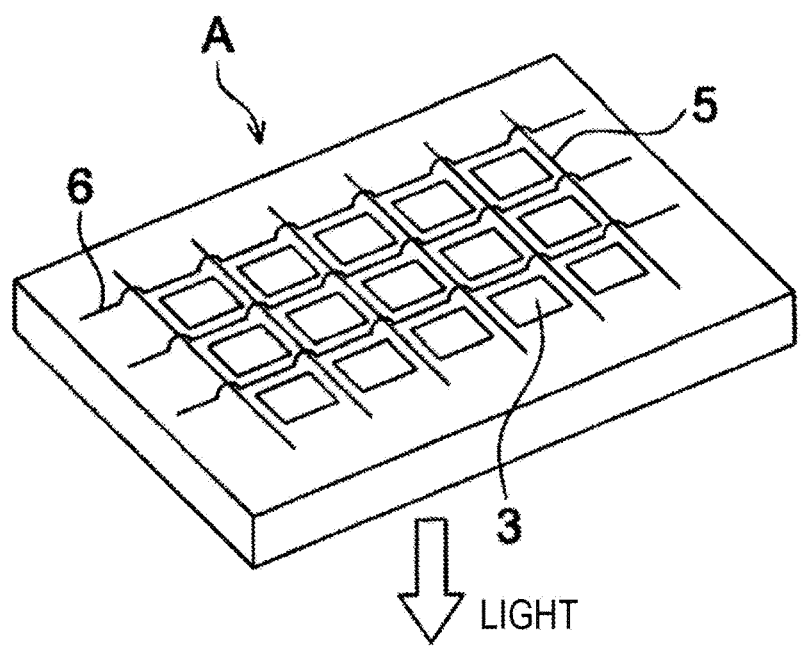
FIG. 2 is a schematic diagram of the display part A in FIG. 1.

FIG. 2 is a schematic diagram of the display part A.

The display part A includes a wiring portion including a plurality of scanning lines 5 and data lines 6, and a plurality of pixels 3 on a substrate. The main members of the display part A will be now described.

FIG. 2 illustrates a case in which light emitted from the pixels 3 is extracted to the direction shown by the white arrow (downward direction).

The scanning lines 5 and the plural data lines 6 in the wiring portion are each made of an electrically conductive material. The scanning lines 5 and the plural data lines 6 are disposed orthogonal to each other into a grid pattern and are connected to the pixels 3 at the intersections (the details are not presented).

A scanning signal is applied from the scanning line 5, and then the pixels 3 receive an image data signal from the data line 6 and emit light according to the received image data.

Full color display can be achieved by appropriately juxtaposing, on the same substrate, pixels that emit light in a red region, pixels that emit light in a green region, and pixels that emit light in a blue region.

Figure 3:
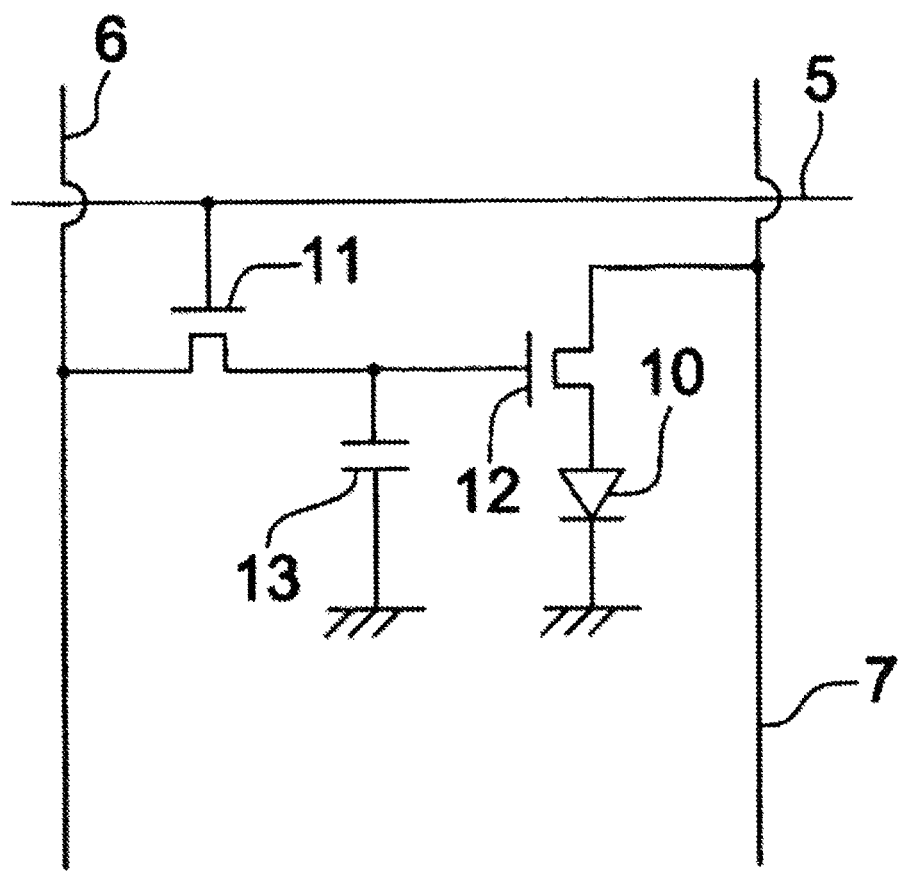
FIG. 3 is a schematic diagram of a pixel.

Next, the light emitting process by a pixel will now be described. FIG. 3 is a schematic diagram of the pixel.

The pixel includes an organic EL element 10, a switching transistor 11, a driving transistor 12, and a condenser 13. Full color display can be performed by using, as organic EL element 10 for plural pixels, an organic EL element emitting red light, green light, and blue light and juxtaposing them on the same substrate.

In FIG. 3, an image data signal from the control part B is applied to the drain of the switching transistor 11 via the data line 6. A scanning signal from the control part B is then applied to the gate of the switching transistor 11 via the scanning line 5 to turn on the switching transistor 11, and the image data signal applied to the drain is transmitted to gate of the condenser 13 and the driving transistor 12.

The condenser 13 is charged through the transmission of the image data signal depending on the potential of the image data signal, and the driving transistor 12 is turned on. In the driving transistor 12, the drain is connected to a power source line 7 and a source is connected to the electrode of the organic EL element 10 to supply a current to the organic EL element 10 from the power source line 7 depending on the potential of the image data signal applied to the gate.

The scanning signal is transmitted to the next scanning line 5 by sequential scanning by the control part B to turn off the switching transistor 11. However, the condenser 13 maintains the charged potential of the image data signal even after the turning-off of driving of switching transistor 11, and thereby the driving state of the driving transistor 12 is maintained to continue the light emission by the organic EL element 10 until the next scanning signal is applied. The driving transistor 12 is driven according to the potential of the subsequent image data signal in synchronization with the subsequent scanning signal applied by sequential scanning, resulting in luminescence by the organic EL element 10.

That is, light emission by the organic EL element 10 is performed by providing a switching transistor 11 and a driving transistor 12 serving as active elements to the organic EL element 10 of each of the plurality of pixels and allowing the respective organic EL elements 10 of the plural pixels 3 to emit light. Such a light emitting process is called an active matrix system.

The luminescence from the organic EL element 10 may have multiple gradations according to multi-valued image data signals having different gradation potentials, or a predetermined intensity of on-off light according to a binary image data signal. The electric potential of the condenser 13 may be maintained until the subsequent scanning signal is applied, or may be discharged immediately before the subsequent scanning signal is applied.

In the present invention, the luminescence is not limited to the active matrix system described above, and it may be driven by a passive matrix system. In the passive matrix system, light is emitted from the organic EL element in response to the data signal only during scanning of the scanning signals.

FIG. 4 is a schematic diagram of a passive-matrix display device which is related to display part A in FIG. 2. In FIG. 4, a plurality of scanning lines 5 and a plurality of image data lines 6 are arrayed into a grid pattern in such a manner that pixels 3 are disposed between adjacent lines.

When a scanning signal is applied to a scanning line 5 by sequential scanning, the pixel 3 connected to the activated scanning line 5 emits light in accordance with the image data signal.

The passive matrix system does not have any active element in the pixels 3, resulting in a reduction in manufacturing cost.

«Lighting Device»

A lighting device of the present invention will now be described. The lighting device of the present invention is equipped with the organic EL element of the present invention.

The organic EL element of the present invention having a resonator structure can be used as an organic EL element. The organic EL element having a resonator structure can be applied to, but not limited to, a light source for an optical memory medium, a light source for an electrophotographic copier, a light source for an optical communication instrument, or a light source for an optical sensor. Alternatively, it may be used for the above-mentioned purposes by laser oscillation.

The organic EL element of the present invention may be used as a lamp such as a lighting source or an exposure light source or may be used as a projector for projecting images or a display device (display) for direct view of still or moving images.

The driving system of the display device used for playback of moving images may be either a simple matrix (passive matrix) system or an active matrix system. Furthermore, a full-color display device can be produced by employing two or more organic EL elements of the present invention that emit light of different colors.

The organic EL material of the present invention can be applied to an organic EL element emitting substantially white light as a lighting device. The white light is generated by mixing light having different colors simultaneously emitted from a plurality of luminescent materials. The combination of the emitted light colors may be a combination containing three maximum light emission wavelengths of three primary colors of blue, green, and red or a combination containing two maximum light emission wavelengths utilizing a relationship of complementary colors such as blue and yellow or bluish green and orange.

Furthermore, the combination of luminescent materials to obtain a plurality of colors of emitted light may be either a combination of a plurality of phosphorescent or fluorescent materials or a combination of a fluorescent or phosphorescent material and a pigment material that emits light as excited light using the light from the luminescent material. However, in the white-emitting organic EL element according to the present invention, a mere combination and mixing of a plurality of luminescent dopants may be sufficient.

It is sufficient that a mask is disposed during formation of a light emitting layer, a hole transport layer, or an electron transport layer to simply separate the coating through the mask. The other layers are common and do not require any patterning with a mask, and an electrode film can be formed on one side by, for example, vacuum deposition, casting, spin coating, ink jetting, or printing. The productivity is thereby enhanced.

According to this method, the element itself emits white light, unlike the white-emitting organic EL device including light emitting elements emitting different colors juxtaposed in an array form.

Any luminescent material can be used for the light emitting layer. For example, in a backlight in a liquid crystal display element, white light may be made by selecting and combining appropriate metal complexes according to the present invention or known luminescent materials so as to match with the wavelength range corresponding to color filter (CF) characteristics.

<<One Embodiment of Lighting Device of the Present Invention>>

One embodiment of the lighting device including the organic EL element of the present invention will now be described.

The non-light emitting surface of the organic EL element of the present invention is covered with a glass case, and a glass substrate having a thickness of 300 μm is used as a sealing substrate. As a sealing material, an epoxy photo-curable adhesive (LUXTRACK LC0629B manufactured by Toagosei Company, Limited) is applied to the periphery, and the product is placed onto the negative electrode and is attached to the transparent supporting substrate, followed by curing the adhesive by irradiation with UV light through the glass substrate for sealing. Accordingly, a lighting device as illustrated in FIGS. 5 and 6 can be formed.

Figure 5:
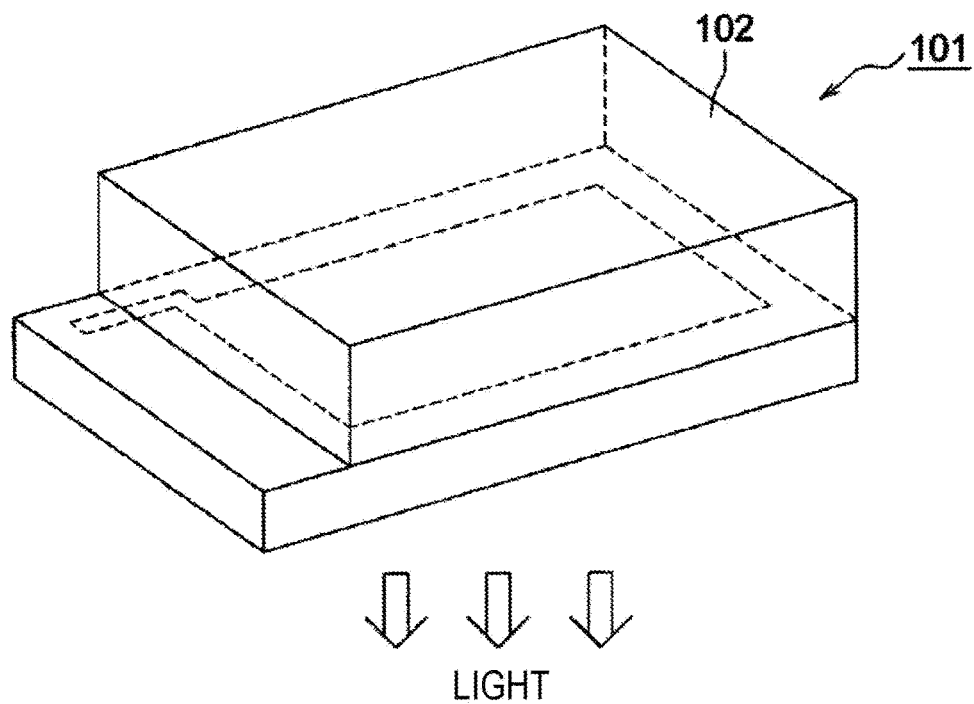
FIG. 5 is an outline diagram of a lighting device.

FIG. 5 is an outline diagram of a lighting device. An organic EL element 101 of the present invention is covered with a glass cover 102 (sealing with the glass cover was performed in a glove box under a nitrogen atmosphere (an atmosphere of high purity nitrogen gas having a purity of at least 99.999%) to avoid contact of the organic EL element 101 with air).

Figure 6:
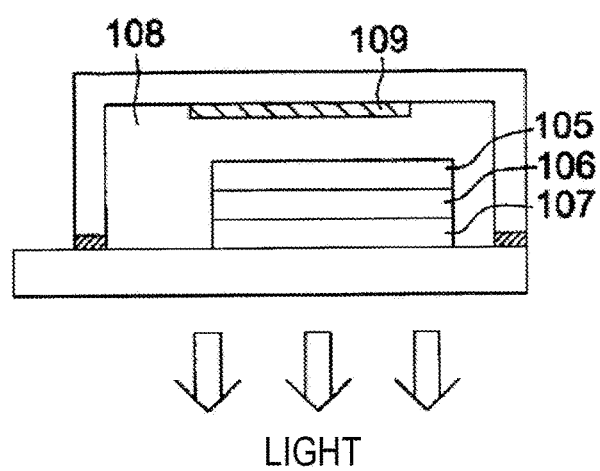
FIG. 6 is a cross-sectional view of a lighting device.

FIG. 6 illustrates a cross-sectional view of the lighting device. In FIG. 6, reference numeral 105 indicates a negative electrode, reference numeral 106 indicates an organic EL layer, and reference numeral 107 indicates a glass substrate provided with a transparent electrode. Meanwhile, the inside of the glass cover 102 (see, FIG. 5) is filled with nitrogen gas 108 and is provided with a water absorbent 109.

The present invention will now be described in detail by examples, but the present invention is not limited thereto.

Furthermore, structures of the compounds that are used in the examples described below are shown in the followings. Meanwhile, other compounds are the same as those described in the specification of the present invention.

[Chemical Formula 56]

Comparative Compound A

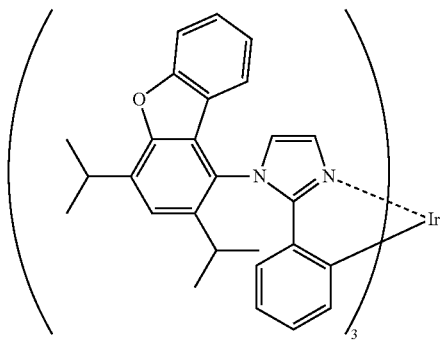

Comparative Compound B

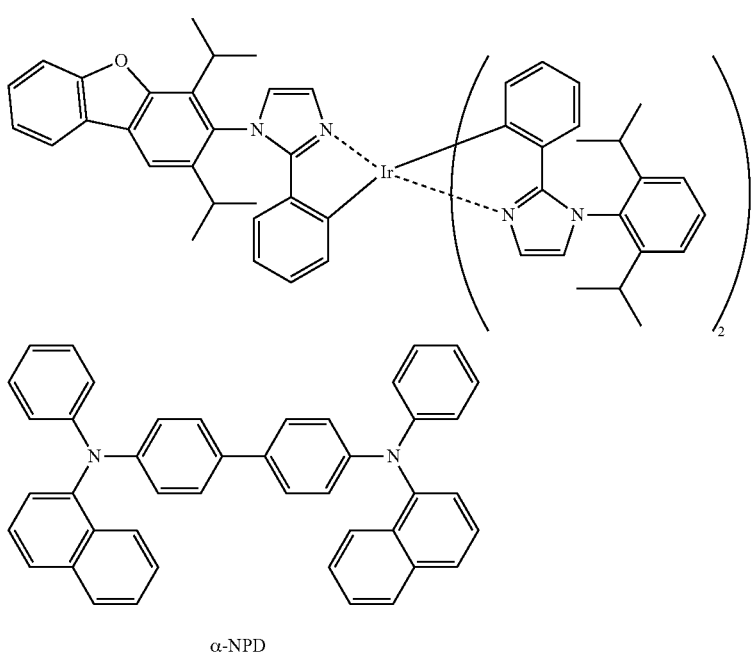

α-NPD

[Chemical Formula 57]
OC-30
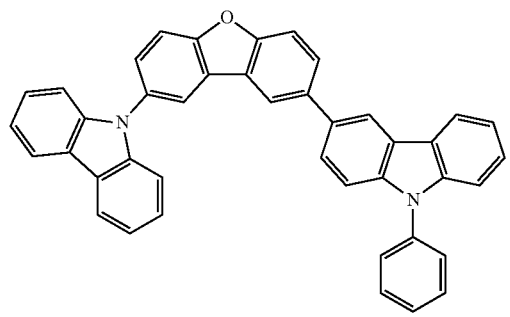
OC-11
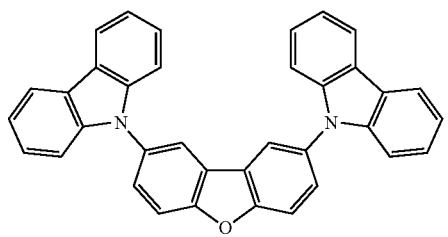
OC-29
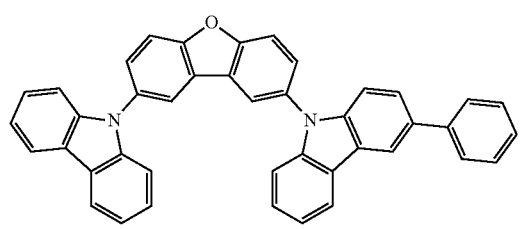
OC-15
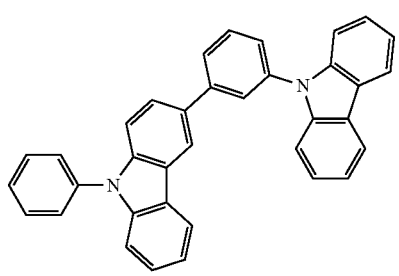
OC-4
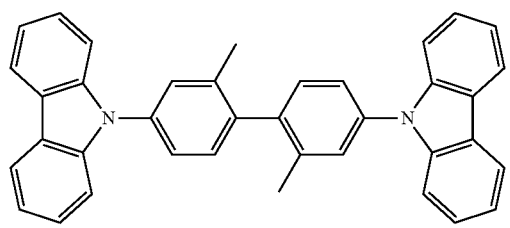
OC-12
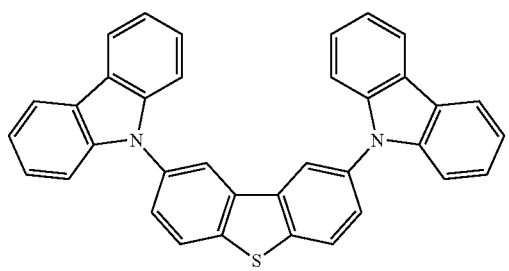
[Chemical Formula 58]
7
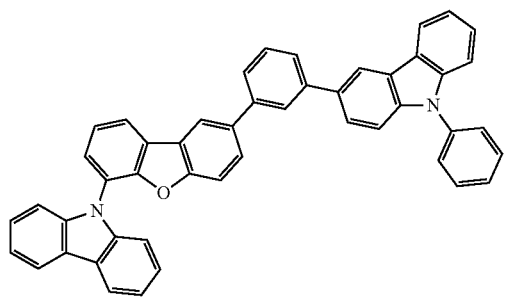
1
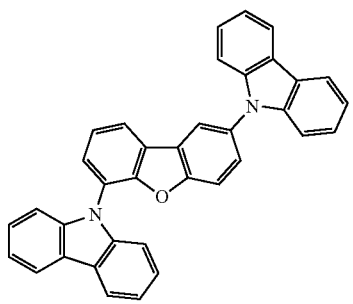
42
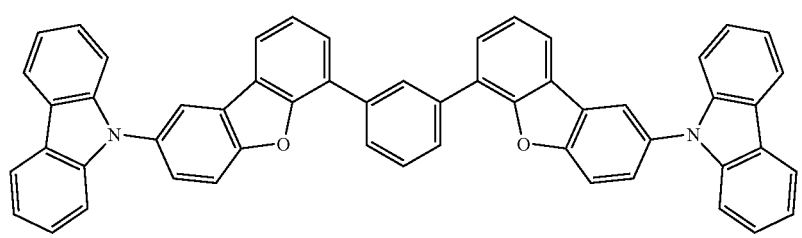

-continued
53
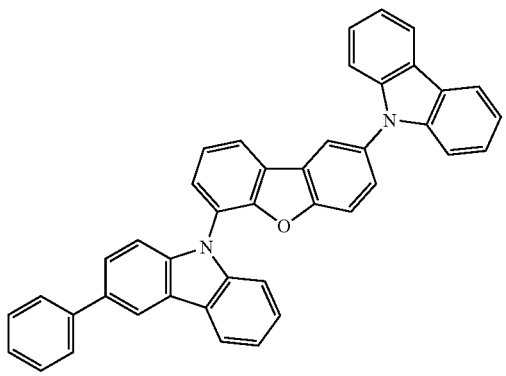
26
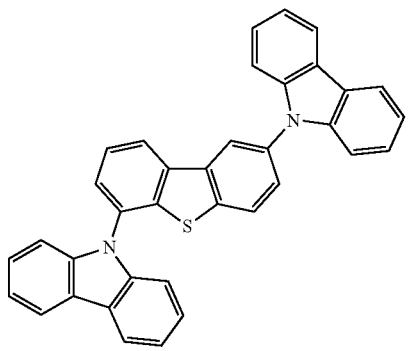
[Chemical Formula 59]
2
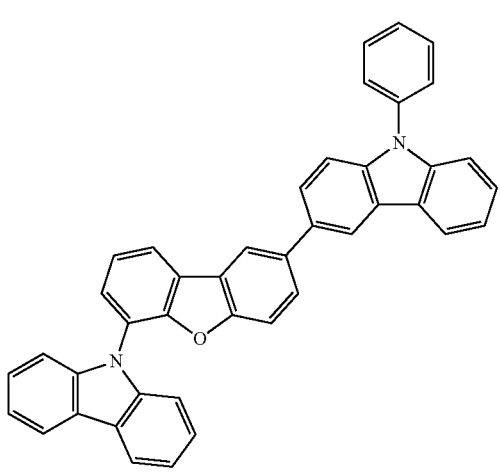
ET-8
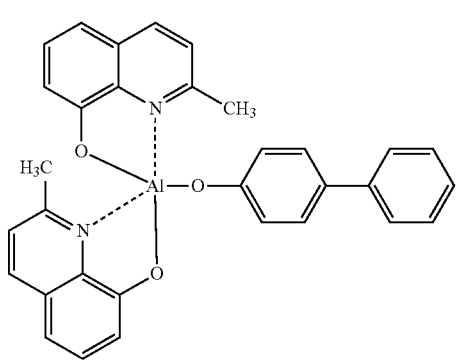
(BAlq)
ET-11
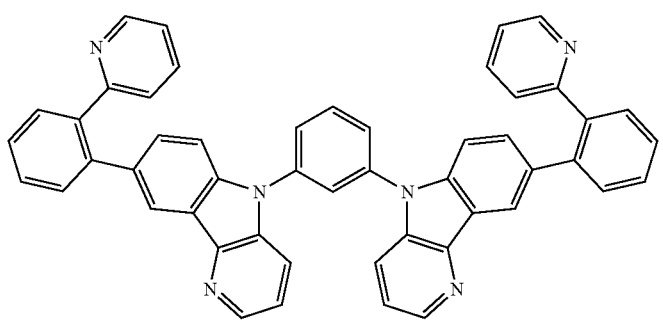
ADS-254
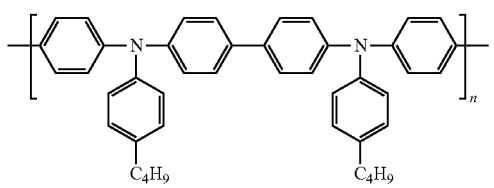
D-10
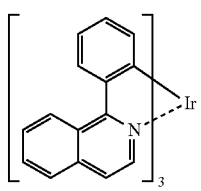

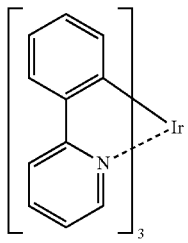

D-1

Example 1

«Production of Organic EL Element 1-1»

A substrate (NA45, manufactured by NH Techno Glass Corp.), prepared by forming a film of ITO (indium tin oxide) with a thickness of 100 nm on a glass substrate of 100 mm×100 mm×1.1 mm, was patterned to form a positive electrode. A transparent supporting substrate provided with the ITO transparent electrode was cleaned with ultrasonic waves using isopropyl alcohol, dried with dry nitrogen gas, and subjected to UV ozone washing for 5 minutes.

On the transparent supporting substrate, a thin film was coated by a spin coating method under conditions including 3000 rpm and 30 seconds by using a solution containing poly(3,4-ethylenedioxythiopehene)-polystyrene sulfonate (PEDOT/PSS, manufactured by H.C. STARCK GMBH, CLEVIO P VP AI 4083) diluted to 70% with purified water. After drying for 1 hour at 200° C., the first hole transport layer with film thickness of 20 nm was formed.

The transparent supporting substrate was fixed to the substrate holder of a commercially available vacuum deposition apparatus. A molybdenum resistance heating boat was filled with 200 mg of α-NPD as a hole transport material, another molybdenum resistance heating boat was filled with 200 mg of OC-30 as a host compound, another molybdenum resistance heating boat was filled with 200 mg of ET-8 as an electron transport material, and still another molybdenum resistance heating boat was filled with 100 mg of Comparative Compound A as a dopant compound. They were then placed in the vacuum deposition apparatus.

Subsequently, the pressure of a vacuum vessel was reduced to $4\times10^{-4}$ Pa, and then the heating boat containing α-NPD was heated by electrification for vapor deposition at a deposition rate of 0.1 nm/sec to form the second transport layer with film thickness of 20 nm on the transparent supporting substrate.

Further, the heating boats containing the OC-30 as a host compound or Comparative Compound A as a dopant compound were heated by electrification to co-deposit each of them on the second hole injection layer at deposition rates of 0.1 nm/sec and 0.006 nm/sec, respectively, to form a light emitting layer with film thickness of 40 nm.

Further, the heating boat containing ET-8 was heated by electrification for vapor deposition on a light emitting layer at a deposition rate of 0.1 nm/sec to form an electron transport layer with film thickness of 30 nm.

Meanwhile, the substrate temperature at the time of vapor deposition was room temperature.

Subsequently, lithium fluoride was deposited to form 0.5 nm thick negative electrode buffer layer, and aluminum was additionally deposited to form a 110 nm thick negative electrode. Accordingly, organic EL element 1-1 was thereby produced.

«Production of Organic EL Elements 1-2 to 1-10»

Organic EL elements 1-2 to 1-10 were produced in the same manner as organic EL element 1-1 except that the host compounds and the dopant compounds in the light emitting layer were changed to the compounds that are described in Table 1.

«Evaluation of Organic EL Elements 1-1 to 1-10»

For evaluation of the obtained organic EL elements 1-1 to 1-10, the non-light emitting surface of each of the organic EL elements was covered with a glass case. A glass plate with thickness of 300 μm was used as a substrate for sealing. As a sealing material, an epoxy photo-curable adhesive (LUXTRACK LC0629B manufactured by Toagosei Company Limited), was applied to the cover glass at the periphery where the cover glass and the glass substrate of the organic EL element are brought into contact with each other. The product was placed onto the negative electrode and was attached to the transparent supporting substrate, followed by curing the adhesive by irradiating the region with UV light through the glass substrate for sealing. Lighting devices as illustrated in FIGS. 5 and 6 were thereby produced and were evaluated.

Each sample which has been produced as described above was subjected to the evaluation as shown below. The evaluation results are described in Table 1.

Subsequently, the following evaluations were performed.

(External Extraction Quantum Efficiency (Also Referred to Simply as Efficiency))

The organic EL element was driven with a constant current of 2.5 mA/cm$^2$ at room temperature (about 23° C. to 25° C.) to emit light, and the luminance (L) [cd/m$^2$] immediately after the start of the emission of light was measured to calculate the external extraction quantum efficiency (η).

The luminance was measured with spectroradiometer CS-1000 (manufactured by Konica Minolta Sensing Inc.). The external extraction quantum efficiency is shown as a relative value compared with the value of the organic EL element 1-1 defined as 100.

(Half Life)

Each organic EL element was driven with constant current by using current which allows initial luminance of 1000 cd/m$^2$, and the time needed for having the luminance decreased to ½ (500 cd/m$^2$) of the initial luminance was obtained and used as a yardstick of the half life.

Meanwhile, the half life was shown as a relative value compared with the value of the organic EL element 1-1 defined as 100.

(Long Term Stability)

After storing the organic EL element for 24 hours at 60° C., the power efficiency before and after the storage was obtained. The power efficiency ratio was obtained for each, and it was used as a yardstick of the long term stability.

Long term stability (%)=Power efficiency after storage/power efficiency before storage×100

Meanwhile, by using a spectroradiometer CS-1000 (manufactured by Konica Minolta Sensing Inc.), the front luminance and angle dependency of the luminance were measured for each organic EL element. The power efficiency at front luminance of 1000 cd/m² was obtained.

(Thermal Stability)

By using the same vapor deposition boat (molybdenum resistance heating mother boat) for each of organic EL elements 1-1 to 1-10, five elements with the same constitution were produced for each (for example, organic EL element 1-1, 1-1b, 1-1c, 1-1d, and 1-1e).

For each of the element produced first (for example, organic EL element 1-1), the element produced third (for example, organic EL element 1-1c), and the element produced fifth (for example, organic EL element 1-1e), the half life was measured according to the same method as above.

TABLE 1

| Organic EL element | Host | Dopant | External extraction quantum efficiency | Half life | Long term stability | Thermal stability | Remarks |
|---|---|---|---|---|---|---|---|
| 1-1 | OC-30 | Comparative Compound A | 100 | 100 | 58 | 61 | Comparative Example |
| 1-2 | OC-30 | Comparative Compound B | 104 | 82 | 74 | 95 | Comparative Example |
| 1-3 | OC-30 | DP-1 | 120 | 357 | 96 | 101 | Present invention |
| 1-4 | OC-11 | DP-2 | 113 | 254 | 89 | 97 | Present invention |
| 1-5 | OC-29 | DP-3 | 111 | 232 | 83 | 97 | Present invention |
| 1-6 | OC-15 | DP-32 | 122 | 288 | 94 | 99 | Present invention |
| 1-7 | 1 | DP-49 | 107 | 109 | 77 | 100 | Present invention |
| 1-8 | 53 | DP-77 | 106 | 125 | 76 | 101 | Present invention |
| 1-9 | 42 | DP-85 | 105 | 113 | 75 | 100 | Present invention |
| 1-10 | 1 | DP-57 | 119 | 326 | 90 | 96 | Present invention |

As it is clearly shown in Table 1, each of organic EL elements 1-3 to 1-10 of the present invention exhibits higher luminance efficiency and longer lifetime compared to organic EL elements 1-1 and 1-2 of Comparative Examples. It was also found to have improved properties of an element like excellent long term stability. Furthermore, with regard to the element organic EL elements 1-1 and 1-2 of Comparative Examples, the element produced first, the element produced third, and the element produced fifth exhibited gradually decreasing half life. However, with regard to the element organic EL elements 1-3 to 1-10 of the present invention, the element produced first, the element produced third, and the element produced fifth exhibited almost no decrease in the half life. Thus, it was found that the dopant compound used in the organic EL element of the present invention has excellent thermal stability.

Example 2

«Production of Organic EL Element 2-1»

A substrate (NA-45, manufactured by AvanStrate Inc.), prepared by forming a film of ITO (indium tin oxide) with a thickness of 100 nm on a glass substrate of 100 mm×100 mm×1.1 mm, was patterned to form a positive electrode. A transparent supporting substrate provided with the ITO transparent electrode was cleaned with ultrasonic waves using isopropyl alcohol, dried with dry nitrogen gas, and subjected to UV ozone washing for 5 minutes.

On the transparent supporting substrate, a thin film was coated by a spin coating method under conditions including 3000 rpm and 30 seconds by using a solution containing poly(3,4-ethylenedioxythiopehene)-polystyrene sulfonate (PEDOT/PSS, manufactured by Bayer AG, Baytron P AI 4083) diluted to 70% with purified water. After drying for 1 hour at 200° C., the first hole transport layer with film thickness of 30 nm was formed.

On the first transport layer, a thin film was formed by spin coating method by using a chlorobenzene solution of poly (N,N'-bis(4-butylphenyl)-N,N'-bis(phenyl))benzidine (ADS-254, manufactured by American Dye Source, Inc.). After heating and drying for 1 hour at 150° C., the second hole transport layer with film thickness of 40 nm was formed.

Further, on the second transport layer, a thin film was formed by spin coating method by using a butyl acetate solution of OC-11 as a host compound and Comparative Compound A as a dopant compound. After heating and drying for 1 hour at 120° C., a light emitting layer with film thickness of 30 nm was formed.

Further, on the light emitting layer, a thin film was formed by spin coating method by using a 1-butanol solution of ET-11 as an electron transport material to form an electron transport layer with film thickness of 20 nm. The substrate was set in a vacuum deposition apparatus, and the pressure of the vacuum layer was lowered to $4\times10^{-4}$ Pa. Subsequently, lithium fluoride was deposited to form 1.0 nm electron injection layer, and aluminum was additionally deposited to form a 110 nm thick negative electrode. Accordingly, organic EL element 2-1 was thereby produced.

«Production of Organic EL Element 2-2 to 2-12»

Organic EL elements 2-2 to 2-12 were produced in the same manner as organic EL element 2-1 except that the host compounds and the dopant compounds in the light emitting layer were changed to the compounds that are described in Table 2.

«Evaluation of Organic EL Elements 2-1 to 2-12»

For evaluation of the obtained organic EL elements 2-1 to 2-12, the organic EL elements were sealed in the same manner as organic EL elements 1-1 to 1-10 of Example 1 and, after producing a lighting device as illustrated in FIG. 5 and FIG. 6, the evaluation was made.

For each sample which has been produced as described above, external extraction quantum efficiency, half life, and long term stability were evaluated in the same manner as Example 1. The evaluation results are described in Table 2. Meanwhile, the results of measuring quantum efficiency and half life in Table 2 are described as a relative value compared with the value of the organic EL element 2-1 defined as 100.

TABLE 2

| Organic EL element | Host | Dopant | External extraction quantum efficiency | Half life | Long term stability | Remarks |
|---|---|---|---|---|---|---|
| 2-1 | OC-11 | Comparative Compound A | 100 | 100 | 55 | Comparative Example |
| 2-2 | OC-11 | Comparative Compound B | 102 | 79 | 62 | Comparative Example |
| 2-3 | OC-11 | DP-1 | 121 | 316 | 97 | Present invention |
| 2-4 | OC-30 | DP-2 | 123 | 281 | 94 | Present invention |
| 2-5 | OC-4 | DP-3 | 111 | 240 | 80 | Present invention |
| 2-6 | OC-12 | DP-32 | 113 | 132 | 81 | Present invention |
| 2-7 | OC-29 | DP-6 | 109 | 103 | 72 | Present invention |
| 2-8 | OC-30 | DP-8 | 106 | 109 | 79 | Present invention |
| 2-9 | 26 | DP-49 | 105 | 106 | 84 | Present invention |
| 2-10 | 1 | DP-77 | 104 | 110 | 71 | Present invention |
| 2-11 | 42 | DP-85 | 107 | 204 | 79 | Present invention |
| 2-12 | OC-30 | DP-57 | 117 | 293 | 93 | Present invention |

As it is clearly shown in Table 2, organic EL elements 2-3 to 2-12 of the present invention exhibit higher luminance efficiency and longer lifetime compared to organic EL elements 2-1 and 2-2 of Comparative Examples. It was also found that it has improved properties of an element like excellent long term stability.

Example 3

«Production of Organic EL Element 3-1»

A substrate (NA45, manufactured by NH Techno Glass Corp.), prepared by forming a film of ITO (indium tin oxide) with a thickness of 100 nm on a glass substrate of 100 mm×100 mm×1.1 mm, was patterned to form a positive electrode. A transparent supporting substrate provided with the ITO transparent electrode was cleaned with ultrasonic waves using isopropyl alcohol, dried with dry nitrogen gas, and subjected to UV ozone washing for 5 minutes.

The transparent supporting substrate was fixed to the substrate holder of a commercially available vacuum deposition apparatus. A molybdenum resistance heating boat was filled with 200 mg of α-NPD as a hole transport material, another molybdenum resistance heating boat was filled with 200 mg of OC-11 as a host compound, another molybdenum resistance heating boat was filled with 200 mg of ET-11 as an electron transport material, and another molybdenum resistance heating boat was filled with 100 mg of Comparative Compound A as a dopant compound, and still another molybdenum resistance heating boat was filled with 100 mg of D-10 as a dopant compound. They were then placed in the vacuum deposition apparatus.

Subsequently, the pressure of a vacuum vessel was reduced to $4 \times 10^{-4}$ Pa, and then the heating boat containing α-NPD was heated by electrification for vapor deposition at a deposition rate of 0.1 nm/sec to form a hole transport layer with film thickness of 20 nm on the transparent supporting substrate.

Further, the heating boats containing the OC-11 as a host compound and Comparative Compound A and D-1 as a dopant compound were heated by electrification such that vapor deposition rate is 100:5:0.6 for each of OC-11, Comparative Compound A, and D-1 for deposition on the hole transport layer. As a result, a light emitting layer having film thickness of 30 nm was formed.

Further, the heating boat containing ET-11 was heated by electrification for vapor deposition on a light emitting layer at a deposition rate of 0.1 nm/sec to form an electron transport layer with film thickness of 30 nm.

Meanwhile, the substrate temperature at the time of vapor deposition was room temperature.

Subsequently, lithium fluoride was deposited to form 0.5 nm thick negative electrode buffer layer, and aluminum was additionally deposited to form a 110 nm thick negative electrode. Accordingly, organic EL element 3-1 was thereby produced. As a result of electrification of the produced organic EL element 3-1, approximately white light was obtained. Thus, it was found that it can be used as a lighting device. Meanwhile, it was also found that white light emission is obtained similarly even when substitution with other exemplified compounds was made.

«Production of Organic EL Element 3-2 to 3-7»

Organic EL elements 3-2 to 3-7 were produced in the same manner as organic EL element 3-1 except that the dopant compounds in the light emitting layer were changed to the compounds that are described in Table 3.

«Evaluation of Organic EL Elements 3-1 to 3-7»

For evaluation of the obtained organic EL elements 3-1 to 3-7, the organic EL elements were sealed in the same manner as organic EL elements 1-1 to 1-10 of Example 1 and, after producing a lighting device as illustrated in FIG. 5 and FIG. 6, the evaluation was made.

For each sample which has been produced as described above, external extraction quantum efficiency, half life, long term stability, and thermal stability were evaluated in the same manner as Example 1. The evaluation results are described in Table 3. Meanwhile, the results of measuring quantum efficiency and half life in Table 3 are described as a relative value compared with the value of the organic EL element 3-1 defined as 100.

TABLE 3

| Organic EL element | Host | Dopant | External extraction quantum efficiency | Half life | Long term stability | Thermal stability | Remarks |
|---|---|---|---|---|---|---|---|
| 3-1 | OC-11 | Comparative Compound A | 100 | 100 | 54 | 59 | Comparative Example |
| 3-2 | OC-11 | Comparative Compound B | 109 | 80 | 73 | 93 | Comparative Example |
| 3-3 | OC-11 | DP-1 | 118 | 261 | 96 | 100 | Present invention |
| 3-4 | OC-11 | DP-2 | 120 | 237 | 94 | 102 | Present invention |
| 3-5 | OC-30 | DP-13 | 121 | 203 | 97 | 99 | Present invention |
| 3-6 | OC-15 | DP-21 | 122 | 199 | 83 | 87 | Present invention |
| 3-7 | 1 | DP-40 | 111 | 158 | 90 | 92 | Present invention |

As it is clearly shown in Table 3, each of organic EL elements 3-3 to 3-7 of the present invention exhibits higher luminance efficiency and longer lifetime compared to organic EL elements 3-1 and 3-2 of Comparative Examples. It was also found to have improved properties of an element like excellent long term stability. Furthermore, with regard to the element organic EL elements 3-1 and 3-2 of Comparative Examples, the element produced first, the element produced third, and the element produced fifth exhibited gradually decreasing half life. However, with regard to the element organic EL elements 3-3 to 3-7 of the present invention, the element produced first, the element produced third, and the element produced fifth exhibited almost no decrease in the half life. Thus, it was found that the dopant compound used in the organic EL element of the present invention has excellent thermal stability.

Example 4

FIGS. 7A to 7E illustrate outline diagrams illustrating the constitution of an organic EL full color display device.

Figure 7A:
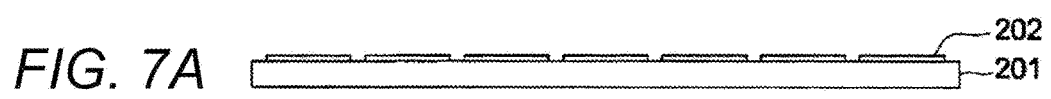
FIGS. 7A to 7E are outline diagrams illustrating the constitution of an organic EL full color display device.
Figure 7B:
Figure 7C:
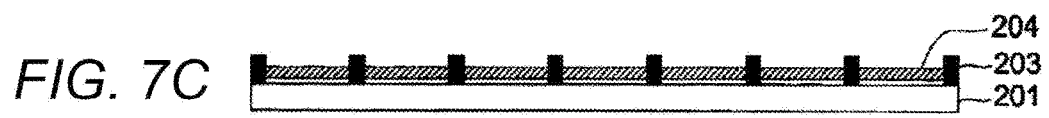
Figure 7D:
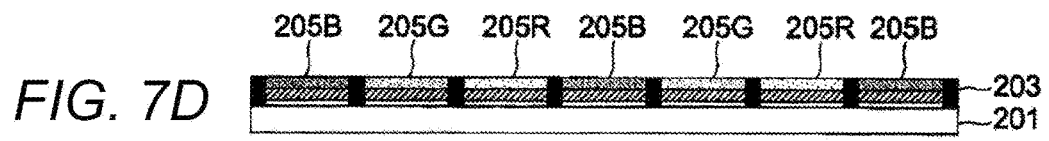
Figure 7E:
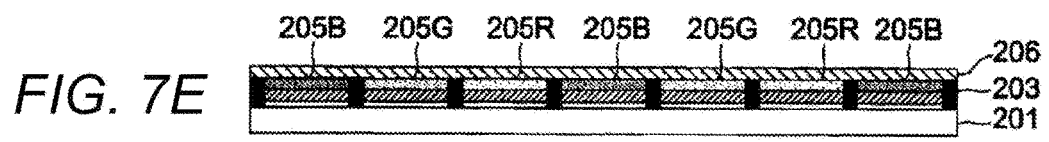

A substrate (NA45, manufactured by NH Techno Glass Corp.), prepared by forming a film of ITO transparent electrode 202 with a thickness of 100 nm on glass substrate 201, was patterned with pitch of 100 μm to form a positive electrode (see, FIG. 7A). Then, on glass substrate 201 and between ITO transparent electrodes 202, non-photosensitive polyimide partition wall 203 (width of 20 μm and thickness of 2.0 μm) was formed by photolithography (see, FIG. 7B).

On ITO electrode 202 and between partition walls 203, the composition for hole injection layer with the following composition was discharged and injected by using an inkjet head (manufactured by Seiko Epson Corp.: MJ800C). Then, it was irradiated with UV light for 200 seconds and subjected to a drying treatment for 10 minutes at 60° C. to form hole injection layer 204 with film thickness of 40 nm (see, FIG. 7C).

On hole injection layer 204, a blue light emitting layer composition, a green light emitting layer composition, and a red light emitting layer composition, each having the following composition, were discharged and injected by using an inkjet head. Then, it was subjected to a drying treatment for 10 minutes at 60° C. to form light emitting layer 205B, 205G, 205R having each color (see, FIG. 7D).

Next, for covering each color-developing layer 205B, 205G, 205R, an electron transport layer was deposited to form an electron transport layer with film thickness of 20 nm (not illustrated). With further deposition of lithium fluoride, a negative electrode buffer layer with film thickness of 0.6 nm (not illustrated) was formed and Al was deposited to form negative electrode 206 with film thickness of 130 nm. As a result, an organic EL element was produced (see, FIG. 7E).

When each electrode of the produced organic EL elements was applied with voltage, blue color, green color, and red color were exhibited, and thus it was found that they can be used as a full color display device.

(Composition for Hole Injection Layer)

| Hole transport material 7 (compound 7) | 20 parts by mass |
|---|---|
| Cyclohexylbenzene | 50 parts by mass |
| Isopropyl biphenyl | 50 parts by mass |

(Composition for Blue Light Emitting Layer)

| Host material 2 (compound 2) | 0.7 part by mass |
|---|---|
| DP-1 | 0.04 part by mass |
| Cyclohexylbenzene | 50 parts by mass |
| Isopropyl biphenyl | 50 parts by mass |

(Composition for Green Light Emitting Layer)

| Host material 2 (compound 2) | 0.7 part by mass |
|---|---|
| D-1 | 0.04 part by mass |
| Cyclohexylbenzene | 50 parts by mass |
| Isopropyl biphenyl | 50 parts by mass |

(Composition for Red Light Emitting Layer)

| Host material 2 (compound 2) | 0.7 part by mass |
| --- | --- |
| D-10 | 0.04 part by mass |
| Cyclohexylbenzene | 50 parts by mass |
| Isopropyl biphenyl | 50 parts by mass |

The invention claimed is:

1. An organic electroluminescent element having at least one organic layer including a light emitting layer sandwiched between a positive electrode and a negative electrode,
wherein an organometallic complex represented by the following General Formula (2) is contained in the at least one organic layer, General Formula (2)

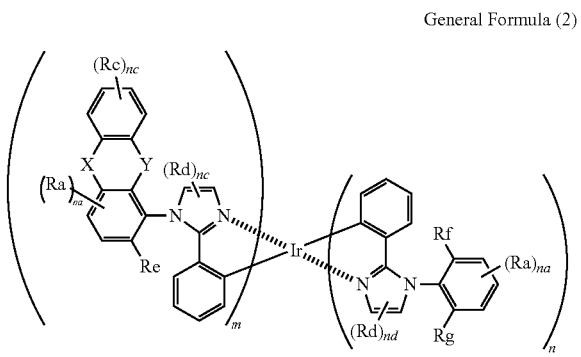

wherein, Ra, Rc and Rd each independently represent a hydrogen atom or an alkyl group;
na represents an integer of from 1 to 3, nc represents an integer of from 1 to 4, nd represents an integer of from 1 to 2, and one of X and Y is a single bond and the other represents CR1R2, O, or S;
R1 and R2 independently represent a hydrogen atom, an alkyl group, an alkenyl group, an alkynyl group, an aryl group, a heteroaryl group, a non-aromatic hydrocarbon ring group or a non-aromatic heterocyclic group;
Re, Rf, and Rg each independently represent an alkyl group, an aromatic hydrocarbon ring group, an aromatic heterocyclic group, a non-aromatic hydrocarbon ring group, or a non-aromatic heterocyclic group; and
m and n represent an integer of from 1 to 2, and m+n is 3;
wherein in no case the structures of three ligands that are coordinated to Ir are identical to each other.

2. The organic electroluminescent element according to claim 1, wherein Y in the above General Formula (2) is a single bond.

3. The organic electroluminescent element according to claim 1, wherein X in the above General Formula (2) is O.

4. The organic electroluminescent element according to claim 1, wherein m=1 in the above General Formula (2).

5. The organic electroluminescent element according to claim 1, wherein the organic electroluminescent element emits white light.

6. A lighting device equipped with the organic electroluminescent element according to claim 1.

7. A display device equipped with the organic electroluminescent element according to claim 1.

* * * * *